US012463120B2

(12) United States Patent
Hayashi et al.

(10) Patent No.: US 12,463,120 B2
(45) Date of Patent: Nov. 4, 2025

(54) SEMICONDUCTOR DEVICE

(71) Applicant: ROHM CO., LTD., Kyoto (JP)

(72) Inventors: Kenji Hayashi, Kyoto (JP); Takumi Kanda, Kyoto (JP); Noriaki Kawamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 512 days.

(21) Appl. No.: 18/002,592

(22) PCT Filed: Jun. 23, 2021

(86) PCT No.: PCT/JP2021/023743
§ 371 (c)(1),
(2) Date: Dec. 20, 2022

(87) PCT Pub. No.: WO2021/261508
PCT Pub. Date: Dec. 30, 2021

(65) Prior Publication Data

US 2023/0245959 A1 Aug. 3, 2023

(30) Foreign Application Priority Data

Jun. 23, 2020 (JP) ................................ 2020-107914
Jun. 23, 2020 (JP) ................................ 2020-107915

(51) Int. Cl.
*H01L 23/495* (2006.01)
*H01L 23/00* (2006.01)
*H01L 23/31* (2006.01)

(52) U.S. Cl.
CPC .... *H01L 23/49575* (2013.01); *H01L 23/3107* (2013.01); *H01L 23/49513* (2013.01);
(Continued)

(58) Field of Classification Search
CPC .... H01L 2224/73251–73281; H01L 2924/182
See application file for complete search history.

(56) References Cited

U.S. PATENT DOCUMENTS

2010/0289127 A1 11/2010 Kanazawa et al.
2012/0267682 A1 10/2012 Kanazawa et al.
(Continued)

FOREIGN PATENT DOCUMENTS

DE 102019120248 A1 3/2020
JP 2008306872 A 12/2008
(Continued)

OTHER PUBLICATIONS

Notice of Reasons for Refusal issued for Japanese Patent Application No. 2022-532508, Dispatch date: Mar. 11, 2025, 19 pages including English machine translation.
(Continued)

*Primary Examiner* — Amar Movva
(74) *Attorney, Agent, or Firm* — HSML P.C.

(57) ABSTRACT

A semiconductor device includes a first die pad having a main surface, a second die pad having a second main surface, a first switching element connected to the first main surface, a second switching element connected to the second main surface, a first connecting member connecting the first main surface electrode of the first switching element to the second die pad, an encapsulation resin encapsulating the first switching element, the second switching element, the first die pad, the second die pad, and the first connecting member, and leads projecting out of one of the resin side surfaces of the encapsulation resin.

26 Claims, 42 Drawing Sheets

(52) U.S. Cl.
CPC .............. *H01L 24/40* (2013.01); *H01L 24/48* (2013.01); *H01L 2224/40175* (2013.01); *H01L 2224/48175* (2013.01)

(56) References Cited

U.S. PATENT DOCUMENTS

| | | | |
|---|---|---|---|
| 2016/0211246 | A1 | 7/2016 | Akiyama et al. |
| 2017/0345792 | A1 | 11/2017 | Tanimoto |
| 2018/0166430 | A1 | 6/2018 | Akiyama et al. |
| 2020/0091042 | A1 | 3/2020 | Kadoguchi et al. |

FOREIGN PATENT DOCUMENTS

| | | | |
|---|---|---|---|
| JP | 2009130055 | A | 6/2009 |
| JP | 2010267789 | A | 11/2010 |
| JP | 2015228445 | A | 12/2015 |
| JP | 2017174951 | A | 9/2017 |
| JP | 2019140175 | A | 8/2019 |
| WO | 2016084241 | A1 | 6/2016 |

OTHER PUBLICATIONS

International Search Report and Written Opinion issued for International Patent Application No. PCT/JP2021/023743, Date of mailing: Sep. 14, 2021, 10 pages including English translation of Search Report.

Office Action issued for German Patent Application No. 11 2021 002 909.6, dated Mar. 21, 2023, 16 pages including Informal English translation.

Decision of Refusal issued for Japanese Patent Application No. 2022-532508, Dispatched date: Jun. 24, 2025, 13 pages including English machine translation.

SEMICONDUCTOR DEVICE

TECHNICAL FIELD

The present disclosure relates to a semiconductor device.

BACKGROUND ART

A known semiconductor device includes a lead frame having a die pad and leads, a transistor mounted on the die pad, wires connecting electrodes of the transistor to the leads, and an encapsulation resin that encapsulates the transistor and the wires (refer to, for example, patent publication 1).

CITATION LIST

Patent Literature

Patent Literature 1: Japanese Laid-Open Patent Publication No. 2017-174951

SUMMARY OF INVENTION

Technical Problem

The semiconductor device is used in, for example, an inverter circuit or a DC-DC converter circuit. These circuits are formed by connecting two semiconductor devices mounted on a mounting substrate with a wiring conductor of the mounting substrate. The wiring conductor of the mounting substrate, for example, electrically connects the drain electrode of a transistor mounted on one semiconductor device to the source electrode of a transistor mounted on the other semiconductor device. The semiconductor devices mounted on the mounting substrate are spaced apart from each other by a predetermined distance to provide space for arrangement of element and allow for heat dissipation. This lengthens the conductor (leads and wiring conductor) between electrodes and increases parasitic inductance. Parasitic inductance hampers high-speed switching. Thus, parasitic inductance needs to be reduced in semiconductor devices.

It is an object of the present invention to provide a semiconductor device that reduces inductance.

Solution to Problem

A semiconductor device in accordance with one aspect of the present disclosure includes a first die pad including a first main surface, and a second die pad spaced apart from the first die pad in a first direction that extends parallel to the first main surface. The second die pad includes a second main surface facing the same direction as the first main surface. A first switching element, mounted on the first main surface, includes a first element main surface facing the same direction as the first main surface, a first element back surface facing in the opposite direction of the first element main surface, a first main surface electrode and a first control electrode that are arranged on the first element main surface, and a first back surface electrode arranged on the first element back surface. The first back surface electrode is connected to the first main surface. A second switching element, mounted on the second main surface, includes a second element main surface facing the same direction as the second main surface, a second element back surface facing in the opposite direction of the second element main surface, a second main surface electrode and a second control electrode that are arranged on the second element main surface, and a second back surface electrode arranged on the second element back surface. The second back surface electrode is connected to the second main surface. A first connecting member connects the first main surface electrode of the first switching element to the second die pad. An encapsulation resin, including resin side surfaces facing a direction extending parallel to the first main surface and the second main surface, encapsulates the first switching element, the second switching element, the first die pad, the second die pad, and the first connecting member. Leads, arranged in the first direction, project out of one of the resin side surfaces of the encapsulation resin in a second direction intersecting the first direction, and the leads extend in the second direction.

This configuration connects the first switching element and the second switching element. The distance of the electric path is shortened between the first main surface electrode of the first switching element and the second die pad, to which the second back surface electrode of the second switching element is connected. Thus, inductance is reduced.

A semiconductor device in accordance with a further aspect of the present disclosure includes a first die pad including a first main surface and a second die pad spaced apart from the first die pad in a first direction that extends parallel to the first main surface. The second die pad includes a second main surface facing the same direction as the first main surface. A first switching element, mounted on the first main surface, includes a first element main surface facing the same direction as the first main surface, a first element back surface facing in the opposite direction of the first element main surface, a first main surface electrode and a first control electrode that are arranged on the first element main surface, and a first back surface electrode arranged on the first element back surface. The first back surface electrode is connected to the first main surface. A second switching element, mounted on the second main surface, includes a second element main surface facing the same direction as the second main surface, a second element back surface facing in the opposite direction of the second element main surface, a second main surface electrode and a second control electrode that are arranged on the second element main surface, and a second back surface electrode arranged on the second element back surface. The second back surface electrode is connected to the second main surface. A first connecting member connects the first main surface electrode of the first switching element to the second die pad. An encapsulation resin, including resin side surfaces facing a direction extending parallel to the first main surface and the second main surface, encapsulates the first switching element, the second switching element, the first die pad, the second die pad, and the first connecting member. Leads, arranged in the first direction, project out of one of the resin side surfaces of the encapsulation resin in a second direction intersecting the first direction, and the leads extend in the second direction.

With this configuration, the first main surface electrode of the first switching element is electrically connected to the second back surface electrode of the second switching element by the first connecting member, which is encapsulated in the encapsulation resin. This shortens the distance of the electric path between the first main surface electrode of the first switching element and the second back surface electrode of the second switching element. Thus, inductance is reduced.

Advantageous Effects of Invention

One aspect of the present disclosure provides a semiconductor device that reduces inductance.

DESCRIPTION OF EMBODIMENTS

Embodiments and modified examples will hereafter be described with reference to the drawings. The embodiments and modified examples described below exemplify configurations and methods for embodying a technical concept and are not intended to limit the material, shape, structure, arrangement, dimensions, and the like of each component to the description. The embodiments and modified examples described below may undergo various modifications. The present embodiment and the following modifications can be combined as long as there is no technical contradiction.

In the present specification, "a state in which member A is connected to member B" includes a case in which member A and member B are directly connected physically and a case in which member A and member B are indirectly connected by another member that does not affect the electric connection state.

Similarly, "a state in which member C is arranged between member A and member B" includes a case in which member A is directly connected to member C or member B is directly connected to member C and a case in which member A is indirectly connected to member C by another member that does not affect the electric connection state or member B is indirectly connected to member C by another member that does not affect the electric connection state.

First Embodiment

Figure 1:
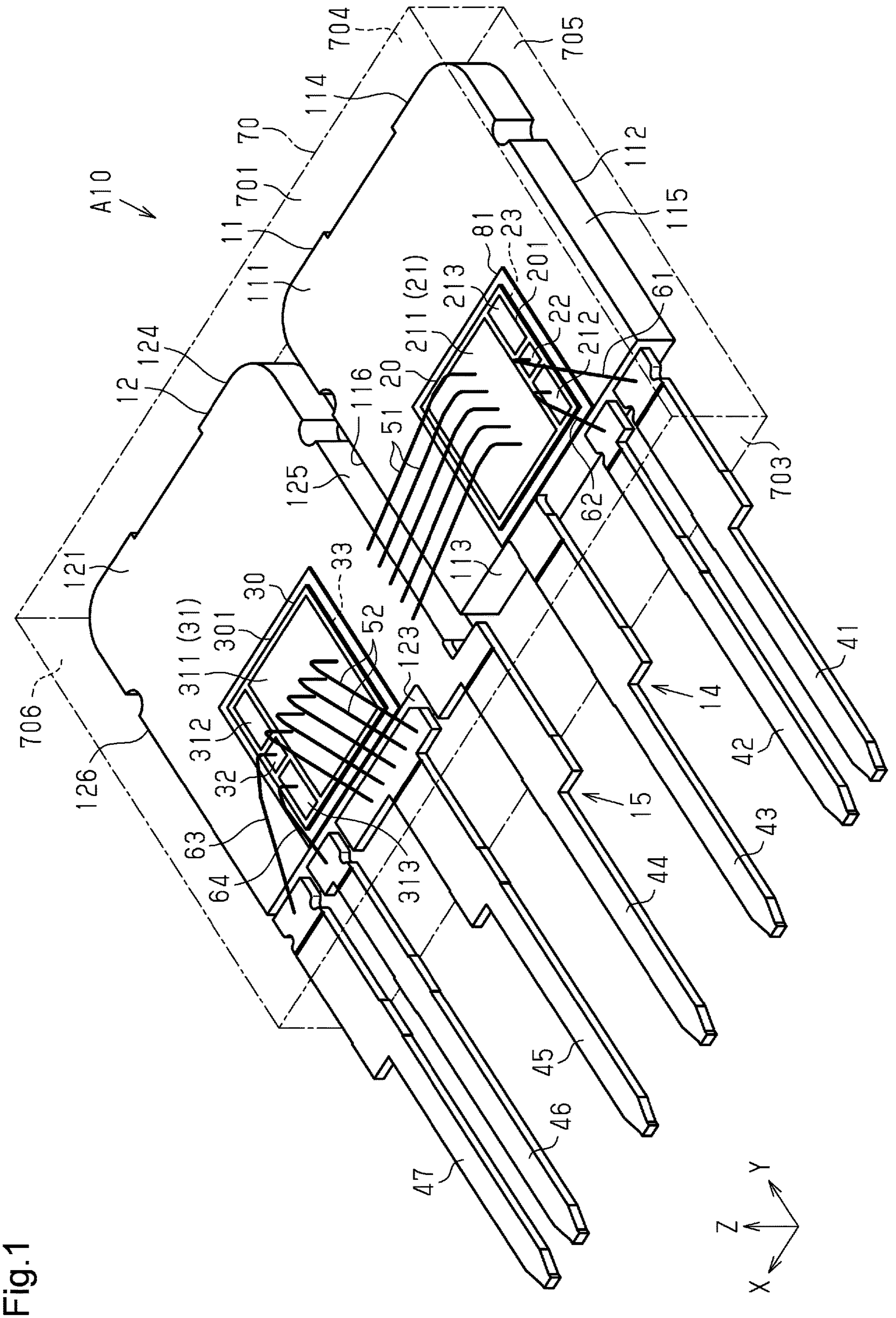
FIG. 1 is a perspective view of a semiconductor device in accordance with a first embodiment.
Figure 2:
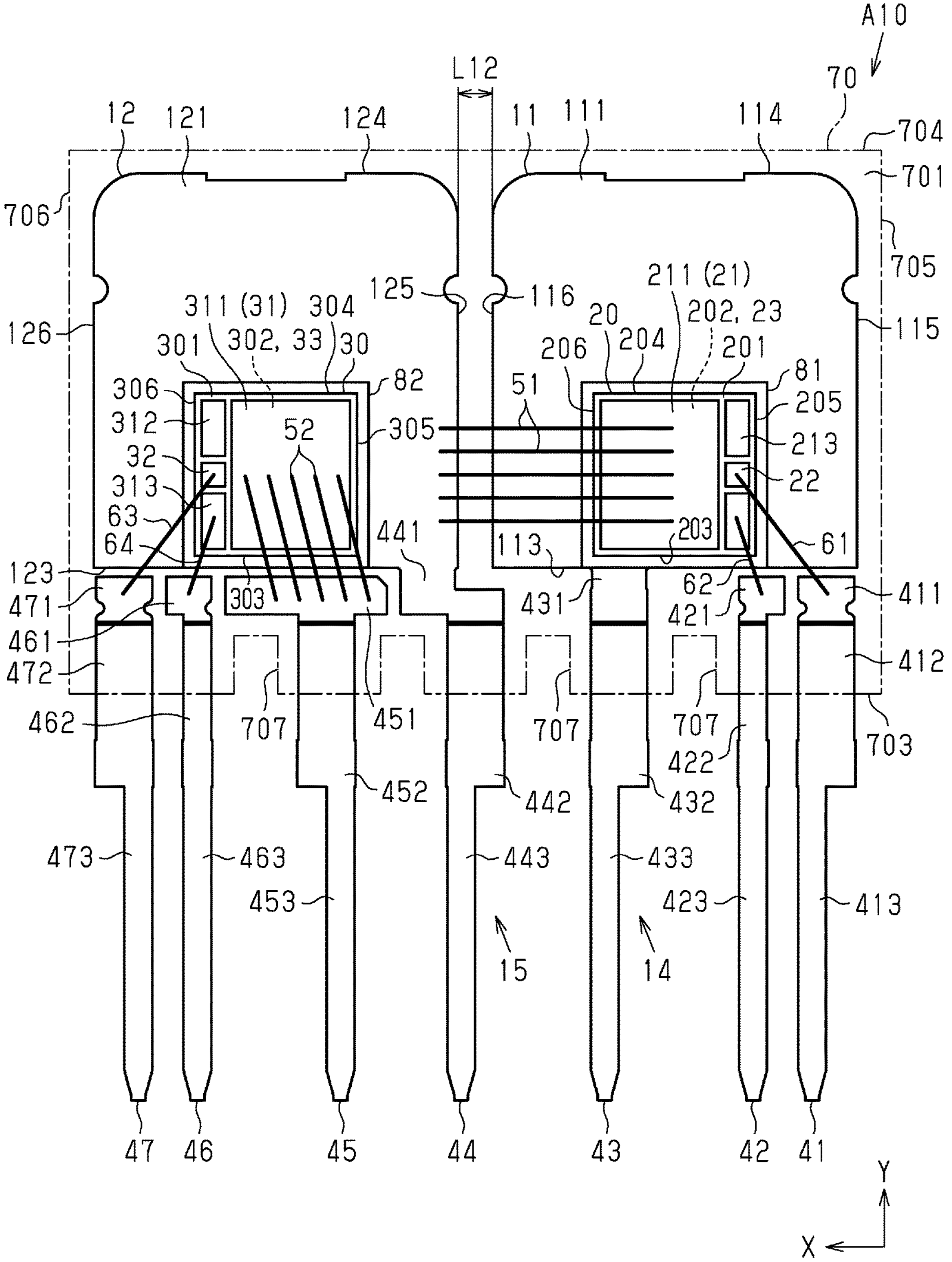
FIG. 2 is a plan view of the semiconductor device in accordance with the first embodiment.
Figure 3:
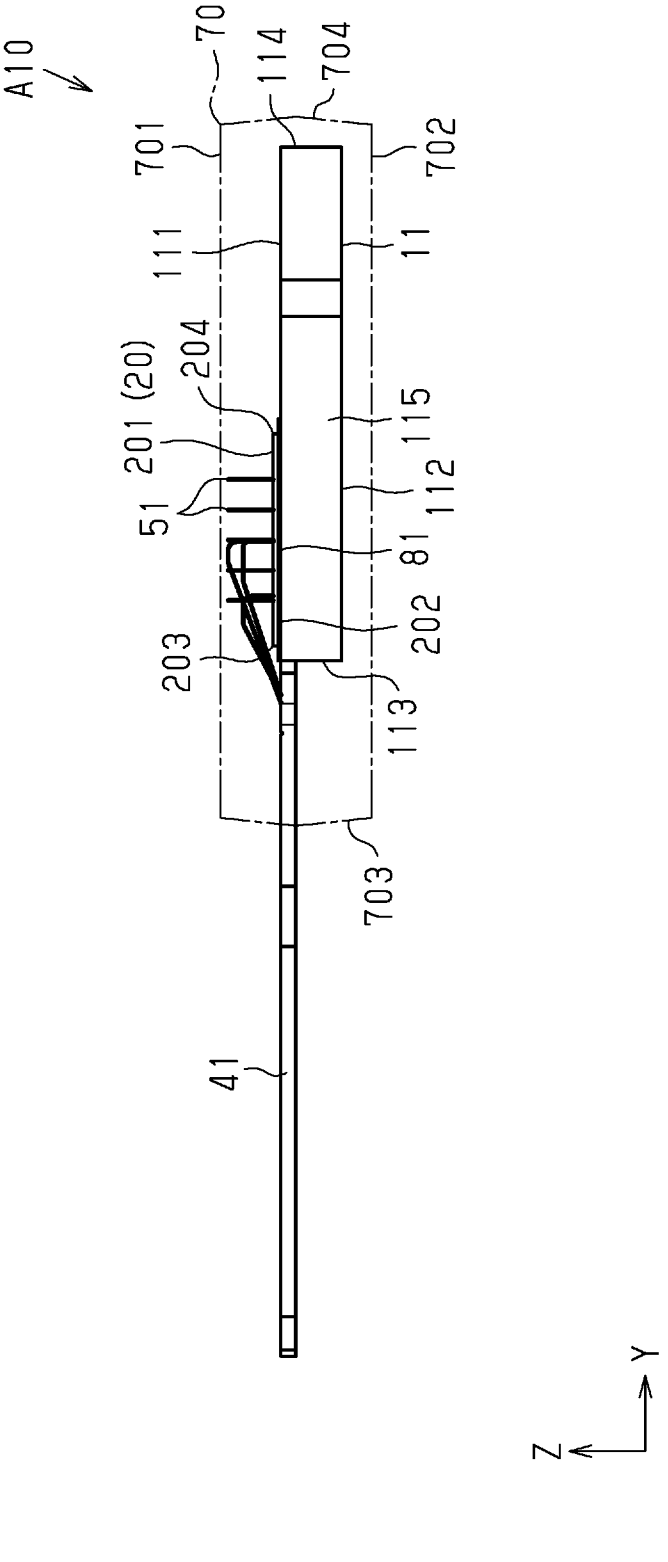
FIG. 3 is a side view of the semiconductor device in accordance with the first embodiment.

With reference to FIGS. 1 to 3, a semiconductor device A10 in accordance with a first embodiment will now be described.

As shown in FIGS. 1 and 2, the semiconductor device A10 includes a first die pad 11, a second die pad 12, a first switching element 20, a second switching element 30, leads 41 to 47, and an encapsulation resin 70.

Encapsulation Resin

The encapsulation resin 70 encapsulates the first die pad 11, the second die pad 12, the first switching element 20, and the second switching element 30. Further, the encapsulation resin 70 partially covers the leads 41 to 47.

The encapsulation resin 70 is box-shaped and has a low profile. In this specification, the definition of "box-shaped" includes boxes having corners and edges that are chamfered and boxes having corners and edges that are rounded. Further, faces of such boxes may include ridges and valleys. Faces of such boxes may also include curved surfaces formed from a plurality of surfaces.

The encapsulation resin 70 is formed from a synthetic resin that is electrically insulative. In one example, the encapsulation resin 70 is epoxy resin. The synthetic resin forming the encapsulation resin 70 is, for example, colored black. In FIGS. 1 and 2, the encapsulation resin 70 is shown in dashed lines, and members in the encapsulation resin 70 are shown in solid lines. In the description hereafter, the thickness direction of the encapsulation resin 70 will be referred to as thickness direction Z, one direction orthogonal to the thickness direction Z will be referred to as widthwise direction X, and the direction orthogonal to thickness direction Z and widthwise direction X will be referred to as lengthwise direction Y. Widthwise direction X corresponds to a first direction, and lengthwise direction Y corresponds to a second direction.

The encapsulation resin 70 includes a resin main surface 701, a resin back surface 702, and first to fourth resin side surfaces 703 to 706. The resin main surface 701 and the resin back surface 702 face opposite directions in thickness direction Z. The first to fourth resin side surfaces 703 to 706 each face a direction that is parallel to the resin main surface 701 and the resin back surface 702. The first resin side surface 703 and the second resin side surface 704 face opposite directions in lengthwise direction Y. The third resin side surface 705 and the fourth resin side surface 706 face opposite directions in widthwise direction X.

FIG. 2 is a view of the semiconductor device A10 taken from the side of the resin main surface 701 of the encapsulation resin 70. As shown in FIG. 2, the encapsulation resin 70 is shaped so that widthwise direction X is the long-side direction and lengthwise direction Y is the short-side direction in a view of the semiconductor device A10 taken from thickness direction Z. The first resin side surface 703 and the second resin side surface 704 are the side surfaces extending in widthwise direction X, and the third resin side surface 705 and the fourth resin side surface 706 are the side surfaces extending in lengthwise direction Y.

First Die Pad, Second Die Pad

The first die pad 11 and the second die pad 12 each have the form of a rectangular plate. The first die pad 11 and the second die pad 12 are each formed from, for example, copper (Cu). In the present embodiment, the phrase formed from Cu intends to mean formed from Cu or an alloy including Cu. Further, the phrase formed from Cu also includes a case when a surface is partially or entirely coated with a plating layer.

The first die pad 11 includes a main surface 111, a back surface 112, and the first to fourth side surfaces 113 to 116. The main surface 111 and the back surface 112 face opposite directions in thickness direction Z. The main surface 111 of the first die pad 11 faces the same direction as the resin main surface 701 of the encapsulation resin 70. The first to fourth side surfaces 113 to 116 face widthwise direction X or lengthwise direction Y. In the present embodiment, the first side surface 113 and the second side surface 114 face opposite directions in lengthwise direction Y, and the third side surface 115 and the fourth side surface 116 face opposite directions in widthwise direction X.

The second die pad 12 includes a main surface 121, a back surface 122, and first to fourth side surfaces 123 to 126. The main surface 121 and the back surface 122 face opposite directions in thickness direction Z. The main surface 121 of the second die pad 12 faces the same direction as the resin main surface 701 of the encapsulation resin 70. The first to fourth side surfaces 123 to 126 face widthwise direction X or lengthwise direction Y. In the present embodiment, the first side surface 123 and the second side surface 124 face opposite directions in lengthwise direction Y, and the third side surface 125 and the fourth side surface 126 face opposite directions in widthwise direction X.

The first die pad 11 and the second die pad 12 are arranged so that their main surfaces 111 and 121 are located at the same position in thickness direction Z. The first die pad 11 and the second die pad 12 have the same thickness. The thickness of the first die pad 11 and the second die pad 12 is 1 mm or greater and 3 mm or less. Preferably, the thickness of the first die pad 11 and the second die pad 12 is, for example, 2 mm or greater and 3 mm or less. The back surface 112 of the first die pad 11 and the back surface 122 of the second die pad 12 are located at the same position in thickness direction Z.

The first die pad 11 and the second die pad 12 are arranged in widthwise direction X. The fourth side surface 116 of the first die pad 11 and the third side surface 125 of the second die pad 12 face each other. Distance L12 between the first die pad 11 and the second die pad 12 is less than the thickness of the first die pad 11 and the second die pad 12, for example, 1 mm or greater and 3 mm or less. The first die pad 11 and the second die pad 12 are arranged so that their first side surfaces 113 and 123 are located at the same position in lengthwise direction Y.

First Switching Element, Second Switching Element

The first switching element 20 is mounted on the main surface 111 of the first die pad 11. The second switching element 30 is mounted on the main surface 121 of the second die pad 12. The first switching element 20 and the second switching element 30 are silicon carbide (SiC) chips. In the present embodiment, metal-oxide-semiconductor field-effect transistors (SiC MOSFETs) are used as the first switching element 20 and the second switching element 30. The first switching element 20 and the second switching element 30 are elements that allow for high-speed switching.

The first switching element 20 has the form of a plate. More specifically, the first switching element 20 is shaped to be, for example, square in plan view. As shown in FIGS. 2 and 3, the first switching element 20 includes an element main surface 201, an element back surface 202, and the first to fourth element side surfaces 203 to 206. The element main surface 201 and the element back surface 202 face opposite directions in thickness direction Z. The element main surface 201 faces the same direction as the resin main surface 701. That is, the element main surface faces the same direction as the main surface 111 of the first die pad 11. The element back surface 202 faces the main surface 111 of the first die pad 11. The first element side surface 203 and the second element side surface 204 face opposite directions in lengthwise direction Y, and the third element side surface 205 and the fourth element side surface 206 face opposite directions in widthwise direction X. The first element side surface 203 faces the same direction as the first side surface 113 of the first die pad 11, and the second element side surface 204 faces the same direction as the second side surface 114 of the first die pad 11. The third element side surface 205 faces the same direction as the third side surface 115 of the first die pad 11, and the fourth element side surface 206 faces the same direction as the fourth side surface 116 of the first die pad 11.

The first switching element 20 includes a first main surface electrode 21 and a first control electrode 22 on the element main surface 201, and a first back surface electrode 23 on the element back surface 202. The first main surface electrode 21 is a source electrode. The first main surface electrode 21 of the present embodiment includes a main source electrode 211 and control source electrodes 212 and 213. The first control electrode 22 is a gate electrode. The control source electrodes 212 and 213 are, for example, driver source electrodes electrically connected to a circuit (driver) that drives the first switching element 20. In the present embodiment, the first control electrode 22 is arranged at a portion located toward the third element side surface 205. Further, the first control electrode 22 is arranged in the central part of the portion, located toward the third element side surface 205, in lengthwise direction Y. The main source electrode 211 of the first main surface electrode 21 is arranged next to the first control electrode 22 in widthwise direction X. The control source electrodes 212 and 213 sandwich the first control electrode 22 in lengthwise direction Y. The first back surface electrode 23 is a drain electrode. The first back surface electrode 23 is electrically connected to the first die pad 11 by solder 81.

As shown in FIG. 2, the first switching element 20 is arranged on the main surface 111 of the first die pad 11 at a portion located toward the first side surface 113 in lengthwise direction Y. Further, the first switching element 20 is arranged in the central part of the first die pad 11 in widthwise direction X.

The second switching element 30 has the form of a plate. More specifically, the second switching element 30 is shaped to be, for example, square in plan view. As shown in FIG. 2, the second switching element 30 includes an element main surface 301, an element back surface 302, and the first to fourth element side surfaces 303 to 306. The element main surface 301 and the element back surface 302 face opposite directions in thickness direction Z. The element main surface 301 faces the resin main surface 701. That is, the element main surface faces the same direction as the main surface 121 of the second die pad 12. The element back surface 302 faces the main surface 121 of the second die pad 12. The first element side surface 303 and the second element side surface 304 face opposite directions in lengthwise direction Y, and the third element side surface 305 and the fourth element side surface 306 face opposite directions in widthwise direction X. The first element side surface 303 faces the same direction as the first side surface 123 of the second die pad 12, and the second element side surface 304 faces the same direction as the second side surface 124 of the second die pad 12. The third element side surface 305 faces the same direction as the third side surface 125 of the second die pad 12, and the fourth element side surface 306 faces the same direction as the fourth side surface 126 of the second die pad 12.

The second switching element 30 includes a second main surface electrode 31 and a second control electrode 32 on the element main surface 301, and a second back surface electrode 33 on the element back surface 302. The second main surface electrode 31 is a source electrode. The second main surface electrode 31 of the present embodiment includes a main source electrode 311 and control source electrodes 312 and 313. The second control electrode 32 is a gate electrode. The control source electrodes 312 and 313 are, for example, driver source electrodes electrically connected to a circuit (driver) that drives the second switching element 30. In the present embodiment, the second control electrode 32 is arranged at a portion located toward the fourth element side surface 306. Further, the second control electrode 32 is arranged in the central part of the portion, located toward the fourth element side surface 306, in lengthwise direction Y. The main source electrode 311 of the second main surface electrode 31 is arranged next to the second control electrode 32 in widthwise direction X. The control source electrodes 312 and 313 sandwich the second control electrode 32 in lengthwise direction Y. The second back surface electrode 33 is a drain electrode. The second back surface electrode 33 is electrically connected to the second die pad 12 by solder 82.

As shown in FIG. 2, the second switching element 30 is arranged on the main surface 121 of the second die pad 12 at a portion located toward the first side surface 123 in lengthwise direction Y. Further, the second switching element 30 is arranged in the central part of the second die pad 12 in widthwise direction X.

First Connecting Member

The first main surface electrode 21 (main source electrode 211) of the first switching element 20 is connected to the second die pad 12 by first wires 51 serving as a first connecting member. In the present embodiment, as shown in FIGS. 1 and 2, the first main surface electrode 21 (main source electrode 211) of the first switching element 20 is connected to the second die pad 12 by five first wires 51. The number of the first wires 51 is set, for example, in accordance with the drive current allowed to flow through the semiconductor device A10. The first wires 51 are arranged in lengthwise direction Y and extend in widthwise direction X. The first wires 51 are laid out parallel to one another as viewed in thickness direction Z.

The first wires 51 are formed from, for example, aluminum (Al). The phrase formed from Al intends to mean formed from Al or an alloy including Al. The first wires 51 each have a middle part with a cross section perpendicular to the longitudinal direction that is circular. The first wires 51 may each have any cross-sectional shape. The diameter of the first wires 51 where the cross-section is circular, is, for example, 0.1 mm or greater and 0.4 mm or less.

Leads

As shown in FIGS. 1 and 2, the semiconductor device A10 includes a plurality of (seven in present embodiment) leads 41 to 47. The first to seventh leads 41 to 47 extend in lengthwise direction Y. The first to seventh leads 41 to 47 project out of the first resin side surface 703 of the encapsulation resin 70.

The first to seventh leads 41 to 47 are arranged in widthwise direction X. In the present embodiment, the first to seventh leads 41 to 47 are arranged in order from the third resin side surface 705 of the encapsulation resin 70 toward the fourth resin side surface 706. Widthwise direction X is the direction in which the first die pad 11 and the second die pad 12 are arranged. Accordingly, the first to seventh leads 41 to 47 are arranged in the direction in which the first die pad 11 and the second die pad 12 are arranged. The first to seventh leads 41 to 47 are formed from Cu.

First Lead

As shown in FIG. 2, the first lead 41 includes a pad portion 411, a base portion 412, and a substrate connection portion 413. The pad portion 411 is spaced apart from the first die pad 11 toward the first resin side surface 703 of the encapsulation resin 70 in lengthwise direction Y. The pad portion 411 is a wire bonding portion to which a wire 61 is connected. The pad portion 411 is connected by the wire 61 to the first control electrode 22 of the first switching element 20. Thus, the first lead 41 is a first control lead connected to the first control electrode (gate electrode) 22 of the first switching element 20. In the description hereafter, the first lead 41 may be referred to as the first control lead 41. The wire 61 is formed from, for example, Al. The diameter of the wire 61 is, for example, 0.04 mm or greater and 0.1 mm or less.

The base portion 412 extends from the pad portion 411 in lengthwise direction Y and projects out of the first resin side surface 703 of the encapsulation resin 70. The substrate connection portion 413 extends from the distal end of the base portion 412 in lengthwise direction Y. The substrate connection portion 413 is inserted into a component hole of a mounting substrate and connected to conductive wiring of the mounting substrate by solder (neither shown). As shown in FIG. 2, the base portion 412 has a greater width than the substrate connection portion 413 in widthwise direction X. In widthwise direction X, the base portion 412 projects further from the substrate connection portion 413 in the direction extending from the fourth resin side surface 706 of the encapsulation resin 70 toward the third resin side surface 705.

In the first control lead 41 and the second to seventh leads 42 to 47, the substrate connection portions 413, 423, 433, 443, 453, 463, and 473 have the same width. The width of the substrate connection portion 413 is, for example, 1.2 mm, and the width of the base portion 412 is, for example, 2.6 mm. As shown in FIGS. 1 and 3, in the present embodiment, the thickness of the first control lead 41 is less than or equal to the thickness of the first die pad 11. The thickness of the first control lead 41 is, for example, 0.6 mm.

Second Lead

As shown in FIG. 2, the second lead 42 includes a pad portion 421, a base portion 422, and a substrate connection portion 423. The pad portion 421 is spaced apart from the first die pad 11 toward the first resin side surface 703 of the encapsulation resin 70 in lengthwise direction Y. The pad portion 421 is a wire bonding portion to which a wire 62 is connected. The pad portion 421 is connected by the wire 62 to the control source electrode 312 of the first switching element 20. Thus, the second lead 42 is a first source lead connected to the source electrode of the first switching element 20. In the description hereafter, the second lead 42 may be referred to as the first source lead 42. The wire 62 is formed from, for example, Al. The diameter of the wire 62 is, for example, 0.04 mm or greater and 0.1 mm or less.

The base portion 422 extends from the pad portion 421 in lengthwise direction Y and projects out of the first resin side surface 703 of the encapsulation resin 70. The substrate connection portion 423 extends from the distal end of the base portion 422 in lengthwise direction Y. The substrate connection portion 423 is inserted into a component hole of a mounting substrate and connected to conductive wiring of the mounting substrate by solder (neither shown). As shown in FIG. 2, in the present embodiment, the base portion 422 of the first source lead 42 has the same width as the substrate connection portion 423. The thickness of the first source lead 42 is less than or equal to the thickness of the first die pad 11, for example, 0.6 mm.

Third Lead

As shown in FIG. 2, the third lead 43 includes a connection portion 431, a base portion 432, and a substrate connection portion 433. The connection portion 431 is connected to the first die pad 11. The first die pad 11 is connected to the first back surface electrode (drain electrode) 23 of the first switching element 20. Thus, the third lead 43 is a first drive lead (drain lead) connected to the first back surface electrode (drain electrode) 23 of the first switching element 20. In the description hereafter, the third lead 43 may be referred to as the first drive lead 43. In the present embodiment, the first drive lead 43 is integrated with the first die pad 11. The first drive lead 43 and the first die pad 11 form an integrated first lead frame 14.

The base portion 432 extends from the connection portion 431 in lengthwise direction Y and projects out of the first resin side surface 703 of the encapsulation resin 70. The substrate connection portion 433 extends from the distal end of the base portion 432 in lengthwise direction Y. The substrate connection portion 433 is inserted into a component hole of a mounting substrate and connected to conductive wiring of the mounting substrate by solder (neither shown). As shown in FIG. 2, the base portion 432 has a greater width than the substrate connection portion 433 in widthwise direction X. In widthwise direction X, the base portion 432 projects further from the substrate connection portion 433 toward the first source lead 42. The width of the substrate connection portion 433 is, for example, 1.2 mm, and the width of the base portion 432 is 2.6 mm. As shown in FIG. 1, in the present embodiment, the thickness of the first drive lead 43 is less than or equal to the thickness of the first die pad 11, for example, 0.6 mm.

Fourth Lead

As shown in FIG. 2, the fourth lead 44 includes a connection portion 441, a base portion 442, and a substrate connection portion 443. The connection portion 441 is connected to the second die pad 12. The second die pad 12 is connected to the second back surface electrode (drain electrode) 33 of the second switching element 30. Further, the second die pad 12 is connected to the first main surface electrode 21 (main source electrode 211) of the first switching element 20. Thus, the fourth lead 44 is an output lead connected to the first main surface electrode 21 (main source electrode 211) of the first switching element 20 and the second back surface electrode (drain electrode) 33 of the second switching element 30. In the description hereafter, the fourth lead 44 may be referred to as the output lead 44. In the present embodiment, the output lead 44 is integrated with the second die pad 12. The output lead 44 and the second die pad 12 form an integrated second lead frame 15.

The base portion 442 extends from the connection portion 441 in lengthwise direction Y and projects out of the first resin side surface 703 of the encapsulation resin 70. The substrate connection portion 443 extends from the distal end of the base portion 442 in lengthwise direction Y. As shown in FIG. 2, the base portion 442 has a greater width than the substrate connection portion 443 in widthwise direction X. In widthwise direction X, the base portion 442 projects further from the substrate connection portion 443 toward the first drive lead 43. In the present embodiment, the widths of the base portion 442 and the substrate connection portion 443 of the output lead 44 and the thickness of the output lead 44 are less than or equal to the thickness of the second die pad 12, for example, 0.6 mm.

Fifth Lead

As shown in FIG. 2, the fifth lead 45 includes a pad portion 451, a base portion 452, and a substrate connection portion 453. The pad portion 451 is spaced apart from the second die pad 12 and located toward the first resin side surface 703 of the encapsulation resin 70 in lengthwise direction Y. The pad portion 451 extends along the first side surface 123 of the second die pad 12. The pad portion 451 is a wire bonding portion to which second wires 52 serving as a second connecting member are connected. The pad portion 451 is connected by, for example, the second wires 52 to the second main surface electrode 31 (main source electrode 311) of the second switching element 30. FIG. 2 shows five second wires 52. The second wires 52 are arranged in widthwise direction X. The second wires 52 are laid out parallel to one another as viewed in thickness direction Z. Thus, the fifth lead 45 is a second drive lead (source lead) connected to the second main surface electrode 31 (main source electrode 311) of the second switching element 30. In the description hereafter, the fifth lead 45 may be referred as the second drive lead 45. The second wires 52 are formed from, for example, Al. The diameter of the second wires 52 is, for example, 0.1 mm or greater and 0.4 mm or less.

As shown in FIG. 2, the base portion 452 extends from the pad portion 451 in lengthwise direction Y and projects out of the first resin side surface 703 of the encapsulation resin 70. The substrate connection portion 453 extends from the distal end of the base portion 452 in lengthwise direction Y. As shown in FIG. 2, the base portion 452 has a greater width than the substrate connection portion 453 in widthwise direction X. In widthwise direction X, the base portion 452 projects further from the substrate connection portion 453 toward the sixth lead 46. In the present embodiment, the widths of the base portion 452 and the substrate connection portion 453 of the second drive lead 45 of the second drive lead 45 are less than or equal to the thickness of the second die pad 12, for example, 0.6 mm.

Sixth Lead

As shown in FIG. 2, the sixth lead 46 includes a pad portion 461, a base portion 462, and a substrate connection portion 463. The pad portion 461 is spaced apart from the second die pad 12 and located toward the first resin side surface 703 of the encapsulation resin 70 in lengthwise direction Y. The pad portion 461 is a wire bonding portion to which a wire 63 is connected. The pad portion 461 is connected by, for example, one wire 63 to the control source electrode 313 of the second switching element 30. Thus, the sixth lead 46 is a source lead connected to the control source electrode 313 of the second switching element 30. In the description hereafter, the sixth lead 46 may be referred to as the second source lead 46. The wire 63 is formed from, for example, Al. The diameter of the wire 63 is, for example, 0.04 mm or greater and 0.1 mm or less.

The base portion 462 extends from the pad portion 461 in lengthwise direction Y and projects out of the first resin side surface 703 of the encapsulation resin 70. The substrate connection portion 463 extends from the distal end of the base portion 462 in lengthwise direction Y. As shown in FIG. 2, in the present embodiment, the base portion 462 of the second source lead 46 has the same width as the substrate connection portion 463. In the present embodiment, the widths of the base portion 462 and the substrate connection portion 463 of the second source lead 46 and the thickness of the second source lead 46 are less than or equal to the thickness of the second die pad 12, for example, 0.6 mm.

Seventh Lead

As shown in FIG. 2, the seventh lead 47 includes a pad portion 471, a base portion 472, and a substrate connection portion 473. The pad portion 471 is spaced apart from the second die pad 12 toward the first resin side surface 703 of the encapsulation resin 70 in lengthwise direction Y. The pad portion 471 is a wire bonding portion to which a wire 64 is connected. The pad portion 471 is connected by the wire 64 to the second control electrode 32 of the second switching element 30. Thus, the seventh lead 47 is a second control lead connected to the second control electrode (gate electrode) 32 of the second switching element 30. In the description hereafter, the seventh lead 47 may be referred to as the second control lead 47. The wire 64 is formed from, for example, Al. The diameter of the wire 64 is, for example, 0.04 mm or greater and 0.1 mm or less.

The base portion 472 extends from the pad portion 471 in lengthwise direction Y and projects out of the first resin side surface 703 of the encapsulation resin 70. The substrate connection portion 473 extends from the distal end of the base portion 472 in lengthwise direction Y. As shown in FIG. 2, the base portion 472 has a greater width than the substrate connection portion 473 in widthwise direction X. In widthwise direction X, the base portion 472 projects further from the substrate connection portion 473 in the direction extending from the third resin side surface 705 of the encapsulation resin 70 toward the fourth resin side surface 706. In the present embodiment, the widths of the base portion 472 and the substrate connection portion 473 of the second control lead 47 and the thickness of the second control lead 47 are less than or equal to the thickness of the second die pad 12, for example, 0.6 mm. In the present embodiment, the first to seventh leads 41 to 47 have the same thickness.

In the present embodiment, the leads 41 to 47 are arranged so that the interval between two adjacent ones of the first source lead 42 to the second source lead 46 in widthwise direction X is wider than the interval between the first control lead 41 and the first source lead 42 and the interval between the second source lead 46 and the second control lead 47. Further, in the present embodiment, the first source lead 42 to the second source lead 46 are arranged so that the base portions 422, 432, 442, 452, and 462 are arranged at equal intervals. As shown in FIG. 2, the encapsulation resin 70 includes recesses 707 extending from the first resin side surface 703 in lengthwise direction Y between the first source lead 42 to the second source lead 46.

Operation

A comparative example compared with the present embodiment will now be described.

Figure 4:
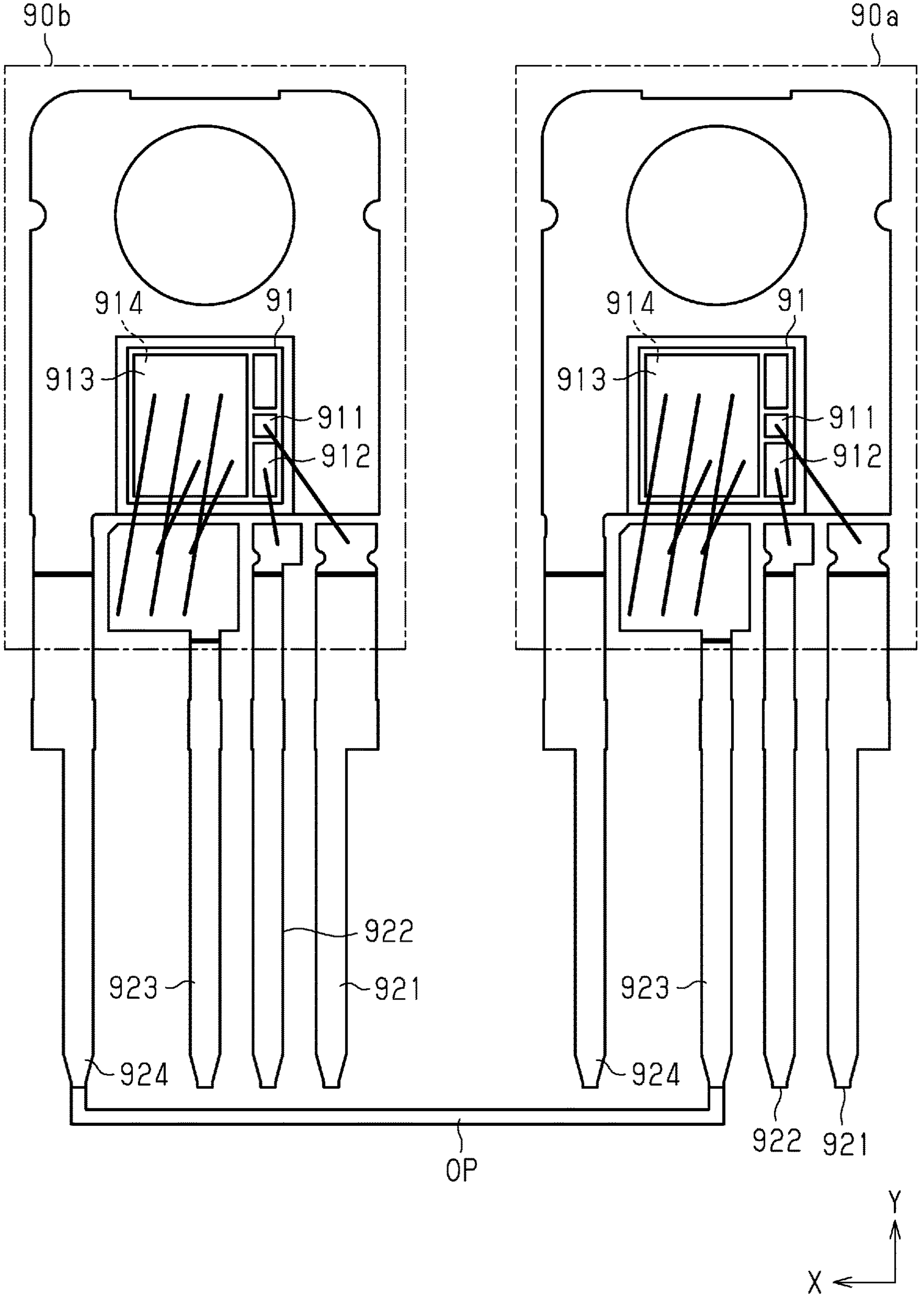
FIG. 4 is a plan view of a comparative example that is compared with the semiconductor device in accordance with the first embodiment.

FIG. 4 shows the comparative example compared with the present embodiment. The comparative example uses two semiconductor devices 90*a* and 90*b* to form an inverter circuit or the like. The semiconductor devices 90*a* and 90*b* each include a switching element 91 and leads 921 to 924 respectively connected to a gate electrode 911, a control source electrode 912, a main source electrode 913, and a back surface electrode (drain electrode) 914 of the switching element 91. The electrodes 911 to 914 are connected to the leads 921 to 924, respectively. The inverter circuit is formed by electrically connecting the back surface electrode (drain electrode) 914 of the switching element 91 of one semiconductor device 90*a* to the main source electrode 913 of the switching element 91 of the other semiconductor device 90*b* with external wiring OP. The external wiring OP is, for example, conductive wiring of a mounting substrate on which the semiconductor devices 90*a* and 90*b* are mounted. In FIG. 4, the external wiring OP connects the distal ends of the leads 924 and 923.

The lead 923 of one semiconductor device 90*a* is connected to conductive wiring that supplies low potential voltage, and the lead 924 of the other semiconductor device 90*a* is connected to conductive wiring that supplies high potential voltage. The two semiconductor devices 90*a* and 90*b* and the external wiring OP are disposed between the lead 923 and the lead 924. The parasitic inductance of the external wiring OP increases the inductance of the lead 924 (drain lead), the lead 923 (output lead), and the lead 923 (source lead).

The semiconductor device A10 in accordance with the present embodiment includes the first switching element 20 and the second switching element 30 in the same encapsulation resin 70. The first main surface electrode 21 (main source electrode 211) of the first switching element 20 is connected by the first wires 51, which serves as the first connecting member, to the second die pad 12, on which the second switching element 30 is mounted. Accordingly, in the semiconductor device A10 in accordance with the present embodiment, the conductor distance is shortened between the first drive lead 43 (first drive lead), the output lead 44 (output lead), and the second drive lead 45 (second drive lead). Thus, the inductance of the semiconductor device A10 is smaller than that of the comparative example, that is, approximately one-half. In this manner, the semiconductor device A10 in accordance with the present embodiment reduces inductance.

Advantages

As described above, the present embodiment has the following advantages.

(1-1) The semiconductor device A10 includes the first switching element 20 and the second switching element 30 in the same encapsulation resin 70. The first main surface electrode 21 (main source electrode 211) of the first switching element 20 is connected by the first wires 51, which serves as the first connecting member, to the second die pad 12, on which the second switching element 30 is mounted. Accordingly, in the semiconductor device A10, the conductor distance is shortened between the first drive lead 43 (first drive lead), the output lead 44 (output lead), and the second drive lead 45 (second drive lead). This reduces the inductance.

(1-2) The thickness of the first die pad 11 and the second die pad 12 is 1 mm or greater and 3 mm or less. It is preferable that the first die pad 11 and the second die pad be thick. The heat generated when the first switching element 20 functions is transmitted from the first switching element 20 to the first die pad 11. As the thickness of the first die pad 11 increases, heat is more easily transmitted from the first switching element 20 to the first die pad 11. Thus, heat dissipation of the first switching element 20 is improved, and thermal resistance in the first switching element 20 is reduced. In the same manner, thermal resistance of the second switching element 30 is reduced.

(1-3) The first wires 51, which serve as the first connecting member, are laid out so as to be parallel to one another as viewed in thickness direction Z. Accordingly, in a step for connecting the first wires 51, the angle of each wire and the loop height of each wire do not have to be changed. Thus, the first wires 51 can be connected by repeating the same action. This facilitates manufacturing.

(1-4) The main source electrode 311 of the second switching element 30 is connected by the second wires 52 to the pad portion 451 of the second drive lead 45. The second wires 52 are laid out parallel to one another as viewed in thickness direction Z. Accordingly, in a step for connecting the second wires 52, the angle of each wire and the loop height of each wire do not have to be changed. Thus, the wires 62 can be connected by repeating the same action. This facilitates manufacturing.

(1-5) The leads 41 to 47 are arranged so that the interval between two adjacent ones of the first source lead 42 to the second source lead 46 in widthwise direction X is wider than the interval between the first control lead 41 and the first source lead 42 and the interval between the second source lead 46 and the second control lead 47. In the present embodiment, the first source lead 42 to the second source lead 46 are arranged so that the base portions 422, 432, 442, 452, and 462 of the first source lead 42 to the second source lead 46 are arranged at equal intervals. This lengthens the interval between two adjacent ones of the first source lead 42 to the second source lead 46 and ensures insulation.

(1-6) The encapsulation resin 70 includes the recesses 707 extending from the first resin side surface 703 in lengthwise direction Y between the first source lead 42 to the second source lead 46. The recesses 707 lengthen the distance of the surface (surface distance) of the encapsulation resin 70 between the first source lead 42 and the first drive lead 43 and ensures insulation between the first source lead 42 and the first drive lead 43. In the same manner, the surface distance is lengthened between the leads 43 and 44, the leads 44 and 45, and the leads 45 and 46 that sandwich the recesses 707. This ensures insulation.

Modified Examples of First Embodiment

The first embodiment may be modified as described below.

The configuration of the first switching element 20 and the second switching element 30 may be changed. For example, in the first switching element 20, the first main surface electrode 21 is divided into the main source electrode 211 and the control source electrodes 212 and 213. Instead, a switching element having a non-divided first main surface electrode may be used. In this case, the first wires 51 and the wire 62 shown in FIGS. 1 and 2 are connected to the single first main surface electrode. In the same manner, in the second switching element 30, the second main surface electrode 31 includes the main source electrode 311 and the control source electrodes 312 and 313. Instead, a switching element having a non-divided second main surface electrode may be used. In this case, the second wires 52 and the wire 63 are connected to the single first main surface electrode.

Figure 5:
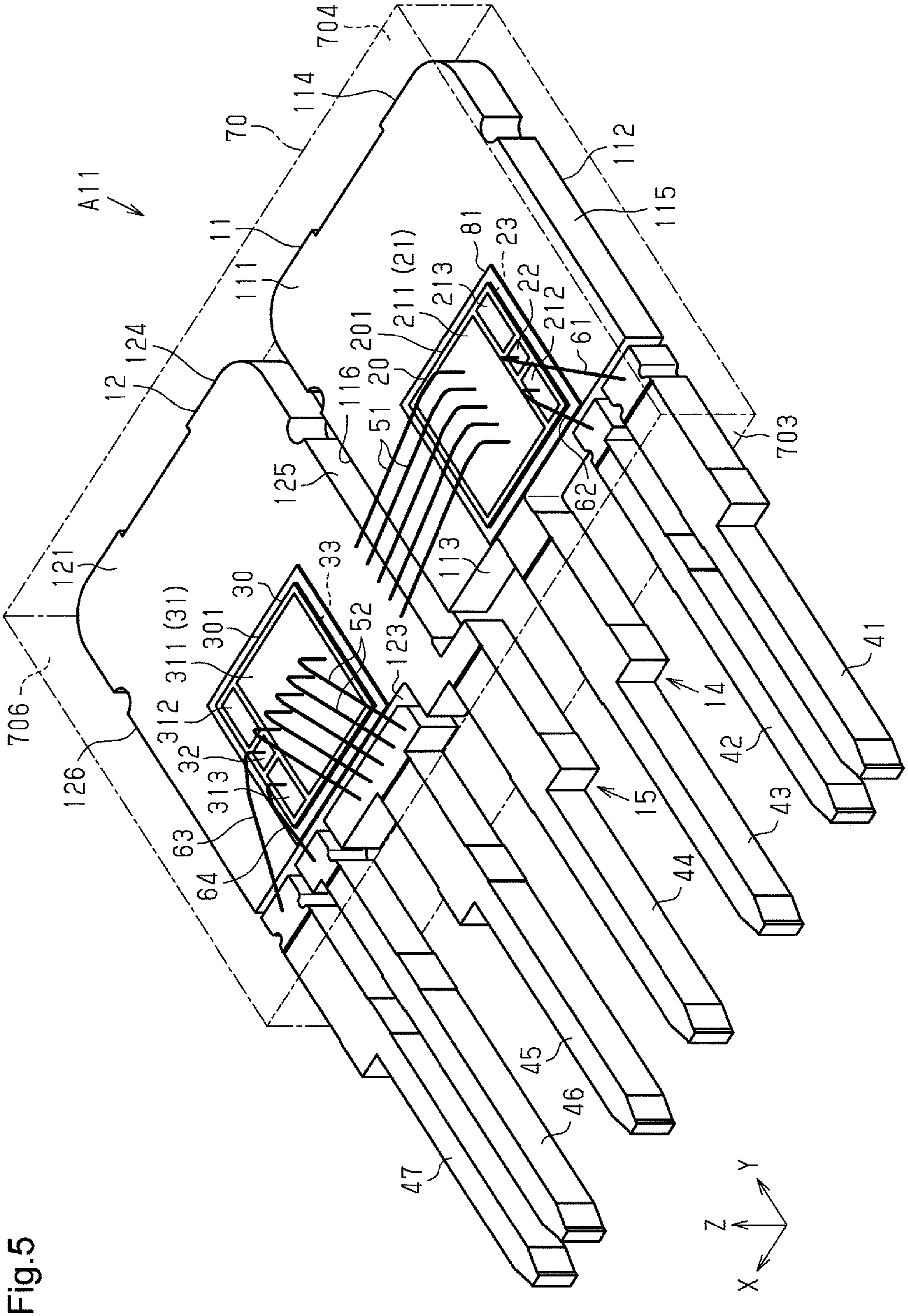
FIG. 5 is a perspective view of a semiconductor device in accordance with a modified example of the first embodiment.

The thickness of each lead may be changed. For example, a semiconductor device A11 shown in FIG. 5 includes the first to seventh leads 41 to 47 that have the same thickness. The thickness of the third lead 43 to the fifth lead is equal to the thickness of the first die pad 11 and the second die pad 12. In FIG. 5, the first lead 41, the second lead 42, the sixth lead 46, and the seventh lead 47 has the same thickness as the third lead 43 to the fifth lead 45. Instead, either the first lead 41 or the second lead 42 and either the sixth lead 46 or the seventh lead 47 may have a thickness that differs from the thickness of the third to fifth leads 43 to 45. Further, at least one of the third to fifth leads 43 to 45 may have a thickness that differs from the thickness of the first die pad 11 and the second die pad 12.

The number of the first wires 51 serving as the first connecting member connecting the first switching element 20 and the second die pad 12 may be four or less or six or greater.

The number of the second wires 52 serving as the second connecting member connecting the second switching element 30 and the fifth lead 45 may be four or less or six or greater.

Some or all of the recesses 707 can be omitted from the encapsulation resin 70.

Second Embodiment

With reference to FIGS. 6 to 9, a semiconductor device A20 in accordance with a second embodiment will now be described.

The semiconductor device A20 in accordance with the second embodiment differs from the semiconductor device A10 in accordance with the first embodiment mainly in the connection of the fourth lead and the fifth lead. In the description hereafter, same reference numerals are given to those components that are the same as the corresponding components of the semiconductor device A10 in accordance with the first embodiment. Such components will not be described in detail.

Figure 6:
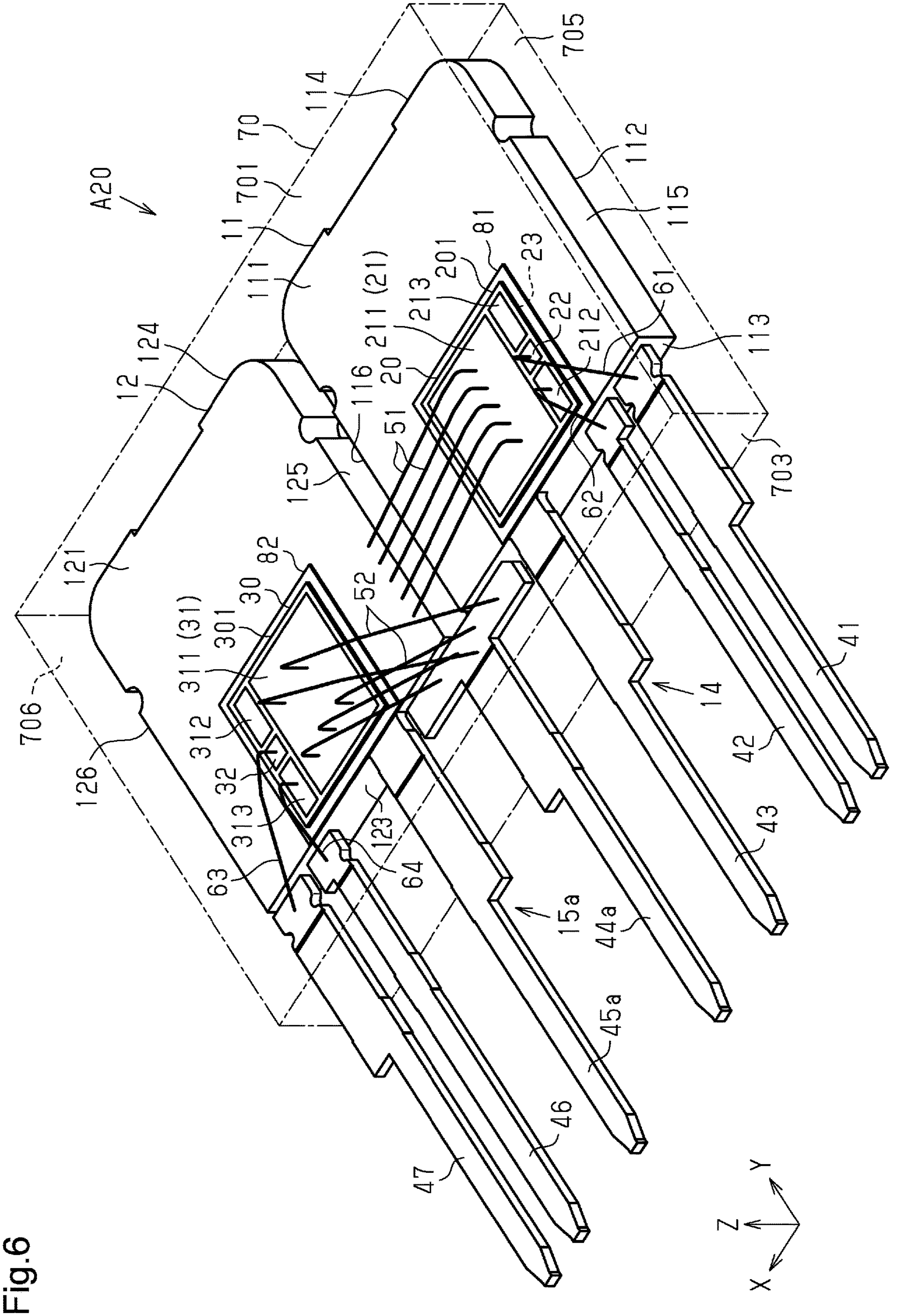
FIG. 6 is a perspective view of a semiconductor device in accordance with a second embodiment.
Figure 7:
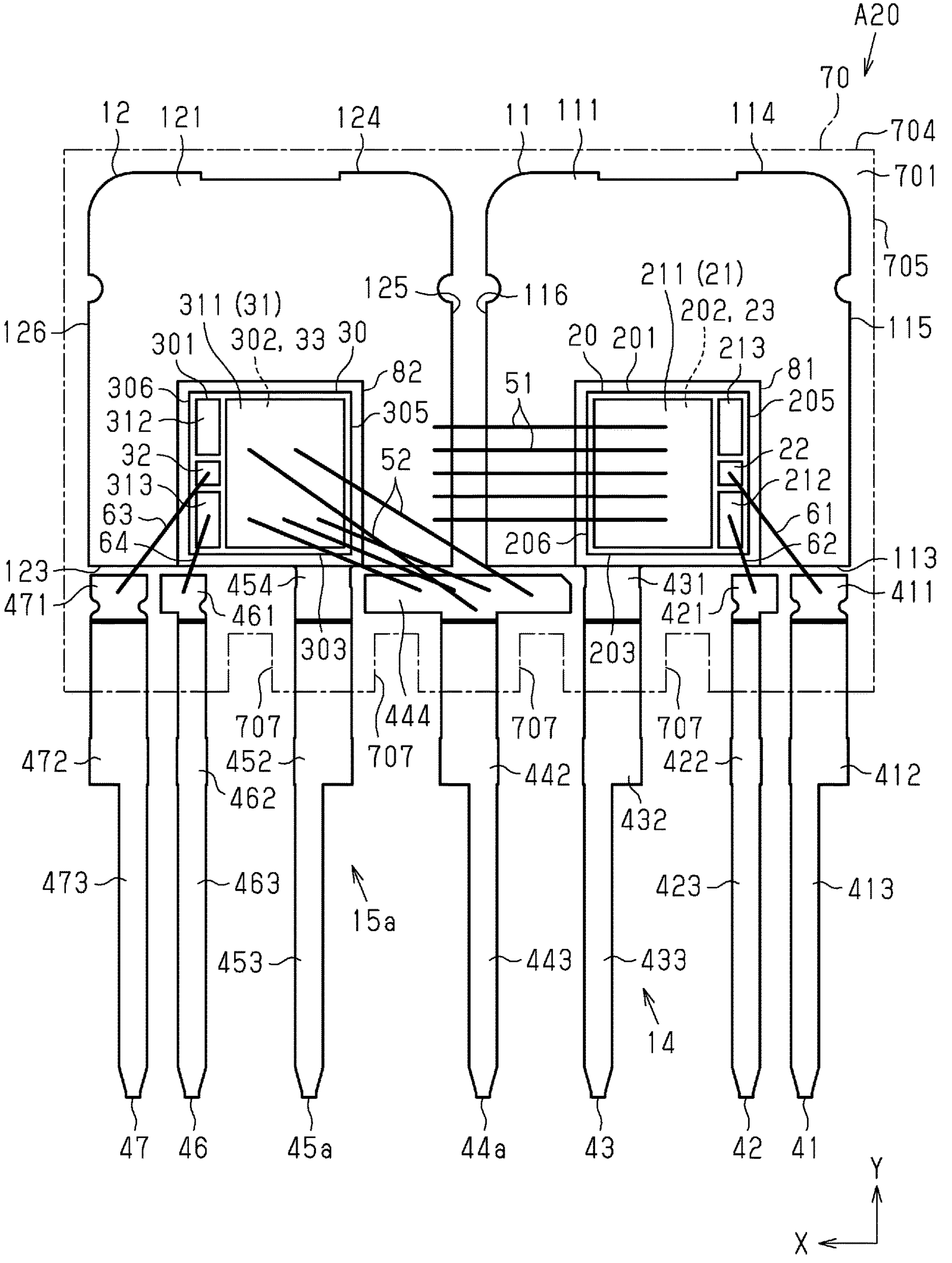
FIG. 7 is a plan view of the semiconductor device in accordance with the second embodiment.
Figure 8:
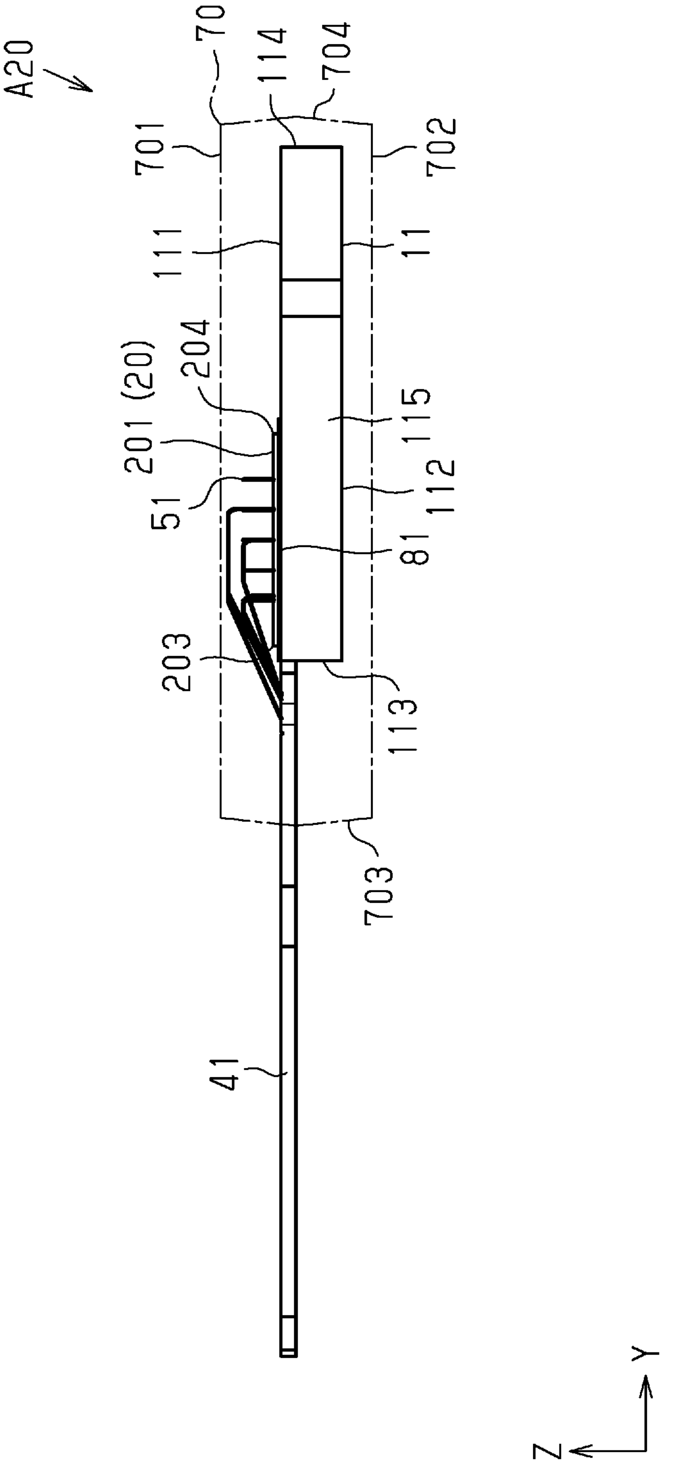
FIG. 8 is a side view of the semiconductor device in accordance with the second embodiment.

As shown in FIGS. 6 to 8, the semiconductor device A20 in accordance with the present embodiment includes leads 41, 42, 43, 44*a*, 45*a*, 46, and 47 projecting out of the first resin side surface 703 of the encapsulation resin 70.

Fourth Lead

The fourth lead 44*a* includes a pad portion 444, the base portion 442, and the substrate connection portion 443. The pad portion 444 is spaced apart from the second die pad 12 and located toward the first resin side surface 703 of the encapsulation resin 70 in lengthwise direction Y. The pad portion 444 extends along the first side surface 123 of the second die pad 12. The pad portion 444 is a wire bonding portion to which the second wires 52 serving as the second connecting member are connected. The pad portion 444 is connected by, for example, the second wires 52 to the second main surface electrode 31 (main source electrode 311) of the second switching element 30. FIGS. 6 and 7 show five second wires 52. Thus, the fourth lead 44*a* is a second drive lead (source lead) connected to the second main surface electrode 31 (main source electrode 311) of the second switching element 30.

Fifth Lead

The fifth lead 45*a* includes a connection portion 454, the base portion 452, and the substrate connection portion 453. The connection portion 454 is connected to the second die pad 12. The second die pad 12 is connected to the second back surface electrode 33 (drain electrode) of the second switching element 30. Further, the second die pad 12 is connected to the first main surface electrode 21 (main source electrode 211) of the first switching element 20. That is, the fifth lead 45*a* is an output lead connected to the first main surface electrode 21 (main source electrode 211) of the first switching element 20 and the second back surface electrode 33 (drain electrode) of the second switching element 30. In the present embodiment, the fifth lead 45*a* is integrated with the second die pad 12. The fifth lead 45*a* and the second die pad 12 form an integrated second lead frame 15*a*.

Operation

The operation of the semiconductor device A20 in accordance with the second embodiment will now be described.

The semiconductor device A20 in accordance with the present embodiment includes the first drive lead 43 (third lead), the second drive lead 44*a* (fourth lead), and the output lead 45*a* (fifth lead) that are arranged in order in widthwise direction X. That is, the first drive lead 43 and the second drive lead 44*a* are arranged next to each other. The first drive lead 43 is supplied with high potential voltage, and the second drive lead 44*a* is supplied with low potential voltage.

Figure 9:
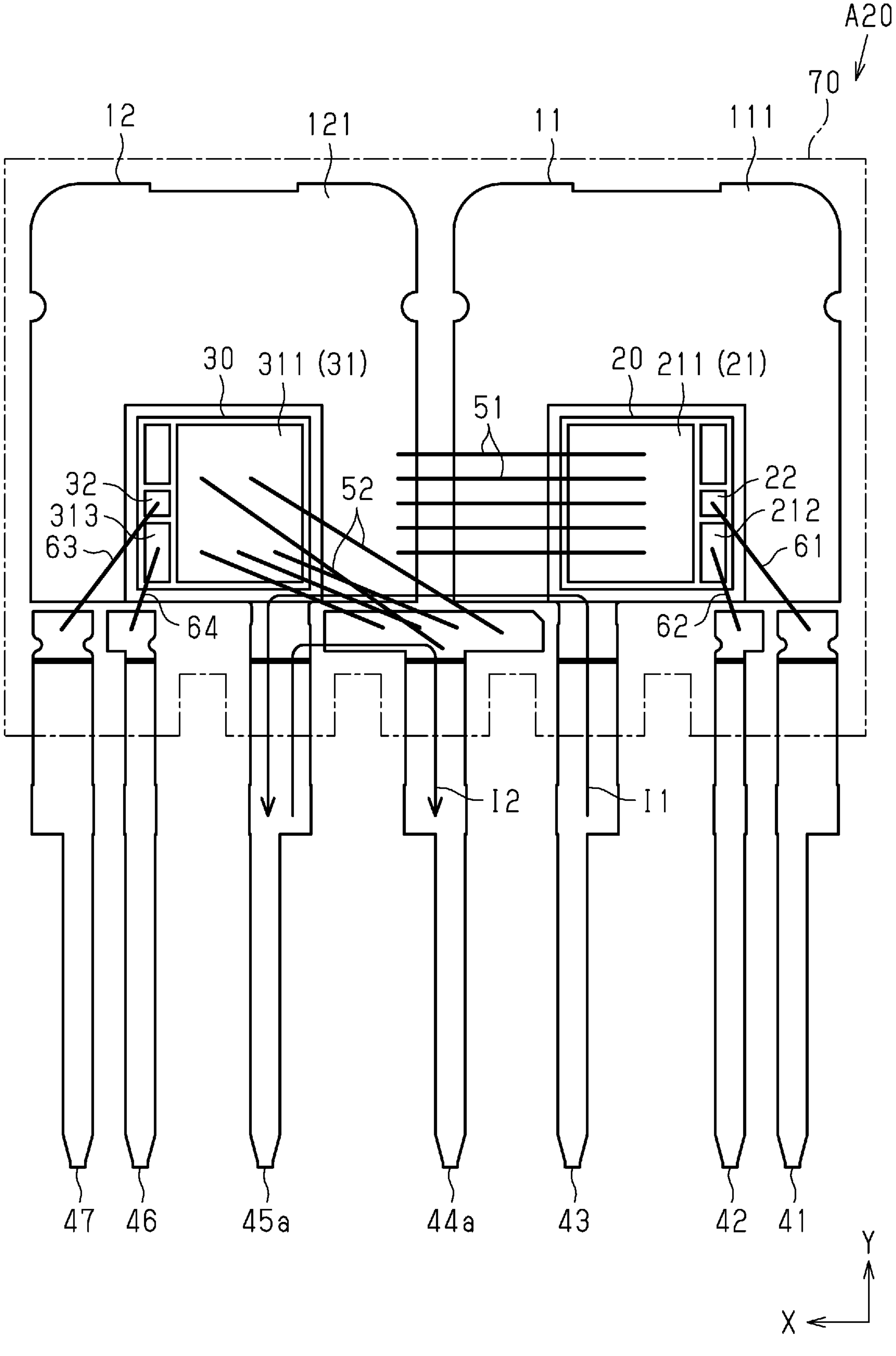
FIG. 9 is a plan view illustrating the operation of the semiconductor device in accordance with the second embodiment.

FIG. 9 shows the flow of current when the semiconductor device A20 in accordance with the present embodiment functions. When the first switching element 20 is on and the second switching element 30 is off, first current I1 flows from the first drive lead 43 to the output lead 45*a*. In contrast, when the first switching element 20 is off and the second switching element 30 is on, second current I2 flows from the output lead 45*a* to the second drive lead 44*a*. When the semiconductor device A20 is operated by a high-speed control signal (e.g., 1 MHz), in the first drive lead 43 and the second drive lead 44*a* that are adjacent to each other, the first current I1 and the second current I2 flow alternately in opposite directions through the semiconductor device A20. The magnetic flux generated by the first current I1 and the second current I2 reduces parasitic inductance in the semiconductor device A20.

Advantages

As described above, the present embodiment has the following advantages in addition to the advantages of the first embodiment.

(2-1) The semiconductor device A20 includes the first drive lead 43 (third lead), the second drive lead 44*a* (fourth lead), and the output lead 45*a* (fifth lead) that are arranged in order in widthwise direction X. The first current I1, which flows from the first drive lead 43 toward the output lead 45*a*, and the second current I2, which flows from the output lead 45*a* toward the second drive lead 44*a*, reduces inductance in the semiconductor device A20.

Third Embodiment

With reference to FIGS. 10 to 14, a semiconductor device A30 in accordance with a third embodiment will now be described.

The semiconductor device A30 in accordance with the third embodiment differs from the semiconductor device A10 in accordance with the first embodiment in the first connecting member and the second connecting member. In the description hereafter, same reference numerals are given to those components that are the same as the corresponding components of the semiconductor device A10 in accordance with the first embodiment. Such components will not be described in detail.

As shown in FIGS. 10 to 14, the semiconductor device A30 in accordance with the present embodiment includes a first clip 53 serving as the first connecting member. Further, the semiconductor device A30 in accordance with the present embodiment includes a second clip 54.

Figure 13:
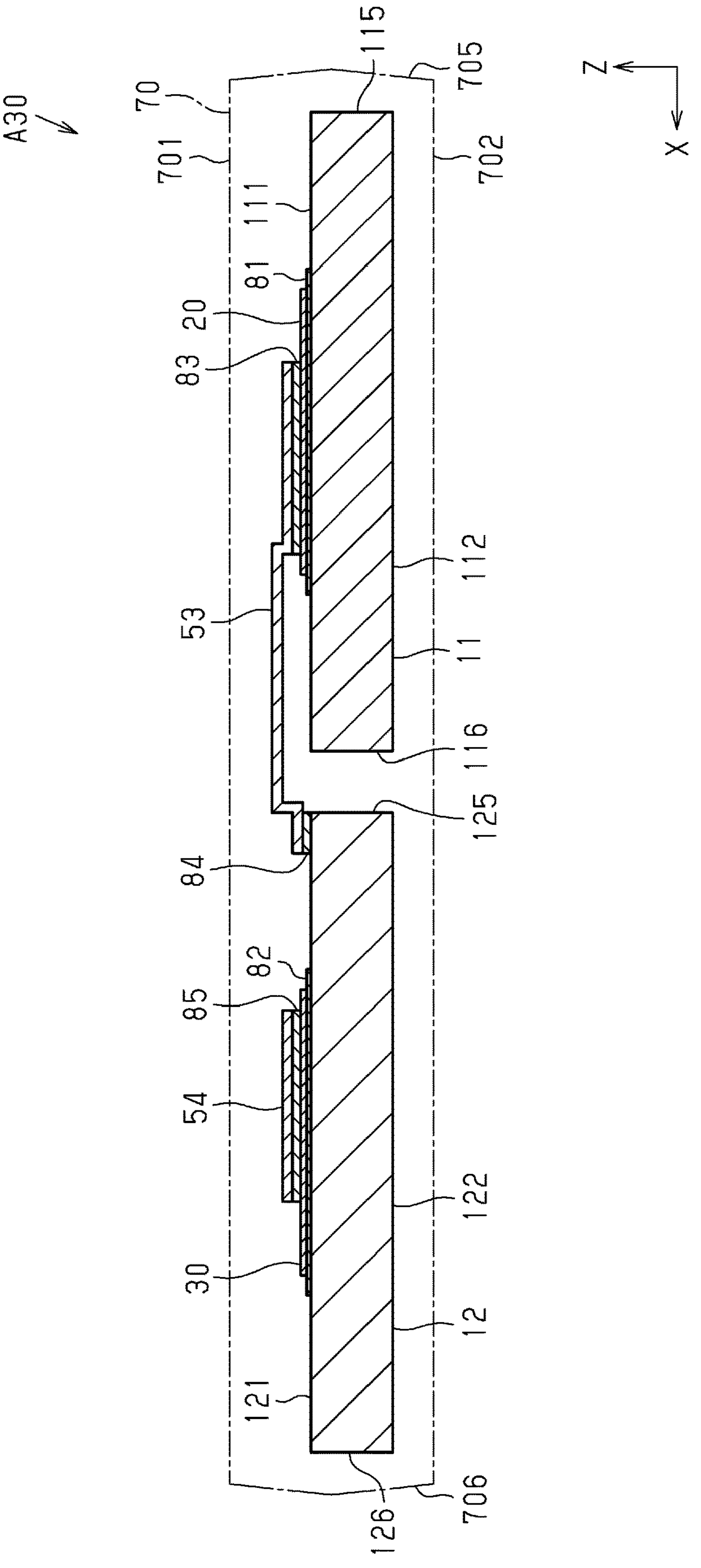
FIG. 13 is a cross-sectional view taken along line 13-13 in FIG. 11.

The first switching element 20 is connected to the second die pad 12 by the first clip 53. The first clip 53 is a conductive plate-like member. The first clip 53 is formed by bending a conductive plate. The first clip 53 of the present embodiment is belt-shaped and extends in widthwise direction X. The first clip 53 connects the first main surface electrode 21 (main source electrode 211) of the first switching element 20 and the second die pad 12. As shown in FIG. 13, one end of the first clip 53 is connected by solder 83 to the main source electrode 211 of the first switching element 20, and the other end of the first clip 53 is connected by solder 84 to the second die pad 12. The first clip 53 is formed from Cu. The thickness of the first clip 53 is 0.05 mm or greater and 1.0 mm or less, preferably, 0.5 mm or greater.

Figure 10:
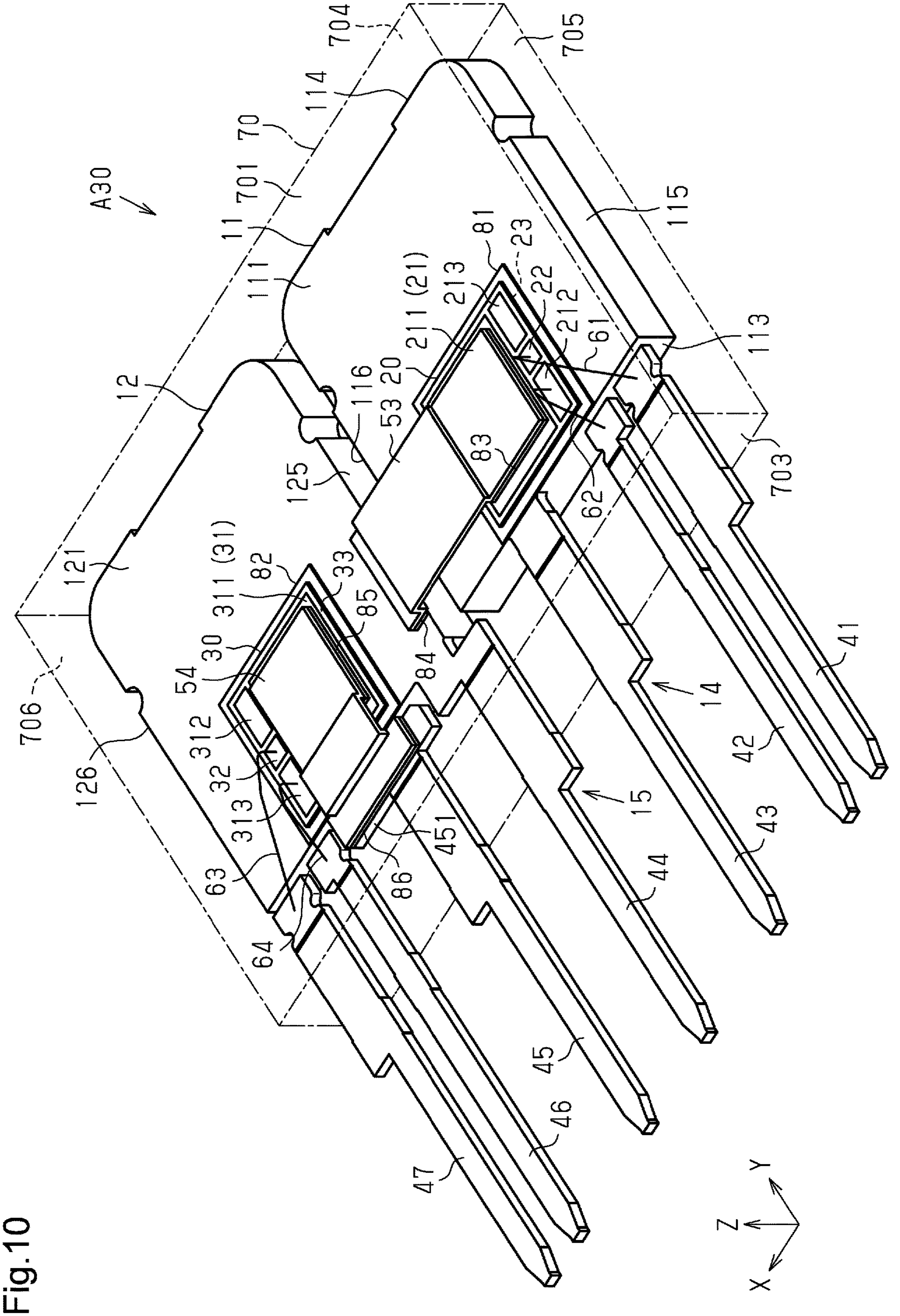
FIG. 10 is a perspective view of a semiconductor device in accordance with a third embodiment.
Figure 11:
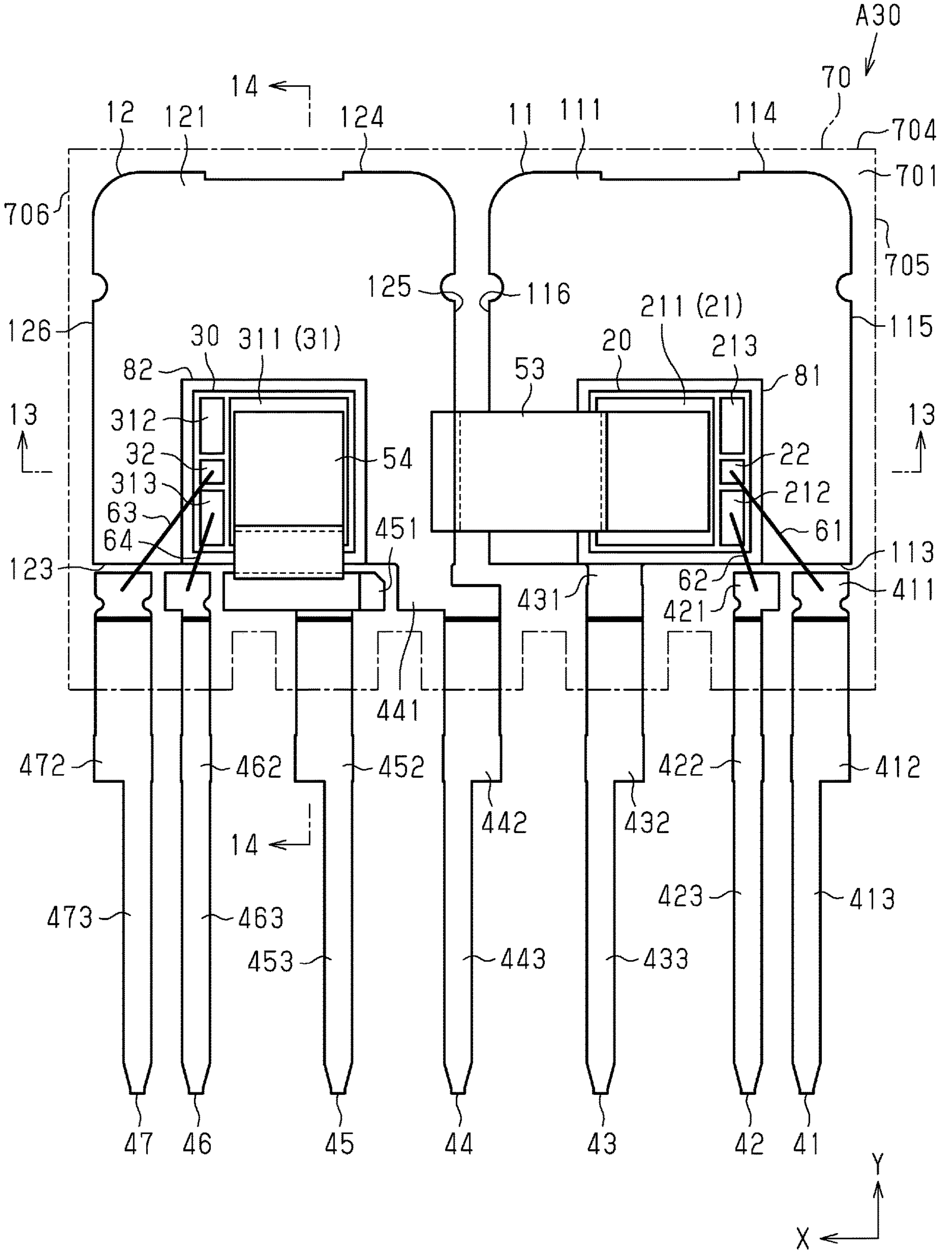
FIG. 11 is a plan view of the semiconductor device in accordance with the third embodiment.
Figure 12:
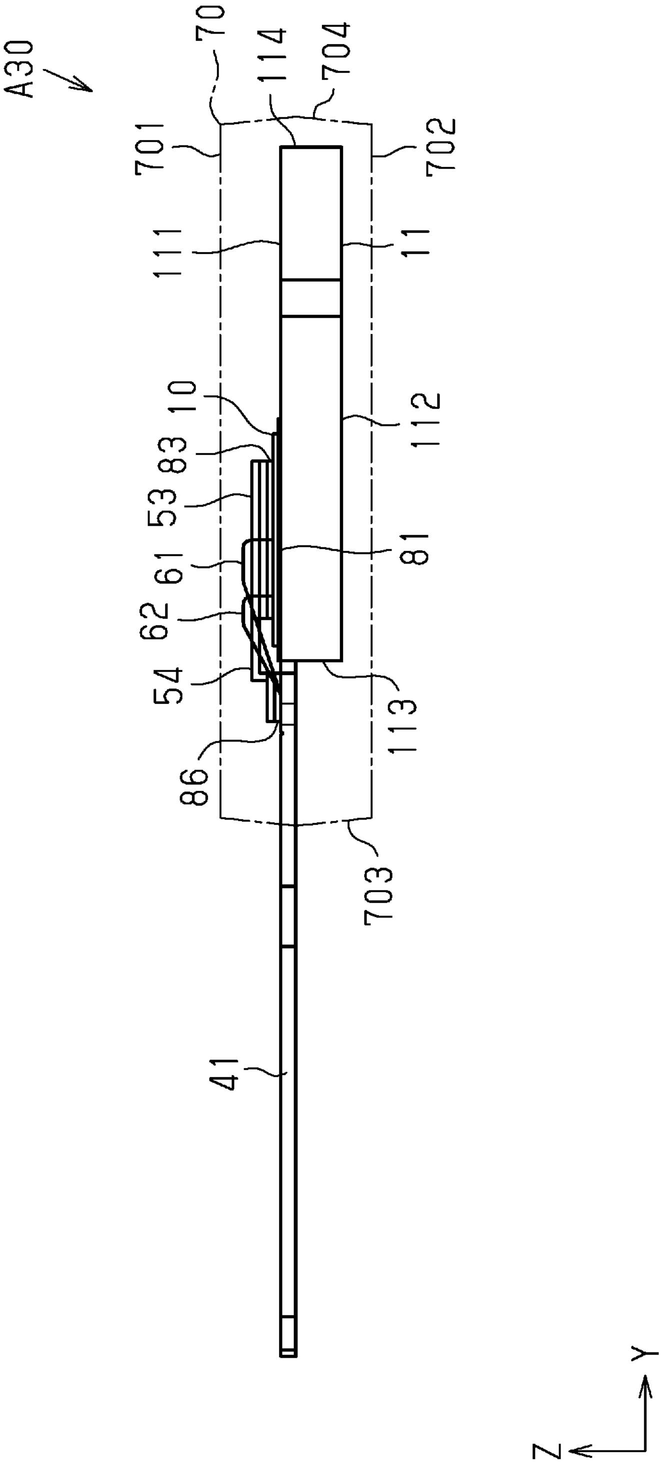
FIG. 12 is a side view of the semiconductor device in accordance with the third embodiment.
Figure 14:
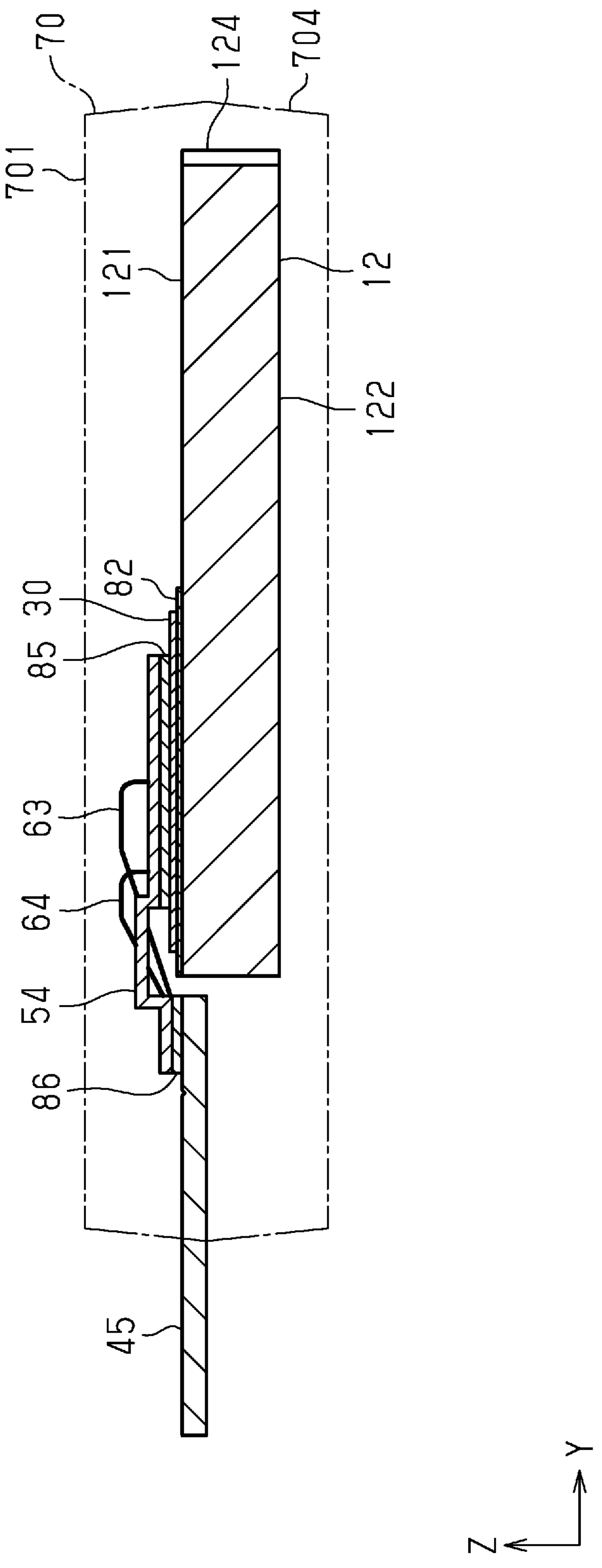
FIG. 14 is a cross-sectional view taken along line 14-14 in FIG. 11.

As shown in FIGS. 10, 11, and 14, the second switching element 30 is connected by the second clip 54 to the fifth lead 45 (second drive lead). The second clip 54 is a conductive plate-like member. The second clip 54 is formed by bending a conductive plate. The second clip 54 of the present embodiment is belt-shaped and extends in lengthwise direction Y. The second clip 54 connects the second main surface electrode 31 (main source electrode 311) of the second switching element 30 and the pad portion 451 of the fifth lead 45. As shown in FIG. 14, one end of the second clip 54 is connected by solder 85 to the main source electrode 311 of the second switching element 30, and the other end of the second clip 54 is connected by solder 86 to the pad portion 451 of the fifth lead 45. The second clip 54 is formed from Cu. The thickness of the second clip 54 is 0.05 mm or greater and 1.0 mm or less, preferably, 0.5 mm or greater.

Advantages

As described above, the present embodiment has the following advantages in addition to the advantages of the first embodiment.

(3-1) The first clip 53 connects the first switching element 20 and the second die pad 12. This configuration can be applied to large currents and is in contrast with a configuration that connects the first switching element 20 and the second die pad 12 with wires.

(3-2) In comparison with when connecting the first switching element 20 and the second die pad 12, the first switching element 20 and the second die pad 12 can be connected with the same first clip 53. This reduces the number of manufacturing steps.

(3-3) The second clip 54 connects the second switching element 30 and the fifth lead 45. This configuration can be applied to large currents and is in contrast with a configuration that connects the second switching element 30 and the fifth lead 45.

(3-4) In comparison with when connecting the second switching element 30 and the fifth lead 45 with wires, the second switching element 30 and the fifth lead 45 can be connected with the same second clip 54. This reduces the number of manufacturing steps.

Fourth Embodiment

With reference to FIGS. 15 to 18, a semiconductor device A40 in accordance with a fourth embodiment will now be described.

The semiconductor device A40 in accordance with the fourth embodiment differs from the semiconductor device A30 in accordance with the third embodiment mainly in the connection of the fourth lead and the fifth lead. In the description hereafter, same reference numerals are given to those components that are the same as the corresponding components of the semiconductor device A30 in accordance with the third embodiment. Such components will not be described in detail.

Figure 15:
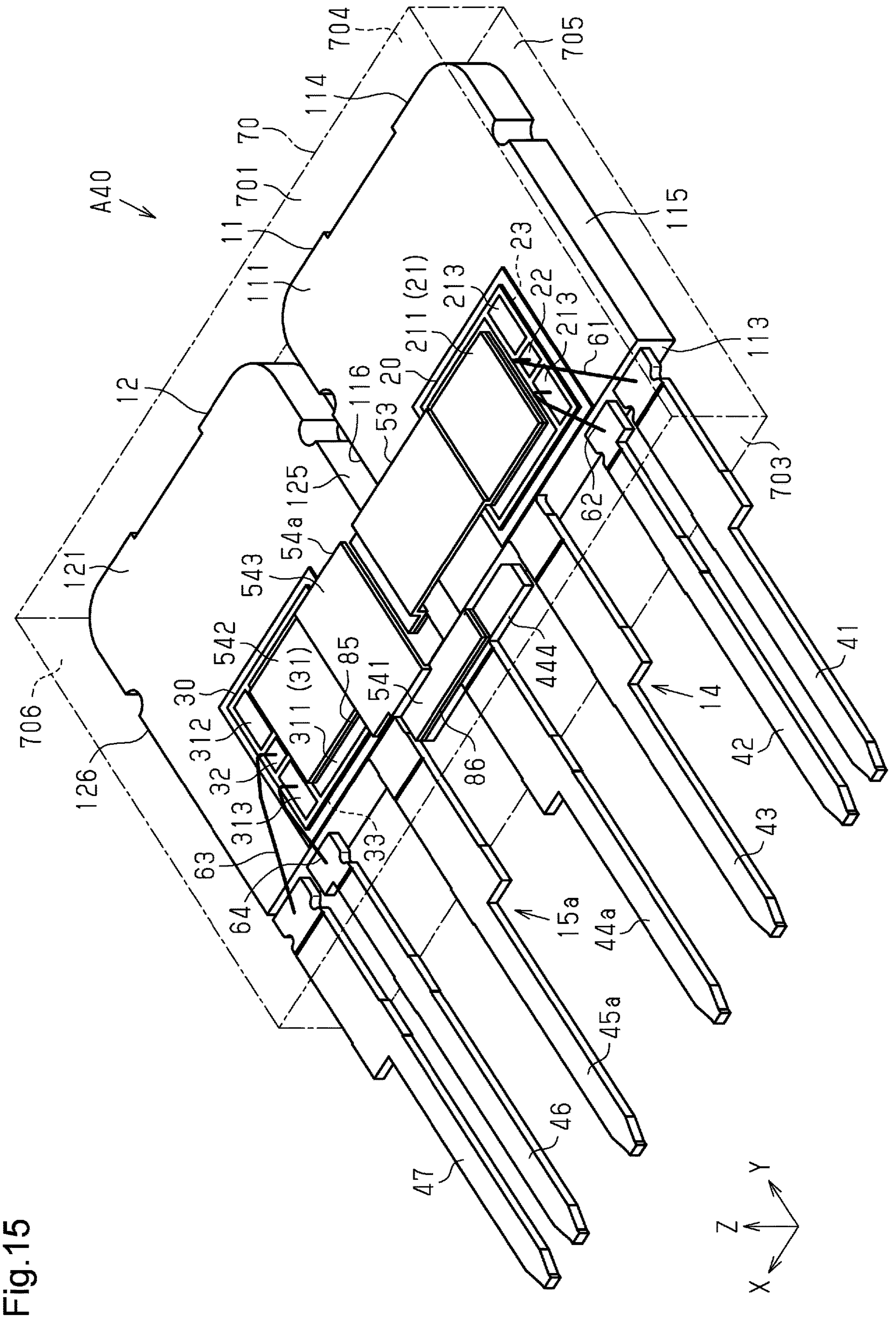
FIG. 15 is a perspective view of a semiconductor device in accordance with a fourth embodiment.
Figure 16:
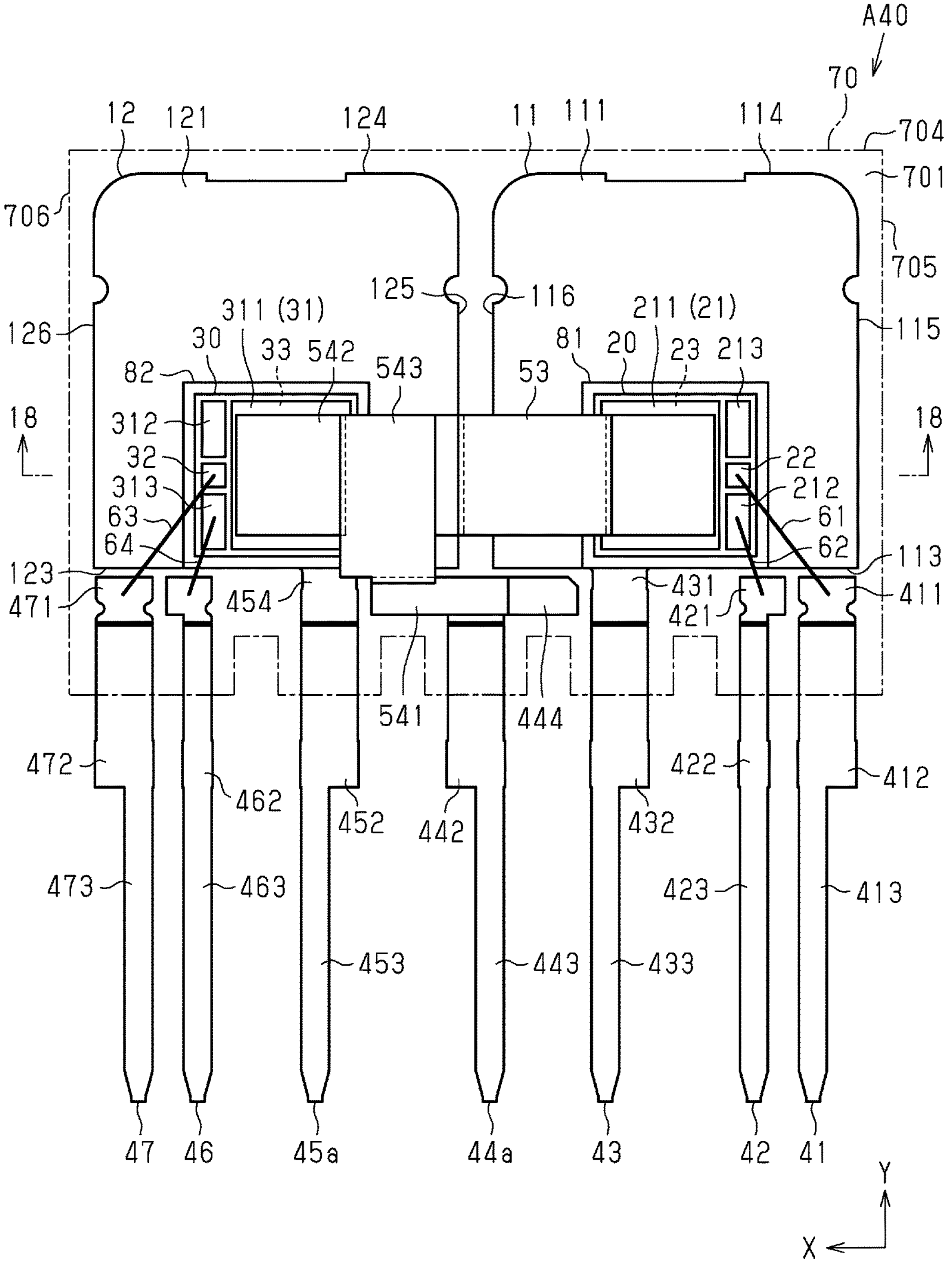
FIG. 16 is a plan view of the semiconductor device in accordance with the fourth embodiment.
Figure 17:
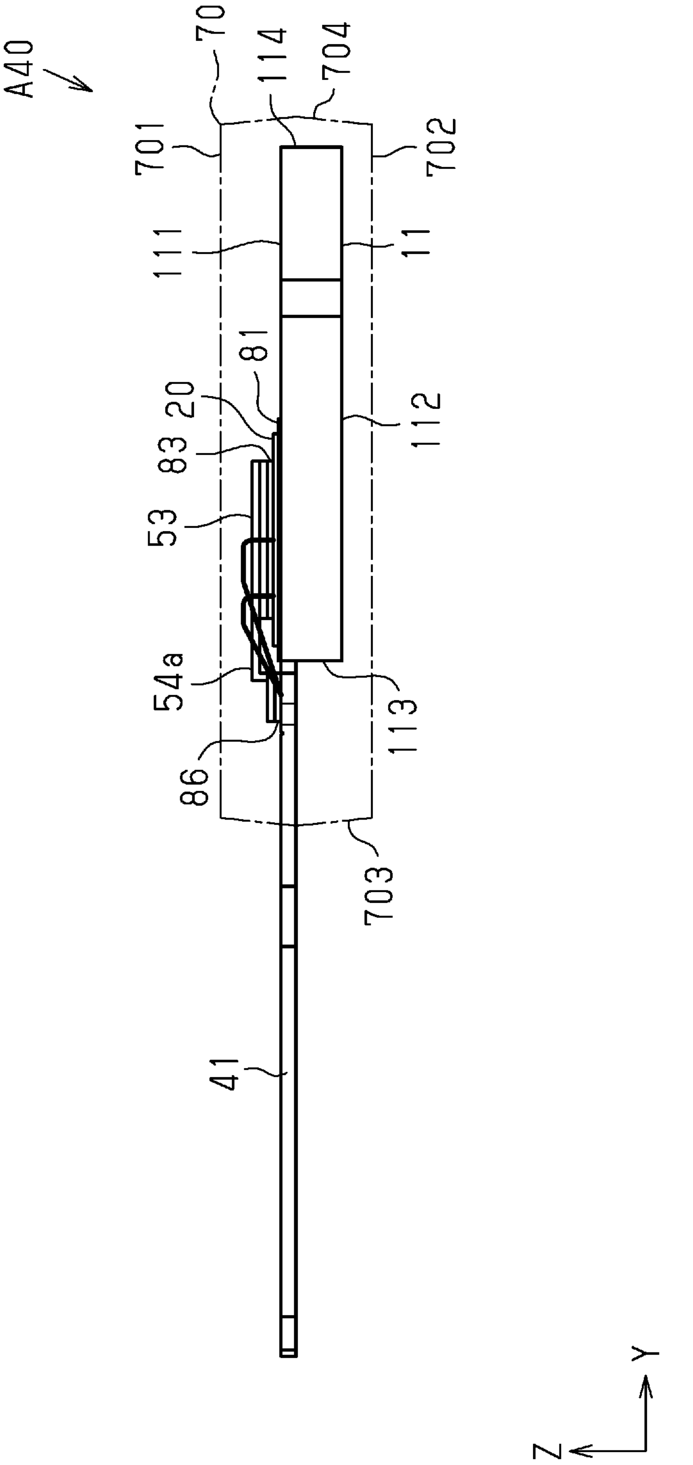
FIG. 17 is a side view of the semiconductor device in accordance with the fourth embodiment.

As shown in FIGS. 15 and 16, the semiconductor device A40 in accordance with the present embodiment includes the leads 41, 42, 43, 44*a*, 45*a*, 46, and 47 that project out of the first resin side surface 703 of the encapsulation resin 70.

Fourth Lead

The fourth lead 44*a* includes a pad portion 444, the base portion 442, and the substrate connection portion 443. The pad portion 444 is spaced apart from the second die pad 12 and located toward the first resin side surface 703 of the encapsulation resin 70 in lengthwise direction Y. The pad portion 444 extends along the first side surface 123 of the second die pad 12. The pad portion 444 is connected by the second clip 54*a*, serving as the second connecting member, to the second main surface electrode 31 (main source electrode 311) of the second switching element 30. The fourth lead 44*a* is a second drive lead (source lead) connected to the second main surface electrode 31 (main source electrode 311) of the second switching element 30.

Figure 18:
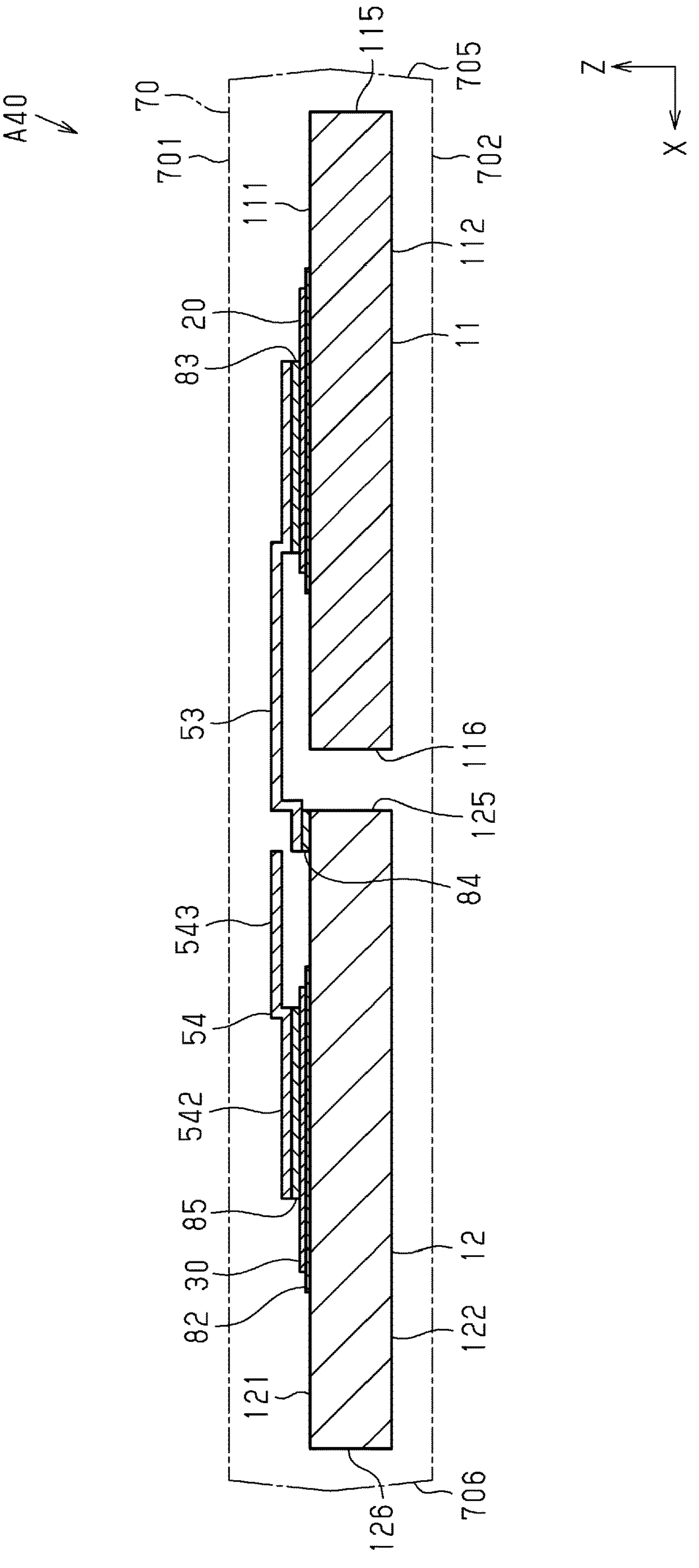
FIG. 18 is a cross-sectional view taken along line 18-18 in FIG. 16.

The second clip 54*a* is a conductive plate-like member. The second clip 54*a* is formed by bending a conductive plate. The second clip 54*a* includes a lead connection portion 541, an electrode connection portion 542, and a coupling portion 543. In the same manner as the pad portion 444 of the fourth lead 44*a*, the lead connection portion 541 extends in widthwise direction X and is connected by the solder 86 to the pad portion 444. The electrode connection portion 542, which is rectangular, is formed in correspondence with the second main surface electrode 31 (main source electrode 311) of the second switching element 30 and connected by the solder 85 to the second main surface electrode 31. The coupling portion 543 connects the lead connection portion 541 and the electrode connection portion 542. The coupling portion 543 extends from the lead connection portion 541 in lengthwise direction Y. Further, the coupling portion 543 is connected to the end of the electrode connection portion 542 that is located toward the first die pad 11. That is, the electrode connection portion 542 extends from the coupling portion 543 in widthwise direction X. As shown in FIG. 18, in the present embodiment, the second clip 54*a* is formed so that the coupling portion 543 is parallel to the main surface 121 of the second die pad 12 between the second switching element 30 and the third side surface 125 of the second die pad 12.

Fifth Lead

The fifth lead 45*a* includes the connection portion 454, the base portion 452, and the substrate connection portion 453. The connection portion 454 is connected to the second die pad 12. The second die pad 12 is connected to the second back surface electrode 33 (drain electrode) of the second switching element 30. Further, the second die pad 12 is connected to the first main surface electrode 21 (main source electrode 211) of the first switching element 20. That is, the fifth lead 45*a* is an output lead connected to the first main surface electrode 21 (main source electrode 211) of the first switching element 20 and the second back surface electrode 33 (drain electrode) of the second switching element 30. In the present embodiment, the fifth lead 45*a* is integrated with the second die pad 12. The fifth lead 45*a* and the second die pad 12 form the integrated second lead frame 15*a*.

Advantages

As described above, the present embodiment has the following advantages in addition to the advantages of the third embodiment.

(4-1) In the same manner as the second embodiment, the first drive lead 43 (third lead), the second drive lead 44*a* (fourth lead), and the output lead 45*a* (fifth lead) are arranged in order in widthwise direction X. The first current I1, which flows from the first drive lead 43 toward the output lead 45*a* (refer to FIG. 9), and the second current I2, which flows from the output lead 45*a* to the second drive lead 44*a* (refer to FIG. 9), reduces inductance in the semiconductor device A40.

(4-2) The second clip 54*a*, which connects the second switching element 30 and the second drive lead 44*a*, includes the lead connection portion 541 connected to the fourth lead 44*a*, the electrode connection portion 542 connected to the second switching element 30, and the coupling portion 543 connecting the lead connection portion 541 and the electrode connection portion 542. The coupling portion 543 is arranged parallel to the second die pad 12. This increases the portion where the first drive lead 43 (third lead) and the output lead 45*a* (fifth lead) are adjacent to each other and the portion where the output lead 45*a* and the second drive lead 44*a* (fourth lead) are adjacent to each other. Thus, inductance is further reduced.

Fifth Embodiment

Figure 19:
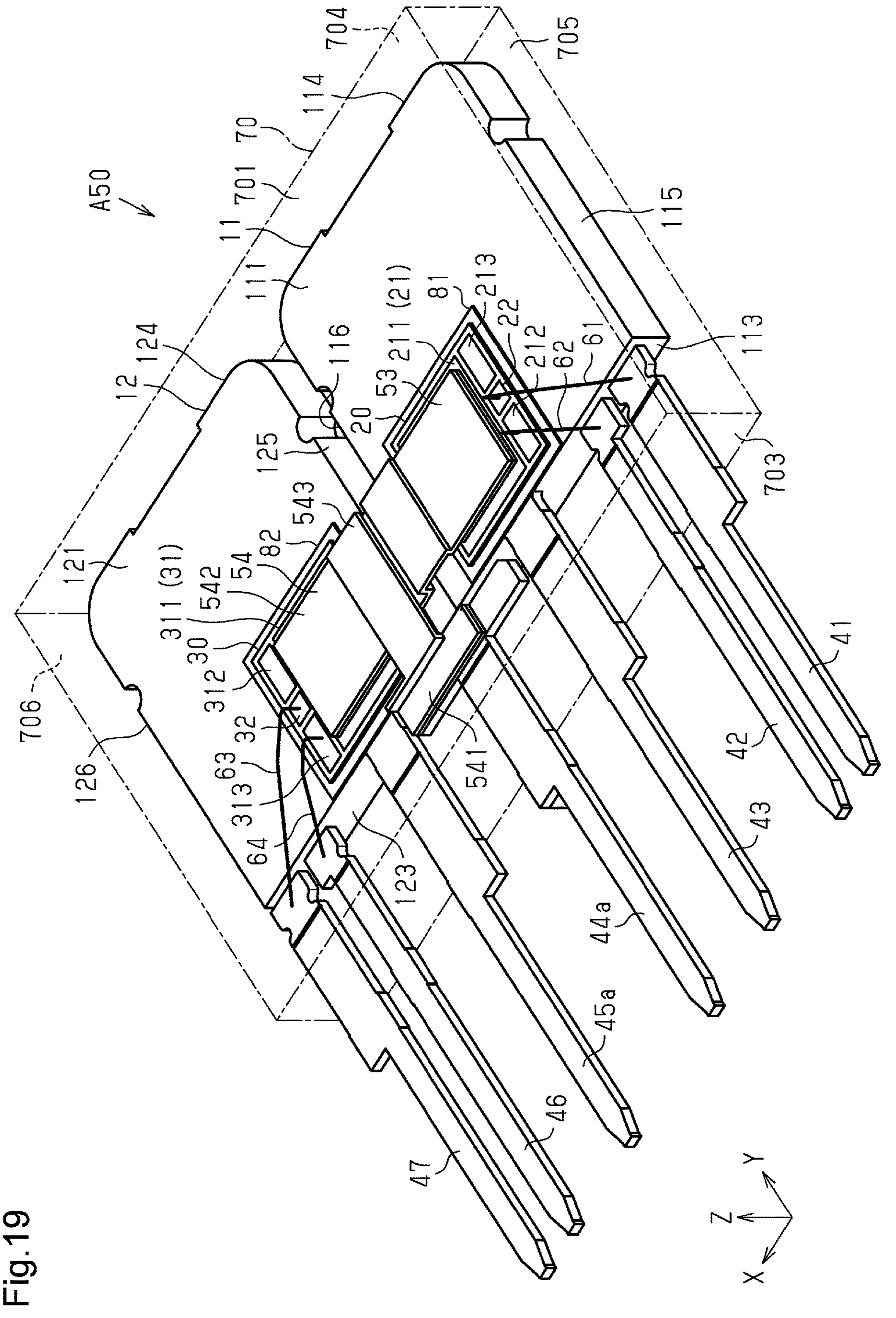
FIG. 19 is a perspective view of a semiconductor device in accordance with a fifth embodiment.
Figure 20:
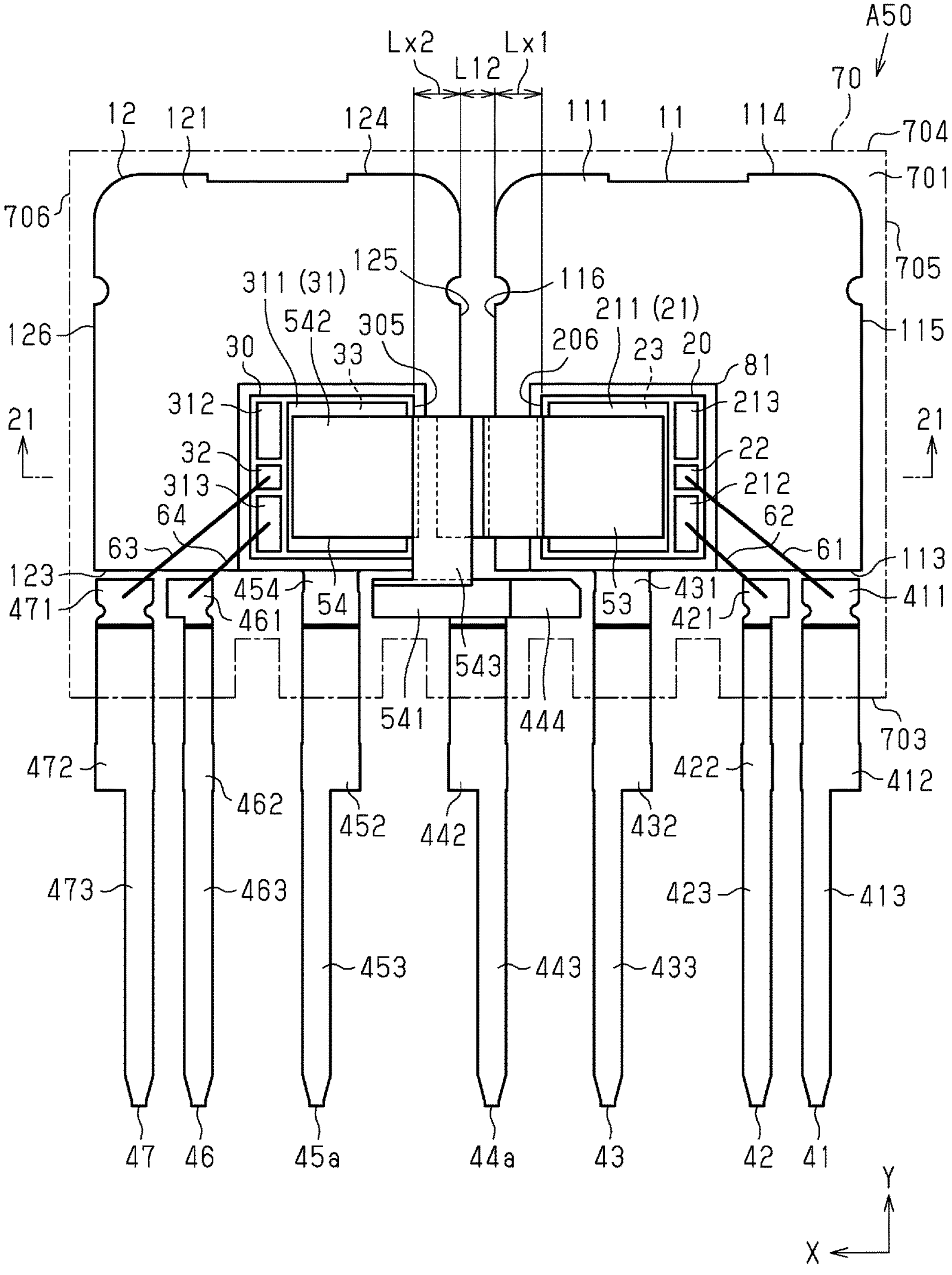
FIG. 20 is a plan view of the semiconductor device in accordance with the fifth embodiment.
Figure 21:
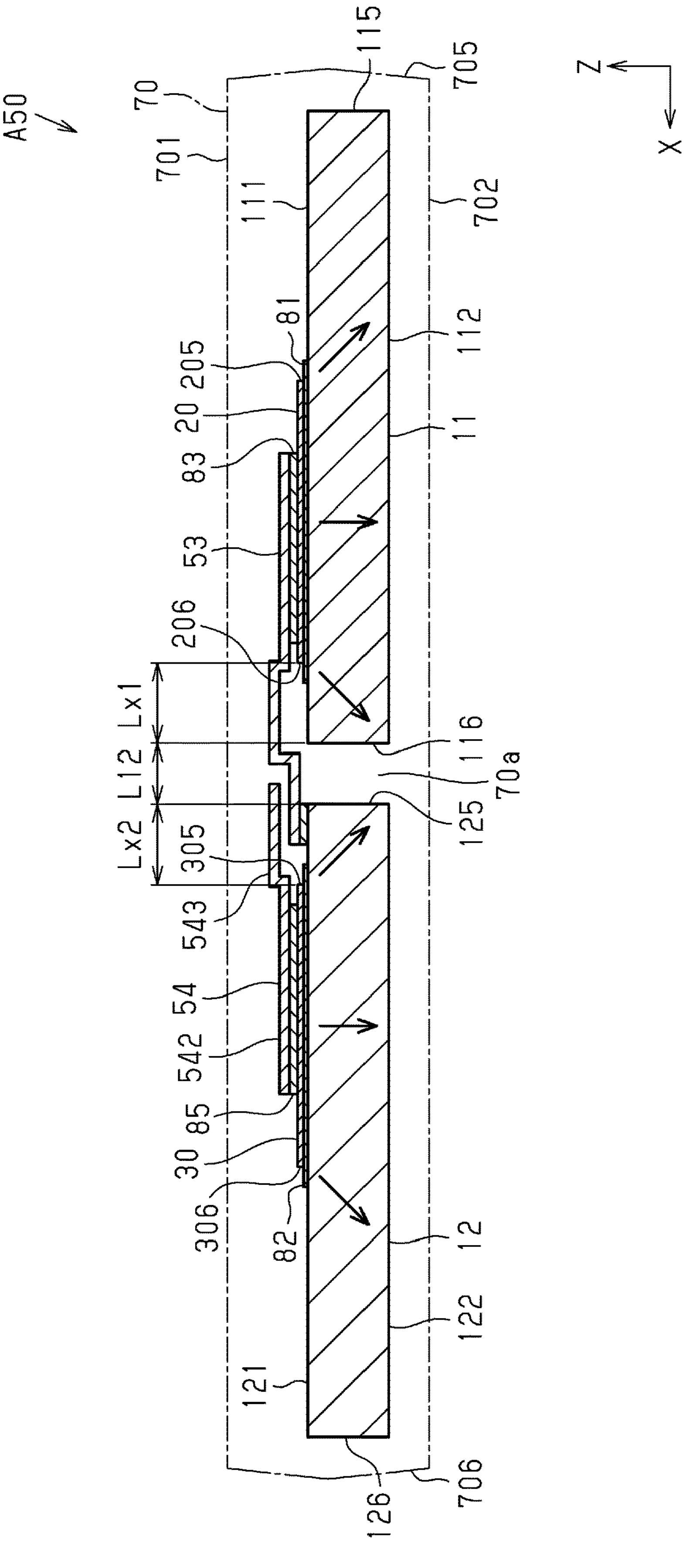
FIG. 21 is a cross-sectional view taken along line 21-21 in FIG. 20.

With reference to FIGS. 19 to 21, the semiconductor device A50 in accordance with the fifth embodiment will now be described.

The semiconductor device A50 in accordance with the fifth embodiment differs from the semiconductor device A40 in accordance with the fourth embodiment in the position of the switching elements. In the description hereafter, same references numerals are given to those components that are the same as the corresponding components of the semiconductor device A40 in accordance with the fourth embodiment. Such components will not be described in detail.

As shown in FIGS. 19 and 20, in the semiconductor device A50 in accordance with the present embodiment, the first switching element 20 and the second switching element 30 are located toward the central part of the encapsulation resin 70. The arrangement of the first switching element 20 and the second switching element 30 will now be described in detail.

As shown in FIG. 20, the first switching element 20 is located toward the first side surface 113 in lengthwise direction Y on the main surface 111 of the first die pad 11. As shown in FIGS. 20 and 21, the first switching element 20 is located toward the fourth side surface 116 in widthwise direction X on the first die pad 11. The fourth side surface 116 faces the third side surface 125 of the second die pad 12. That is, the first switching element 20 is located toward the second die pad 12 on the first die pad 11. This allows the first clip 53, which connects the first switching element 20 and the second die pad 12, to be shortened in length. In the present embodiment, the distance (first distance) Lx1 from the fourth side surface 116 of the first die pad 11 to the fourth element side surface 206 of the first switching element 20 as viewed in thickness direction Z is greater than or equal to the thickness of the first die pad 11.

As shown in FIG. 20, the second switching element 30 is located toward the first side surface 123 in lengthwise direction Y on the main surface 121 of the second die pad 12. As shown in FIGS. 20 and 21, the second switching element 30 is located toward the third side surface 125 in widthwise direction X on the second die pad 12. That is, the second switching element 30 is located toward the first die pad 11 on the second die pad 12. This allows the electric path from the first switching element 20 to the second switching element 30 to be shortened in distance. In the present embodiment, the distance (second distance) Lx2 from the third side surface 125 of the second die pad 12 to the third element side surface 305 of the second switching element 30 as viewed in thickness direction Z is greater than or equal to the second die pad 12.

Operation

The operation of the semiconductor device A50 in accordance with the fifth embodiment will now be described.

The first switching element 20 is located toward the fourth side surface 116 in widthwise direction X on the first die pad 11. The second switching element 30 is located toward the third side surface 125 in widthwise direction X on the second die pad 12. This allows the electric path from the first switching element 20 to the second switching element 30 to be shortened in distance and decreases parasitic capacitance in the electric path between elements.

As shown in FIG. 21, the heat generated when the first switching element 20 functions is transmitted from the first switching element 20 to the first die pad 11. In the first die pad 11, as shown by the arrows in FIG. 21, heat spreads when transmitted from the main surface 111 of the first die pad 11 toward the back surface 112. The heat is then transmitted from each surface of the first die pad 11 to the encapsulation resin 70. In the same manner, the heat generated when the second switching element 30 functions is transmitted from the second switching element 30 to the second die pad 12 and spread when transmitted from the main surface 121 of the second die pad 12 toward the back surface 122. The heat is then transmitted from each surface of the second die pad 12 to the encapsulation resin 70.

As the first switching element 20 becomes closer to the fourth side surface 116 of the first die pad 11, more heat will be transmitted from the fourth side surface 116 to the encapsulation resin 70. In the same manner, as the second switching element 30 becomes closer to the third side surface 125 of the second die pad 12, more heat will be transmitted from the third side surface 125 to the encapsulation resin 70. This will raise the temperature at a resin portion 70*a* of the encapsulation resin 70 between the fourth side surface 116 and the third side surface 125. Consequently, the efficiency for transmitting heat from the fourth side surface 116 to the resin portion 70*a* will decrease, and the efficiency for transmitting heat from the third side surface 125 to the resin portion 70*a* will decrease. Thus, the heat dissipation efficiency will decrease in the first switching element 20 and the second switching element 30.

However, as described above, in the semiconductor device A50 in accordance with the present embodiment, the distance Lx1 from the fourth side surface 116 of the first die pad 11 to the fourth element side surface 206 of the first switching element 20 is greater than or equal to the thickness of the first die pad 11. Further, the distance Lx2 from the third side surface 125 of the second die pad 12 to the third element side surface 305 of the second switching element 30 is greater than or equal to the thickness of the second die pad 12. This limits decreases in the heat dissipation efficiency of the first switching element 20 and the second switching element 30.

Decreases in the heat dissipation can also be limited by increasing the distance L12 between the first die pad 11 and the second die pad 12, that is, separating the first die pad 11 and the second die pad 12 from each other. However, separation of the first die pad 11 and the second die pad 12 will enlarge the encapsulation resin 70, that is, enlarge the outer dimensions of the semiconductor device. In contrast, when setting the positions of the first switching element 20 and the second switching element 30 as described above, decreases in the heat dissipation efficiency will be limited while avoiding enlargement of the semiconductor device A50.

Advantages

As described above, the present embodiment has the following advantages in addition to the advantages of the fourth embodiment.

(5-1) The first switching element 20 is located toward the second die pad 12 on the first die pad 11, and the second switching element 30 is located toward the first die pad 11 on the second die pad 12. This allows the electric path from the first switching element 20 to the second switching element 30 to be shortened in distance and decreases parasitic capacitance in the electric path between elements.

(5-2) The distance Lx1 from the fourth side surface 116 of the first die pad 11 to the fourth element side surface 206 of the first switching element 20 is greater than or equal to the thickness of the first die pad 11. This limits decreases in the heat dissipation of the first die pad 11 with respect to the first switching element 20.

(5-3) The distance Lx2 from the third side surface 125 of the second die pad 12 to the third element side surface 305 of the second switching element 30 is greater than or equal to the thickness of the second die pad 12. This limits decreases in the heat dissipation of the second die pad 12 with respect to the second switching element 30.

Modified Examples

The above embodiments and modified examples may be modified as described below. The embodiments and modified examples described above may be combined with the modified examples described below as long as there is no technical contradiction.

Figure 22:
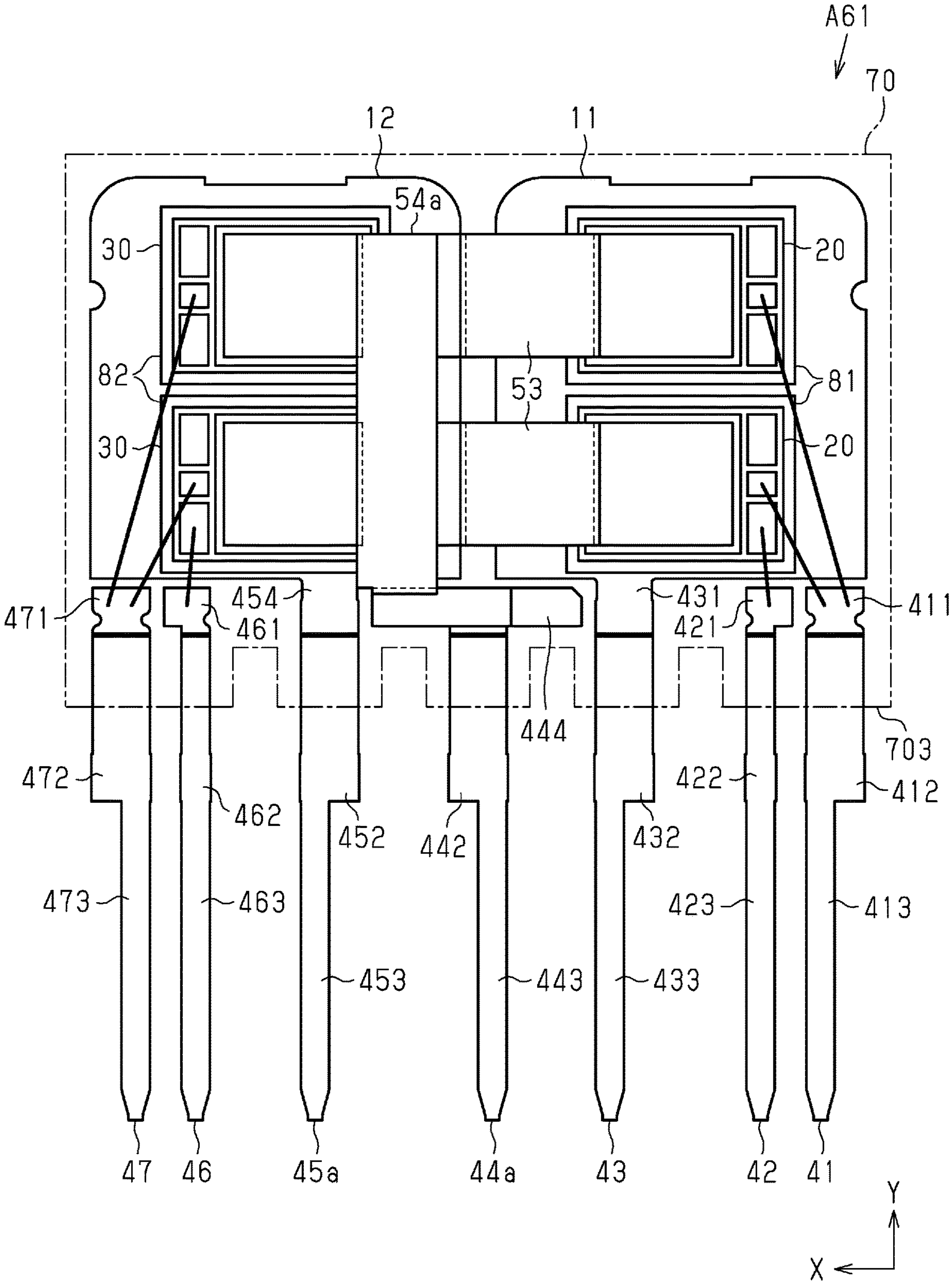
FIG. 22 is a plan view showing a semiconductor device in accordance with a modified example.

As shown in FIG. 22, a semiconductor device A61 includes two first switching elements 20, mounted on the first die pad 11 and connected in parallel to each other, and two second switching elements 30, mounted on the second die pad 12 and connected in parallel to each other. In this manner, when the semiconductor device A61 includes two first switching elements 20 and two second switching elements 30, the amount of current flowing through the semiconductor device A61 increases. Three or more first switching elements 20 may be mounted on the first die pad 11, and three or more second switching elements 30 may be mounted on the second die pad 12. The number of mounted switching elements is determined in accordance with the amount of current that flows through the semiconductor device A61.

The shape of each member forming the semiconductor device can be changed.

FIGS. 23 to 26 show examples in which the shape of the leads and second connecting member are changed.

Figure 23:
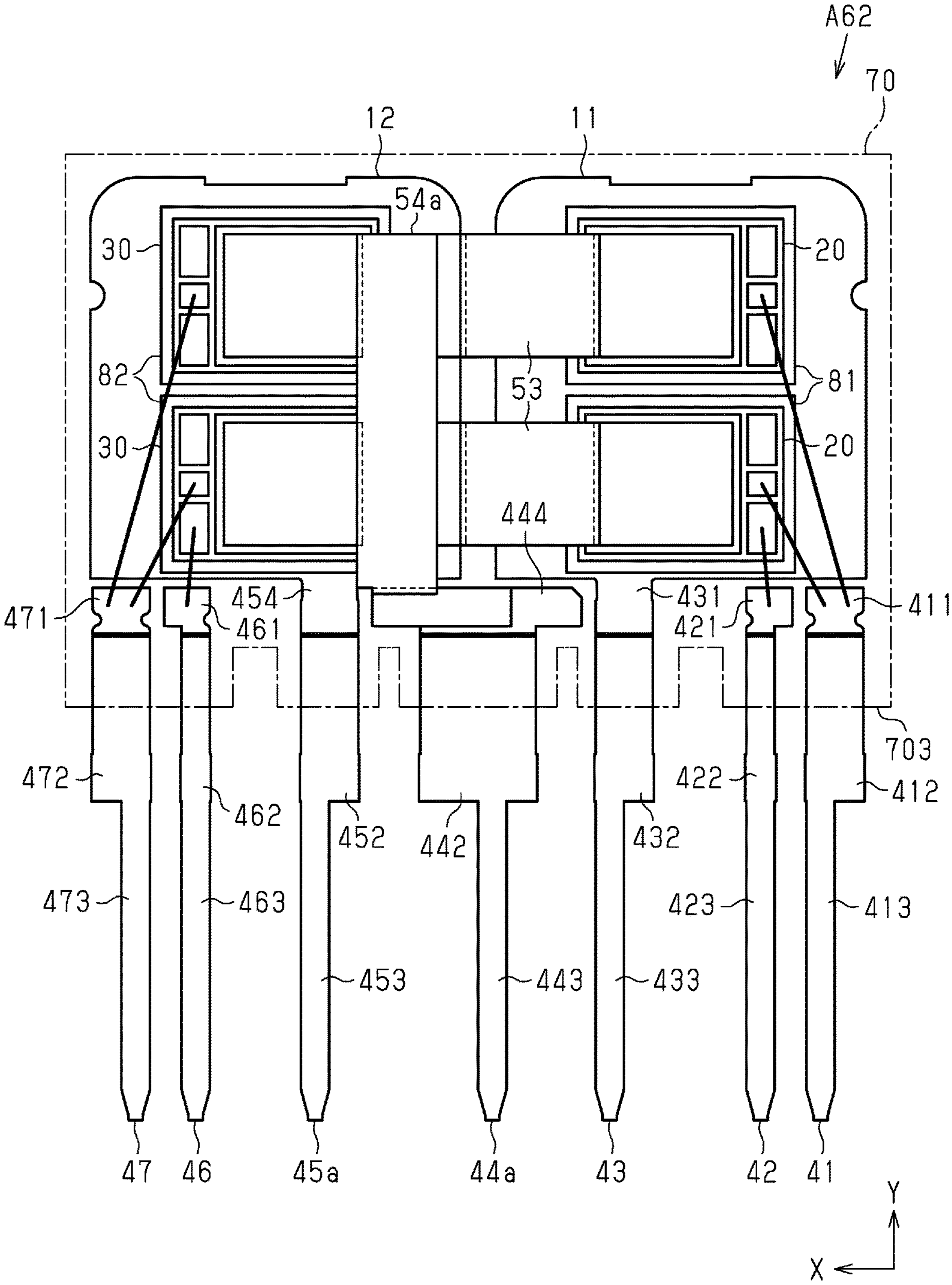
FIG. 23 is a plan view showing a semiconductor device in accordance with a modified example.

For example, as shown in FIG. 23, in a semiconductor device A62, the base portion 442 of the fourth lead 44*a* (output lead) may be wider than the base portion 432 of the third lead 43 or the base portion 452 of the fifth lead 45*a*.

Figure 24:
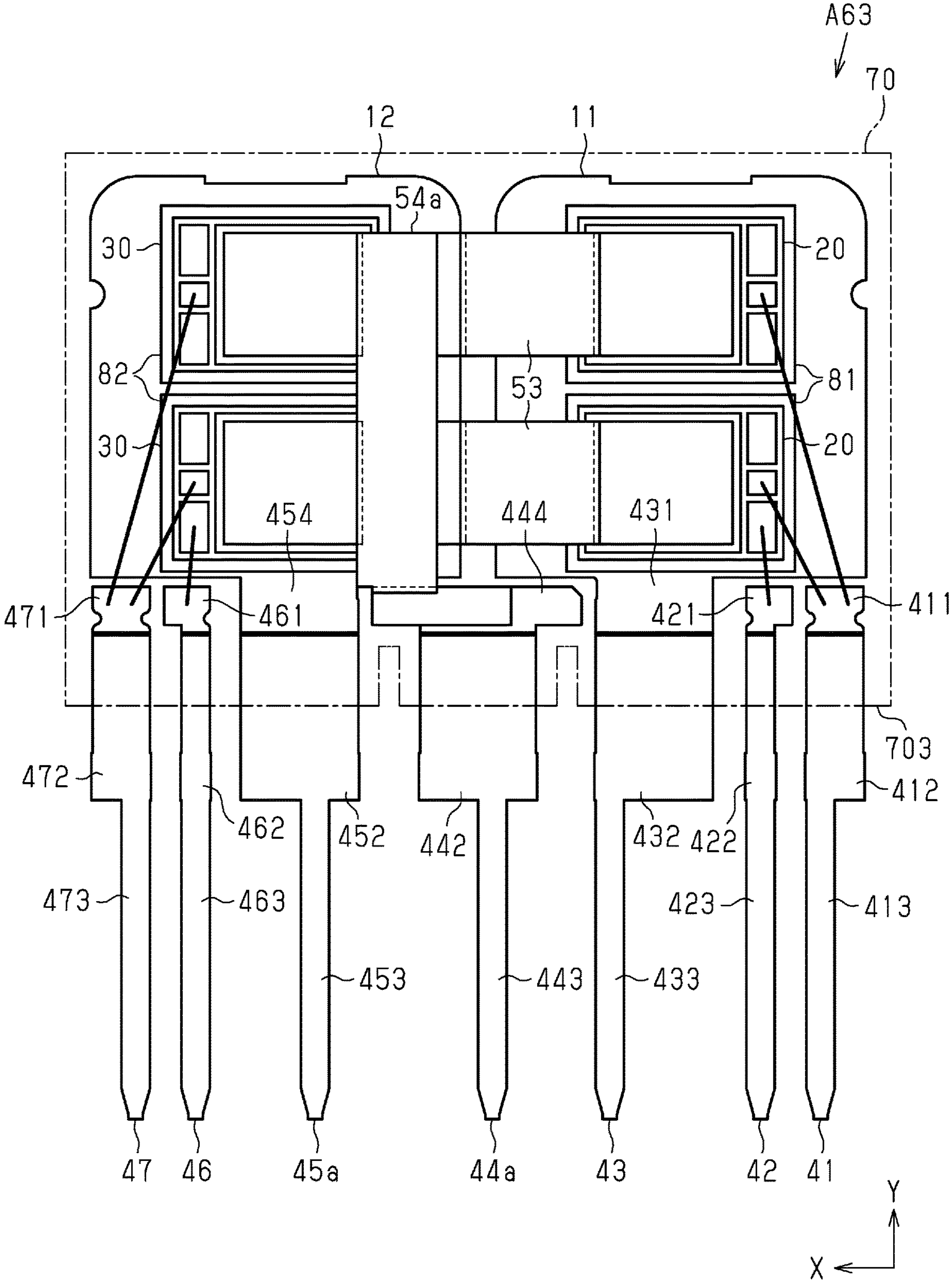
FIG. 24 is a plan view showing a semiconductor device in accordance with a modified example.

As shown in FIG. 24, in a semiconductor device A63, the base portions 432, 442, and 452 may be wider than the base portion 412 of the first lead 41 or the base portion 472 of the seventh lead 47.

Figure 25:
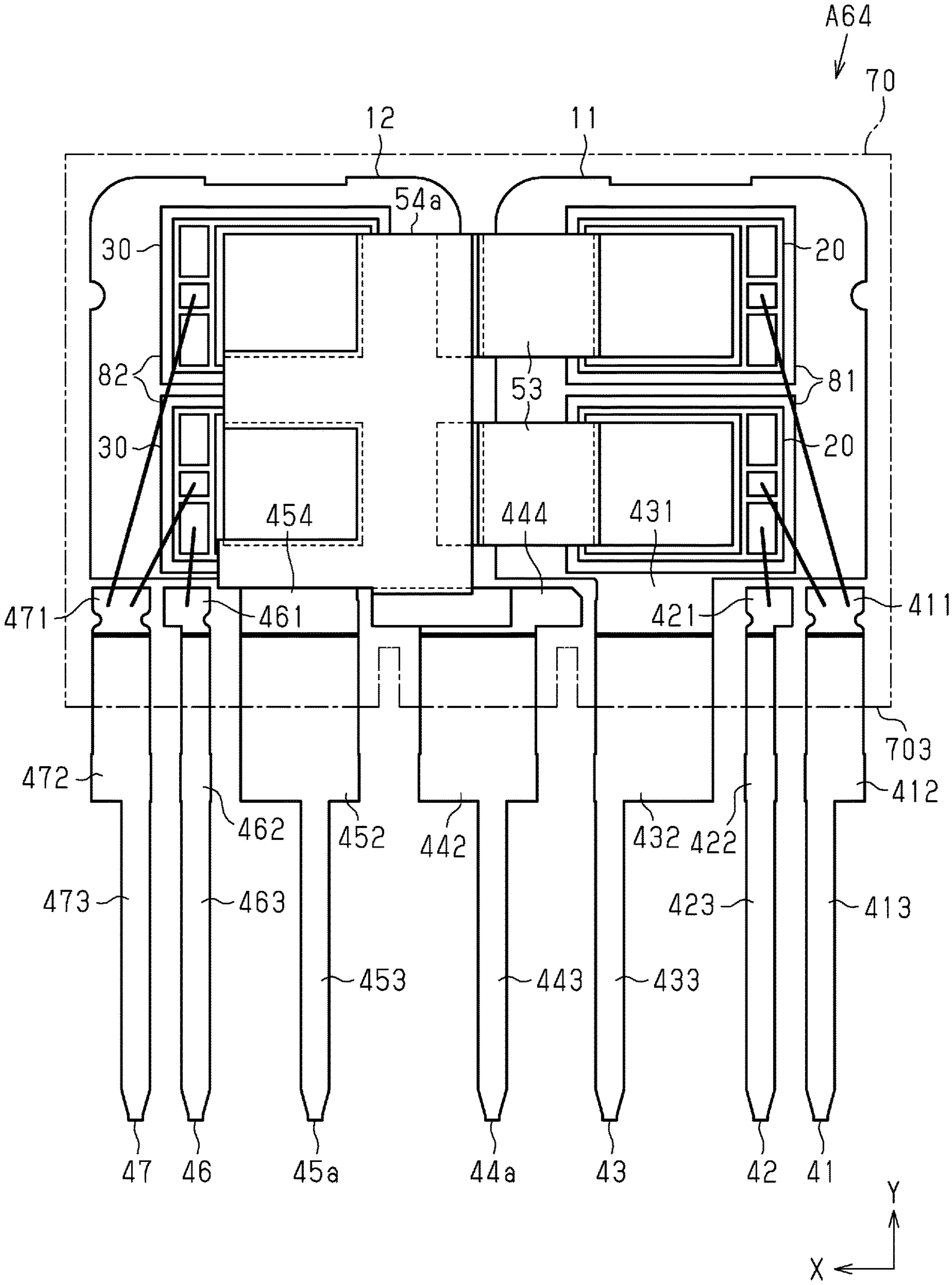
FIG. 25 is a plan view showing a semiconductor device in accordance with a modified example.

As shown in FIG. 25, in a semiconductor device A64, the second clip 54*a* (second connecting member) may be widened.

Figure 26:
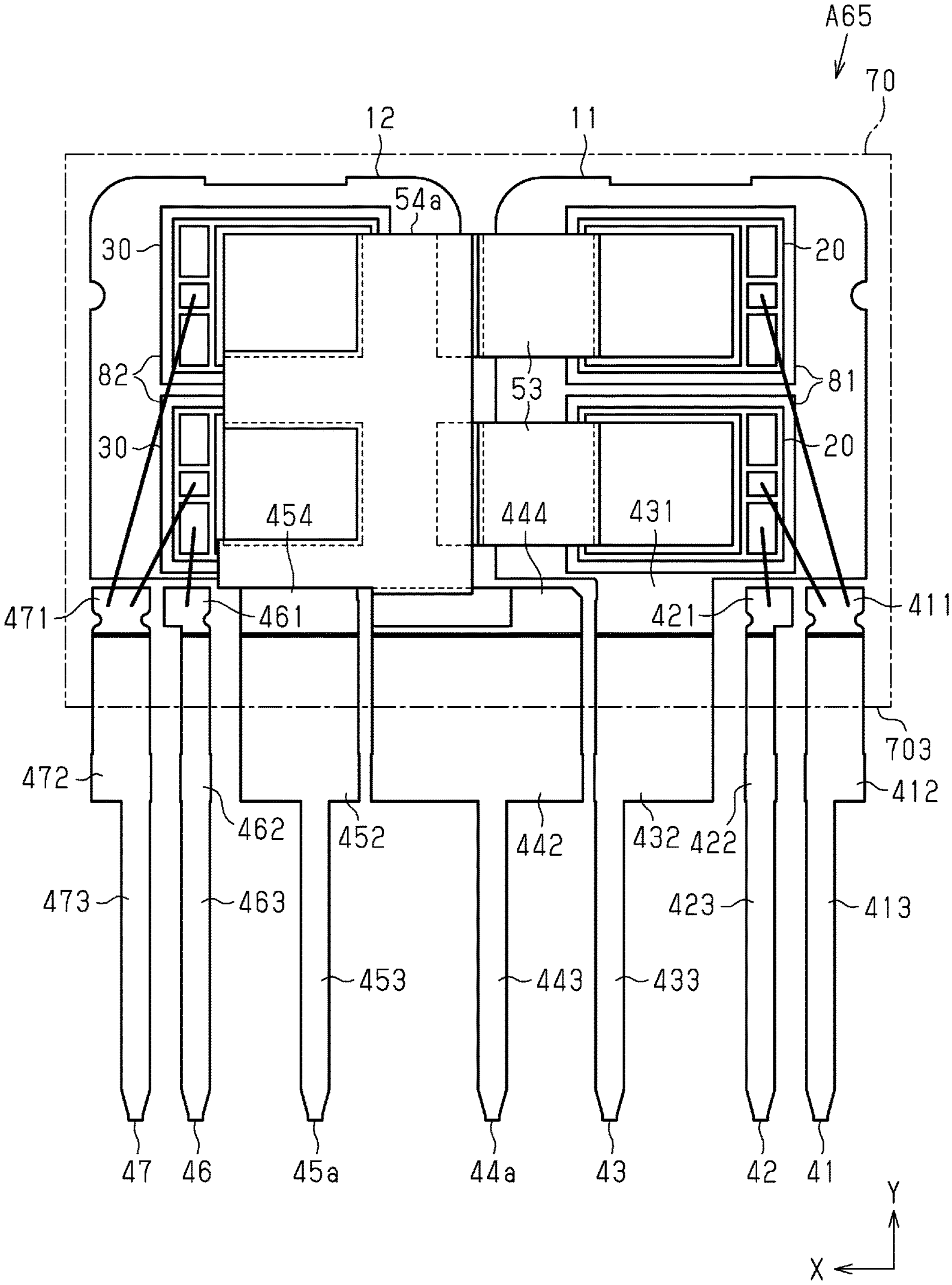
FIG. 26 is a plan view showing a semiconductor device in accordance with a modified example.

As shown in FIG. 26, in a semiconductor device A65, the first switching element 20 and the second switching element 30 may be, for example, Si elements so that the base portion 442 of the fourth lead 44*a* becomes further closer to the base portion 432 of the third lead 43 and the base portion 452 of the fifth lead 45*a* to reduce inductance.

Sixth Embodiment

With reference to FIGS. 27 to 31, a semiconductor device A70 will now be described.

Figure 27:
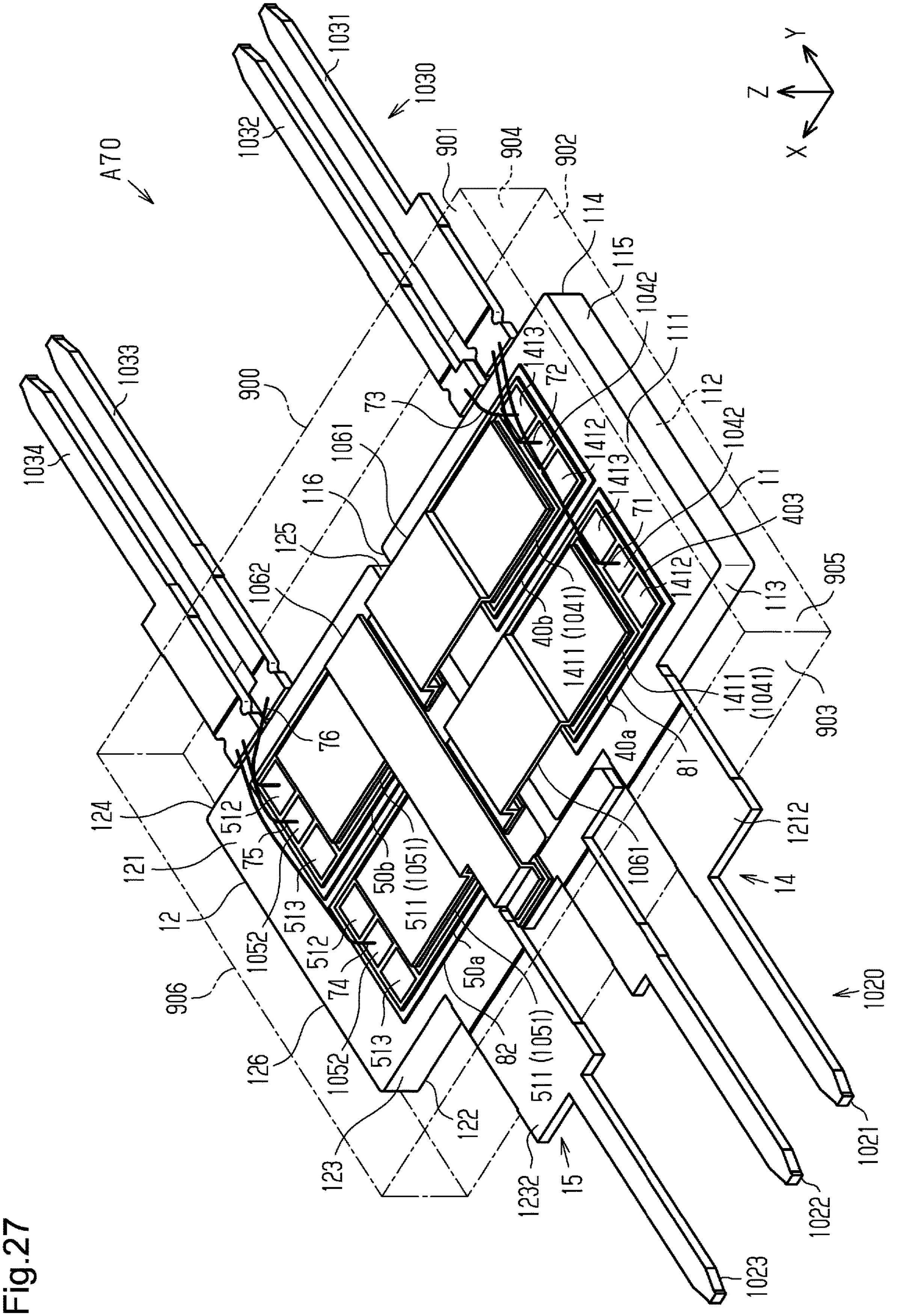
FIG. 27 is a perspective view of a semiconductor device in accordance with a sixth embodiment.
Figure 28:
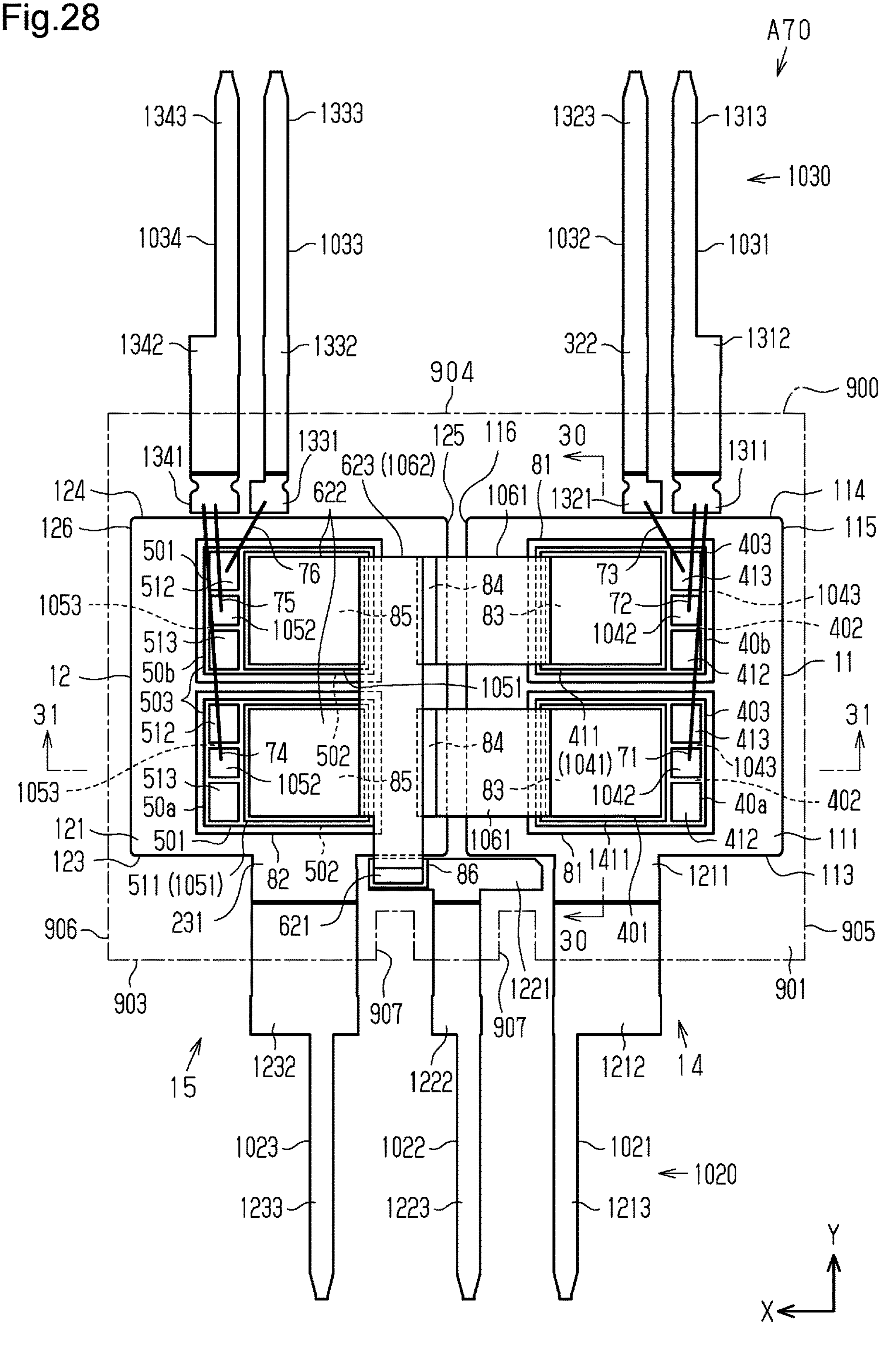
FIG. 28 is a plan view of the semiconductor device in accordance with the sixth embodiment.

As shown in FIGS. 27 and 28, the semiconductor device A70 includes the first die pad 11, the second die pad 12, a first lead group 1020 (leads 1021 to 1023), a second lead group 1030 (leads 1031 to 1034), first switching elements 40*a* and 40*b*, second switching elements 50*a* and 50*b*, first connecting members 1061, a second connecting member 1062, wires 71 to 76, and an encapsulation resin 900.

Encapsulation Resin

The encapsulation resin 900 encapsulates the first die pad 11, the second die pad 12, the first switching elements 40*a* and 40*b*, the second switching elements 50*a* and 50*b*, the first connecting members 1061, the second connecting member 1062, and the wires 71 to 76. Further, the encapsulation resin 900 partially covers the first lead group 1020 (leads 1021 to 1023) and the second lead group 1030 (leads 1031 to 1034).

The encapsulation resin 900 is box-shaped and has a low profile. In this specification, box-shaped includes boxes having chamfered corners and edges and boxes having rounded corners and edges. Further, faces of such boxes may include ridges and valleys. Faces of such boxes may also include curved surfaces formed from a plurality of surfaces.

The encapsulation resin 900 is formed from a synthetic resin that is electrically insulative. In one example, the encapsulation resin 900 is epoxy resin. The synthetic resin forming the encapsulation resin 900 is, for example, colored black. In FIGS. 27 and 28, the encapsulation resin 900 is shown in dashed lines and members in the encapsulation resin 900 are shown in solid lines. In the description hereafter, the thickness direction of the encapsulation resin 900 will be referred to as thickness direction Z, one direction orthogonal to the thickness direction Z will be referred to as widthwise direction X, and the direction orthogonal to thickness direction Z and widthwise direction X will be referred to as lengthwise direction Y. Widthwise direction X corresponds to a first direction, and lengthwise direction Y corresponds to a second direction.

The encapsulation resin 900 includes a resin main surface 901, a resin back surface 902, and first to fourth resin side surfaces 903 to 906. The resin main surface 901 and the resin back surface 902 face opposite directions in thickness direction Z. The first to fourth resin side surfaces 903 to 906 face one direction parallel to the resin main surface 901 and the resin back surface 902. The first resin side surface 903 and the second resin side surface 904 face opposite directions in lengthwise direction Y. The third resin side surface 905 and the fourth resin side surface 906 face opposite directions in widthwise direction X.

FIG. 28 is a view of the semiconductor device A70 taken from the side of the resin main surface 901 of the encapsulation resin 900. As shown in FIG. 28, the encapsulation resin 900 is shaped so that widthwise direction X is the long-side direction and lengthwise direction Y is the short-side direction in a view of the semiconductor device A70 taken from thickness direction Z. The first resin side surface 903 and the second resin side surface 904 are the side surfaces extending in widthwise direction X, and the third resin side surface 905 and the fourth resin side surface 906 are the side surfaces extending in lengthwise direction Y.

First Die Pad, Second Die Pad

The first die pad 11 and the second die pad 12 each have the form of a rectangular plate. The first die pad 11 and the second die pad 12 are each formed from, for example, copper (Cu). In the present embodiment, the phrase formed from Cu intends to mean formed from Cu or an alloy including Cu. Further, formed from Cu also includes a case when a surface is partially or entirely coated with a plating layer.

The first die pad 11 includes a main surface 111, a back surface 112, and the first to fourth side surfaces 113 to 116. The main surface 111 and the back surface 112 face opposite directions in thickness direction Z. The main surface 111 of the first die pad 11 faces the same direction as the resin main surface 901 of the encapsulation resin 900. The first to fourth side surfaces 113 to 116 face widthwise direction X or lengthwise direction Y. In the present embodiment, the first side surface 113 and the second side surface 114 face opposite directions in lengthwise direction Y, and the third side surface 115 and the fourth side surface 116 face opposite directions in widthwise direction X.

The second die pad 12 includes a main surface 121, a back surface 122, and first to fourth side surfaces 123 to 126. The main surface 121 and the back surface 122 face opposite directions in thickness direction Z. The main surface 121 of the second die pad 12 faces the same direction as the resin main surface 901 of the encapsulation resin 900. The first to fourth side surfaces 123 to 126 face widthwise direction X or lengthwise direction Y. In the present embodiment, the first side surface 123 and the second side surface 124 face opposite directions in lengthwise direction Y, and the third side surface 125 and the fourth side surface 126 face opposite directions in widthwise direction X.

The first die pad 11 and the second die pad 12 are arranged so that their main surfaces 111 and 121 are located at the same position in thickness direction Z. The first die pad 11 and the second die pad 12 have the same thickness. The thickness of the first die pad 11 and the second die pad 12 is 1 mm or greater and 3 mm or less. Preferably, the thickness of the first die pad 11 and the second die pad 12 is, for example, 2 mm or greater and 3 mm or less. The back surface 112 of the first die pad 11 and the back surface 122 of the second die pad 12 are located at the same position in thickness direction Z.

The first die pad 11 and the second die pad 12 are arranged in widthwise direction X. The fourth side surface 116 of the first die pad 11 and the third side surface 125 of the second die pad 12 face each other. Distance L12 between the first die pad 11 and the second die pad 12 is less than the thickness of the first die pad 11 and the second die pad 12, for example, 1 mm or greater and 3 mm or less. The first die pad 11 and the second die pad 12 are arranged so that their first side surfaces 113 and 123 are located at the same position in lengthwise direction Y.

Leads

As shown in FIGS. 27 and 28, the semiconductor device A70 includes the first lead group 1020 and the second lead group 1030. The first lead group 1020 includes a plurality of leads (three leads in the present embodiment), namely, the leads 1021 to 1023, that project out of the first resin side surface 903 of the encapsulation resin 900. The second lead group 1030 incudes a plurality of leads (four leads in the present embodiment), namely, the leads 1031 to 1034, that project out of the second resin side surface 904 of the encapsulation resin 900. The leads 1021 to 1023 of the first lead group 1020 are arranged in widthwise direction X and extend in lengthwise direction Y. The leads 1031 to 1034 of the second lead group 1030 are arranged in widthwise direction X and extend in lengthwise direction Y The leads 1021 to 1023 and 1031 to 1034 are formed from Cu.

First Lead Group

The first lead group 1020 includes a first drive lead 1021, a second drive lead 1022, and an output lead 1023.

As shown in FIG. 28, the first drive lead 1021 is arranged in the central part of the first die pad 11 in widthwise direction X. The first drive lead 1021 includes a connection portion 1211, a base portion 1212, and a substrate connection portion 1213. The connection portion 1211 is connected to the first side surface 113 of the first die pad 11. In the present embodiment, the first drive lead 1021 is integrated with the first die pad 11. The first drive lead 1021 and the first die pad 11 form an integrated first lead frame 14.

The base portion 1212 extends from the connection portion 1211 in lengthwise direction Y and projects out of the first resin side surface 903 of the encapsulation resin 900. The substrate connection portion 1213 extends from the distal end of the base portion 1212 in lengthwise direction Y. The substrate connection portion 1213 is inserted into a component hole of a mounting substrate and connected to conductive wiring of the mounting substrate by solder (neither shown). As shown in FIG. 28, the base portion 1212 has a greater width than the substrate connection portion 1213 in widthwise direction X. In widthwise direction X, the base portion 1212 projects further from the substrate connection portion 1213 in the direction extending from the fourth resin side surface 906 of the encapsulation resin 900 toward the third resin side surface 905.

As shown in FIG. 28 the second drive lead 1022 is arranged in the central part of the encapsulation resin 900 in widthwise direction X. The second drive lead 1022 includes a pad portion 1221, a base portion 1222, and a substrate connection portion 1223. The pad portion 1221 is spaced apart from the second die pad 12 and located toward the first resin side surface 903 of the encapsulation resin 900 in lengthwise direction Y. The pad portion 1221 extends along the first side surface 113 of the first die pad 11 and the first side surface 123 of the second die pad 12. Thus, the pad portion 1221 extends from the first side surface 113 of the first die pad 11 to the first side surface 123 of the second die pad 12. The pad portion 1221 is connected to the second connecting member 1062.

The base portion 1222 extends from the pad portion 1221 in lengthwise direction Y and projects out of the first resin side surface 903 of the encapsulation resin 900. The substrate connection portion 1223 extends from the distal end of the base portion 1222 in lengthwise direction Y. As shown in FIG. 28, the base portion 1222 has a greater width than the substrate connection portion 1223 in widthwise direction X. In widthwise direction X, the base portion 1222 projects further from the substrate connection portion 1223 in the direction extending from the third resin side surface 905 of the encapsulation resin 900 toward the fourth resin side surface 906.

As shown in FIG. 28 the output lead 1023 is arranged in the central part of the second die pad 12 in widthwise direction X. The output lead 1023 includes a connection portion 1231, a base portion 1232, and a substrate connection portion 1233. The connection portion 1231 is connected to the first side surface 123 of the second die pad 12. In the present embodiment, the output lead 1023 is integrated with the second die pad 12. The output lead 1023 and the second die pad 12 form an integrated second lead frame 15. The base portion 1232 extends from the connection portion 1231 in lengthwise direction Y and projects out of the first resin side surface 903 of the encapsulation resin 900. The substrate connection portion 1233 extends from the distal end of the base portion 1232 in lengthwise direction Y. As shown in FIG. 28, the base portion 1232 has a greater width than the substrate connection portion 1233 in widthwise direction X. In widthwise direction X, the base portion 1232 projects further from the substrate connection portion 1233 in the direction extending from the third resin side surface 905 of the encapsulation resin 900 toward the fourth resin side surface 906.

Second Lead Group

The second lead group 1030 includes a first control lead 1031, the first source lead 1032, the second source lead 1033, and a second control lead 1034.

As shown in FIG. 28 the first control lead 1031 includes a pad portion 1311, a base portion 1312, and a substrate connection portion 1313. The pad portion 1311 is spaced apart from the first die pad 11 and located toward the second resin side surface 904 of the encapsulation resin 900 in lengthwise direction Y The pad portion 1311 is a wire bonding portion to which wires 71 and 72 are connected. The base portion 1312 extends from the pad portion 1311 in lengthwise direction Y and projects out of the second resin side surface 904 of the encapsulation resin 900. The substrate connection portion 1313 extends from the distal end of the base portion 1312 in lengthwise direction Y. As shown in FIG. 28, the base portion 1312 has a greater width than the substrate connection portion 1313 in widthwise direction X. In widthwise direction X, the base portion 1312 projects further from the substrate connection portion 1313 in the direction extending from the fourth resin side surface 906 toward the third resin side surface 905.

As shown in FIG. 28 the first source lead 1032 includes a pad portion 1321, a base portion 1322, and a substrate connection portion 1323. The pad portion 1321 is spaced apart from the first die pad 11 and located toward the second resin side surface 904 of the encapsulation resin 900 in lengthwise direction Y. The pad portion 1321 is a wire bonding portion to which a wire 73 is connected. The base portion 1322 extends from the pad portion 1321 in lengthwise direction Y and projects out of the second resin side surface 904 of the encapsulation resin 900. The substrate connection portion 1323 extends from the distal end of the base portion 1322 in lengthwise direction Y.

As shown in FIG. 28, the second source lead 1033 includes a pad portion 1331, a base portion 1332, and a substrate connection portion 1333. The pad portion 1331 is spaced apart from the second die pad 12 and located toward the second resin side surface 904 of the encapsulation resin 900 in lengthwise direction Y. The pad portion 1331 is a wire bonding portion to which a wire 76 is connected. The base portion 1332 extends from the pad portion 1331 in lengthwise direction Y and projects out of the second resin side surface 904 of the encapsulation resin 900. The substrate connection portion 1333 extends from the distal end of the base portion 1332 in lengthwise direction Y.

As shown in FIG. 28, the second control lead 1034 includes a pad portion 1341, a base portion 1342, and a substrate connection portion 1343. The pad portion 1341 is spaced apart from the second die pad 12 and located toward the second resin side surface 904 of the encapsulation resin 900 in lengthwise direction Y. The pad portion 1341 is a wire bonding portion to which wires 74 and 75 are connected. The base portion 1342 extends from the pad portion 1341 in lengthwise direction Y and projects out of the second resin side surface 904 of the encapsulation resin 900. The substrate connection portion 1343 extends from the distal end of the base portion 1342 in lengthwise direction Y. The base portion 1342 has a greater width than the substrate connection portion 1343 in widthwise direction X. In widthwise direction X, the base portion 1342 projects further from the substrate connection portion 1343 in the direction extending from the third resin side surface 905 toward the fourth resin side surface 906.

Figure 29:
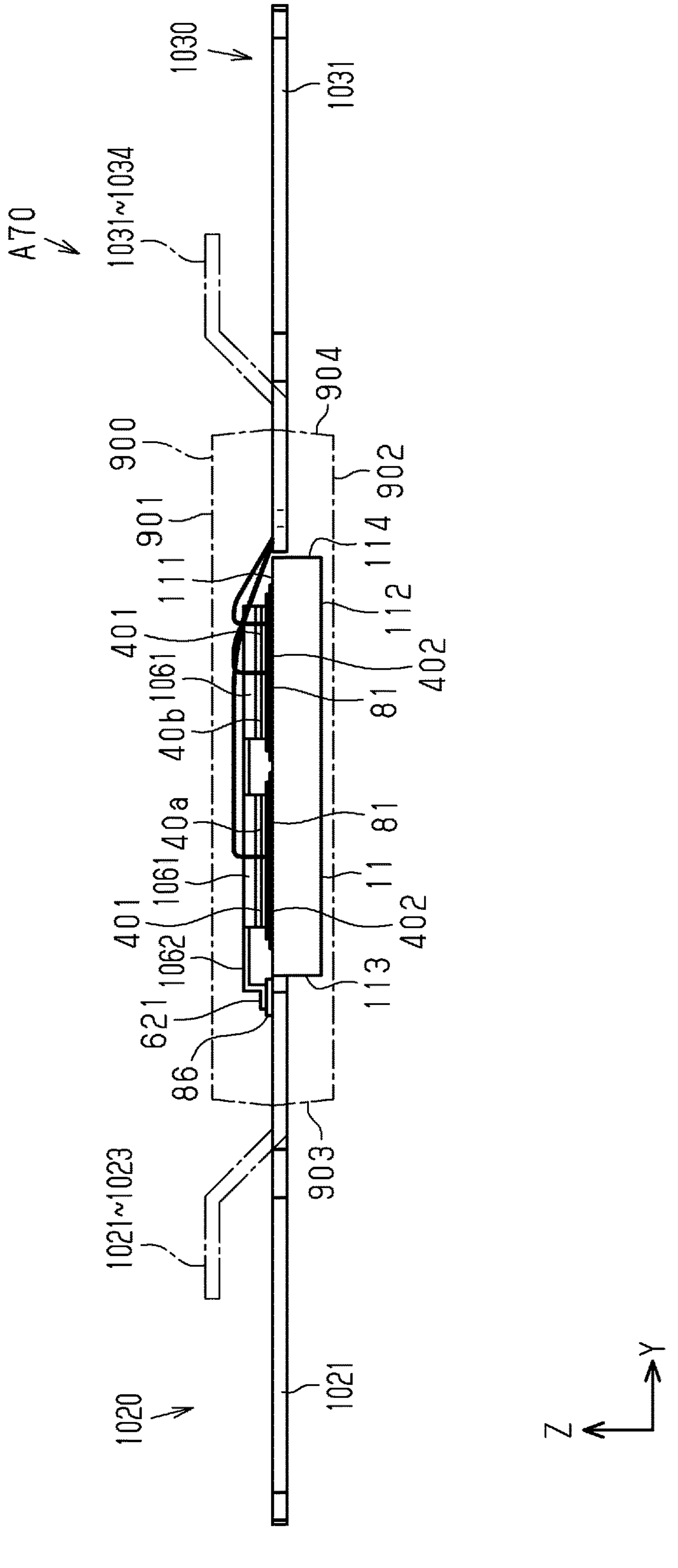
FIG. 29 is a side view of the semiconductor device in accordance with the sixth embodiment.
Figure 30:
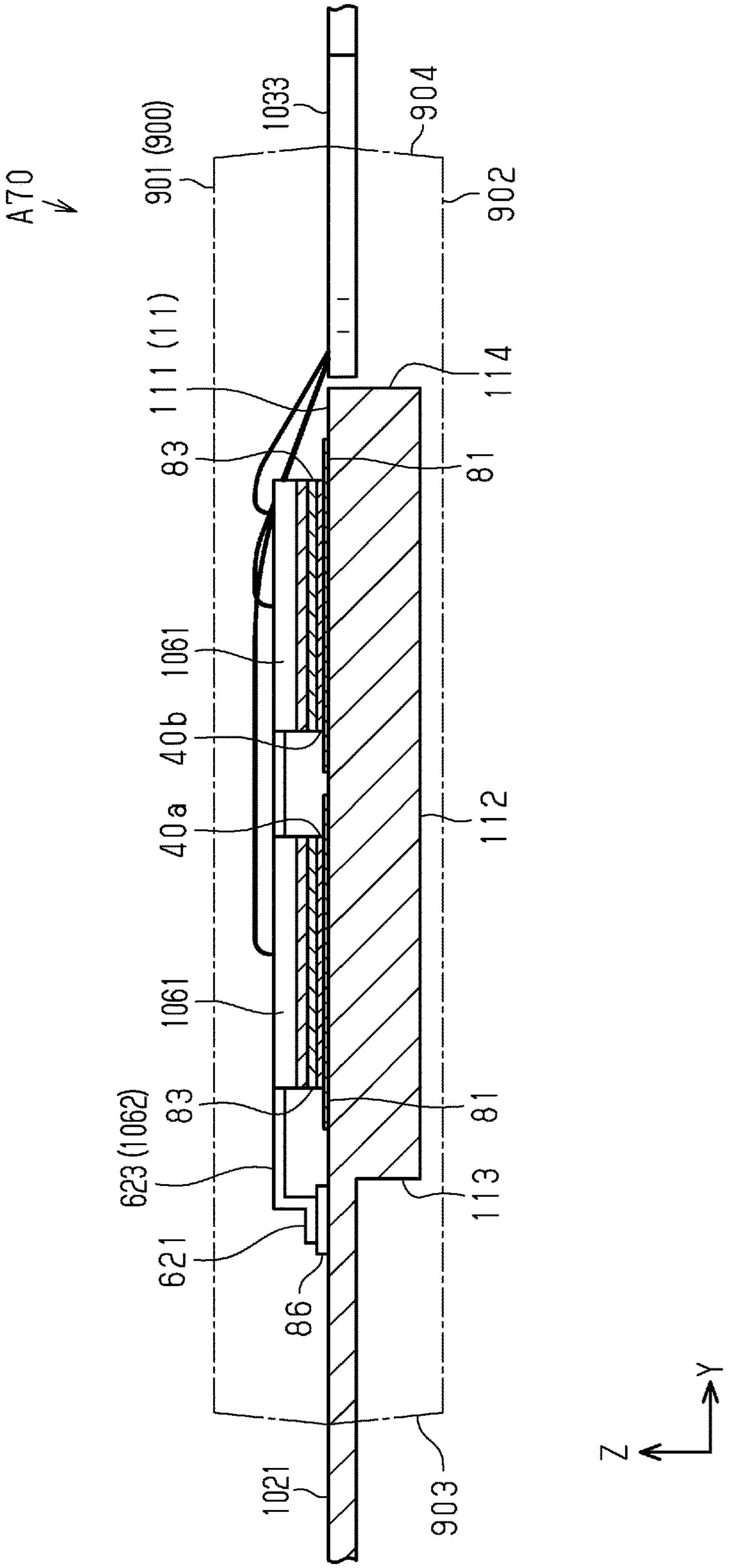
FIG. 30 is a cross-sectional view taken along line 30-30 in FIG. 28.

As shown in FIGS. 27 and 29, in the present embodiment, the thickness of the leads 1021 to 1023 and 1031 to 1033 is less than or equal to the thickness of the first die pad 11 and the second die pad 12. The thickness of the leads 1021 to 1023 and 1031 to 1034 is, for example, 0.6 mm.

As shown by the dashed lines in FIG. 29, the leads 1021 to 1023 of the first lead group 1020 and the leads 1031 to 1034 of the second lead group 1030 are bent toward the resin main surface 901 of the encapsulation resin 900. In this manner, the semiconductor device A70 including the leads 1021 to 1023 and 1031 to 1034 is a semiconductor package mounted on the surface of a mounting substrate.

As shown in FIG. 28 the encapsulation resin 900 includes recesses 907 each extending from the first resin side surface 903 in lengthwise direction Y between the first drive lead 1021 and the second drive lead 1022 and between the second drive lead 1022 and the output lead 1023.

First Switching Element, Second Switching Element

The two first switching elements **40*a* and 40*b* are mounted on the main surface 111 of the first die pad 11. The two second switching elements 50*a* and 50*b* are mounted on the main surface 121 of the second die pad 12. The first switching elements 40*a* and 40*b* and the second switching elements 50*a* and 50*b* are silicon carbide (SiC) chips. In the present embodiment, SiC metal-oxide-semiconductor field-effect transistors (MOSFETs) are used as the first switching elements 40*a* and 40*b* and the second switching elements 50*a* and 50*b*. The first switching elements 40*a* and 40*b* and the second switching elements 50*a* and 50*b*** are elements that allow for high-speed switching.

As shown in FIG. 28, the two first switching elements **40*a* and 40*b* are located in the central part of the main surface 111 of the first die pad 11 in widthwise direction X. Further, the two first switching elements 40*a* and 40*b* are arranged next to each other in lengthwise direction Y on the main surface 111 of the first die pad 11**.

The first switching elements **40*a* and 40*b* each have the form of a plate. In the present embodiment, the first switching elements 40*a* and 40*b* are shaped to be rectangular and long in widthwise direction X as viewed in thickness direction Z. As shown in FIGS. 28 and 29, the first switching elements 40*a* and 40*b* each include an element main surface 401, an element back surface 402, and element side surfaces 403. The element main surface 401 and the element back surface 402 face opposite directions in thickness direction Z. The element main surface 401 faces the same direction as the resin main surface 901. That is, the element main surface faces the same direction as the main surface 111 of the first die pad 11. The element back surface 402 faces the main surface 111 of the first die pad 11. The element side surfaces 403** face widthwise direction X or lengthwise direction Y.

The first switching elements **40*a* and 40*b* each include a first main surface electrode 1041 and a first control electrode 1042 on the element main surface 401, and a first back surface electrode 1043 on the element back surface 402. The first main surface electrode 1041 is a source electrode. The first main surface electrode 1041 of the present embodiment includes a main source electrode 1411 and control source electrodes 1412 and 1413. The first control electrode 1042 is a gate electrode. The control source electrodes 1412 and 1413 are, for example, driver source electrodes electrically connected to a circuit (driver) that drives the first switching elements 40*a* and 40*b*. In the present embodiment, the first control electrode 1042 is arranged at a portion located toward the third side surface 115 of the first die pad 11 (third resin side surface 905 of encapsulation resin 900). Further, the first control electrode 1042 is located in the central portion of the first main surface electrode 1041 in lengthwise direction Y. The main source electrode 1411 of the first main surface electrode 1041 is arranged next to the first control electrode 1042 in widthwise direction X. The control source electrodes 1412 and 1413 sandwich the first control electrode 1042 in lengthwise direction Y. The first back surface electrode 1043 is a drain electrode. The first back surface electrode 1043 is electrically connected to the first die pad 11 by solder 81**.

As shown in FIG. 28, the two second switching elements 50*a* and 50*b* are located in the central part of the main surface 121 of the second die pad 12 in widthwise direction X. Further, the two second switching elements 50*a* and 50*b* are arranged next to each other in lengthwise direction Y on the main surface 121 of the second die pad 12.

The second switching elements 50*a* and 50*b* each have the form of a plate. In the present embodiment, the second switching elements 50*a* and 50*b* are shaped to be rectangular and long in widthwise direction X as viewed in thickness direction Z. As shown in FIG. 28, the second switching elements 50*a* and 50*b* each include an element main surface 501, an element back surface 502, and element side surfaces 503. The element main surface 501 and the element back surface 502 face opposite directions in thickness direction Z. The element main surface 501 faces the resin main surface 901. That is, the element main surface faces the same direction as the main surface 121 of the second die pad 12. The element back surface 502 faces the main surface 121 of the second die pad 12. The element side surfaces 503 face widthwise direction X or lengthwise direction Y.

The second switching elements 50*a* and 50*b* each include a second main surface electrode 1051 and a second control electrode 1052 on the element main surface 501 and a second back surface electrode 1053 on the element back surface 502. The second main surface electrode 1051 is a source electrode. The second main surface electrode 1051 of the present embodiment includes a main source electrode 511 and the control source electrodes 512 and 513. The second control electrode 1052 is a gate electrode. The control source electrodes 512 and 513 are, for example, driver source electrodes electrically connected to a circuit (driver) that drives the second switching elements 50*a* and 50*b*. In the present embodiment, the second control electrode 1052 is arranged at a portion located toward the fourth side surface 126 of the second die pad 12 (fourth resin side surface 906 of the encapsulation resin 900). Further, the first control electrode 1052 is located in the central portion of the first main surface electrode 1051 in lengthwise direction Y The main source electrode 511 of the second main surface electrode 1051 is arranged next to the second control electrode 1052 in widthwise direction X. The control source electrodes 512 and 513 sandwich the second control electrode 1052 in lengthwise direction Y The second back surface electrode 1053 is a drain electrode. The second back surface electrode 1053 is electrically connected to the second die pad 12 by solder 82.

First Connecting Member, Second Connecting Member

Figure 31:
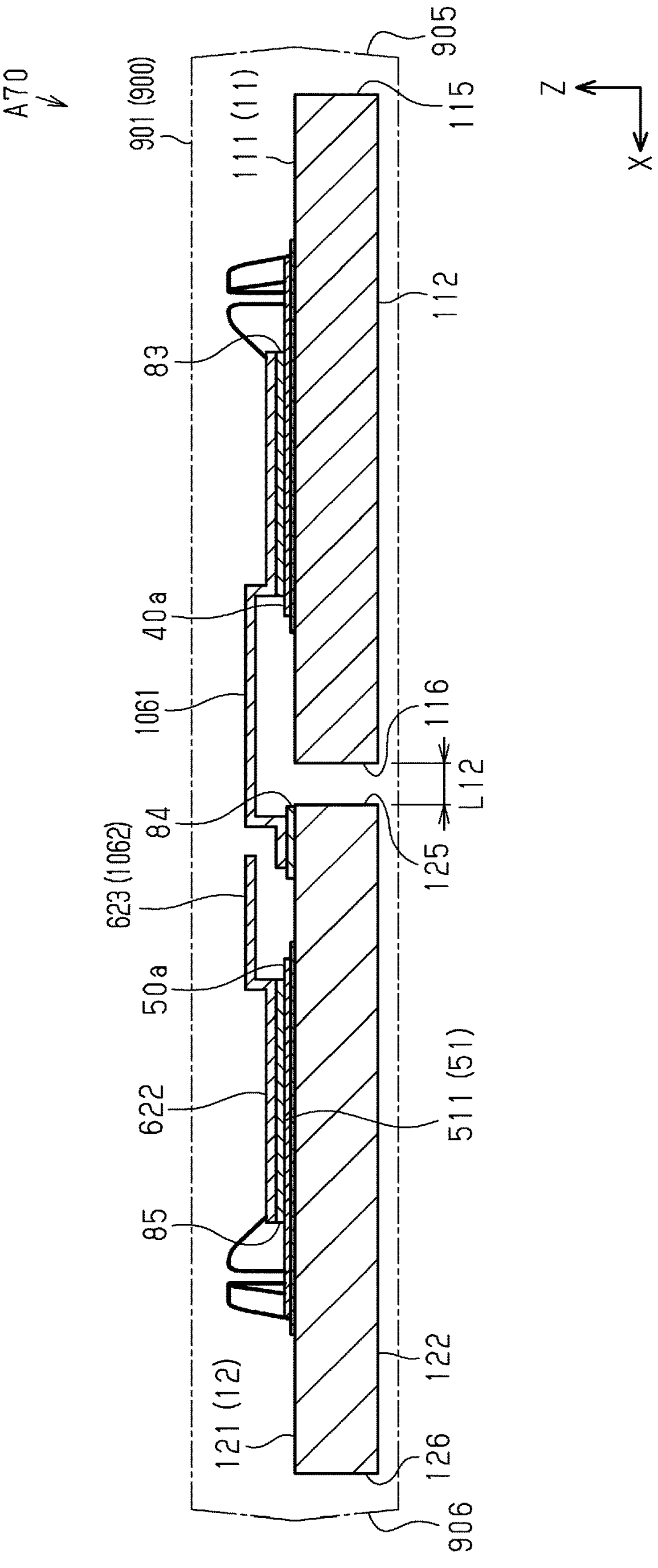
FIG. 31 is a cross-sectional view taken along line 31-31 in FIG. 28.

The first main surface electrodes 1041 (main source electrodes 1411) of the first switching elements 40*a* and 40*b* are connected by the first connecting members 1061 to the second die pad 12. Each first connecting member 1061 is a conductive plate-like member and referred to as a clip. The first connecting member 1061 is formed by bending a conductive plate. The first connecting member 1061 of the present embodiment is belt-shaped and extends in widthwise direction X. The first connecting members 1061 connect the first main surface electrodes 1041 (main source electrodes 1411) of the first switching elements 40*a* and 40*b* to the second die pad 12. As shown in FIG. 31, one end of each first connecting member 1061 is connected by solder 83 to the main source electrode 1411 of the corresponding one of the first switching elements 40*a* and 40*b*, and the other end of each first connecting member 1061 is connected by solder 84 to the second die pad 12. The first connecting members 1061 are formed from Cu. The thickness of each first connecting member 1061 is 0.05 mm or greater and 1.0 mm or less, preferably, 0.5 mm or greater.

Wires may be used instead of the first connecting members 1061 to connect the first main surface electrodes 1041 (main source electrodes 1411) of the first switching elements 40*a* and 40*b* and the second die pad 12. Preferably, the number of wires is set in accordance with, for example, the drive current allowed to flow through the semiconductor device A70.

The second switching elements 50*a* and 50*b* are connected by the second connecting member 1062 to the second drive lead 1022. The second connecting member 1062 is a conductive plate-like member and referred to as a clip. The second connecting member 1062 is formed by bending a conductive plate.

The second connecting member 1062 includes a lead connection portion 621, electrode connection portions 622, and a coupling portion 623. In the same manner as the pad portion 1221 of the second drive lead 1022, the lead connection portion 621 extends in widthwise direction X. As shown in FIG. 28, the lead connection portion 621 is connected by solder 86 to the pad portion 1221. The electrode connection portions 622, which are rectangular, are formed in correspondence with the second main surface electrodes 1051 (main source electrodes 511) of the second switching elements 50*a* and 50*b* and connected by solder 85 to the second main surface electrodes 1051. The coupling portion 623 connects the lead connection portion 621 and the electrode connection portions 622. The coupling portion 623 extends from the lead connection portion 621 in lengthwise direction Y. Further, the coupling portion 623 is connected to the ends of the electrode connection portions 622 that are located toward the first die pad 11. That is, the electrode connection portions 622 extend from the coupling portion 623 in widthwise direction X. As shown in FIG. 31, in the present embodiment, the second connecting member 1062 is formed so that the coupling portion 623 is parallel to the main surface 121 of the second die pad 12 between the second switching elements 50*a* and 50*b* and the third side surface 125 of the second die pad 12. The second connecting member 1062 is formed from Cu. The thickness of the second connecting member 1062 is 0.05 mm or greater and 1.0 mm or less, preferably, 0.5 mm or greater.

Wires

The semiconductor device A70 includes the wires 71 to 76. The wires 71 to 76 are conductive linear members. The wires 71 to 76 are formed from, for example, Al. The diameter of the wires 71 to 76 is, for example, 0.04 mm or greater and 0.1 mm or less.

The wire 71 is connected between the pad portion 1311 of the first control lead 1031 and the first control electrode 1042 of the first switching element 40*a*. The wire 72 is connected between the pad portion 1311 of the first control lead 1031 and the first control electrode 1042 of the first switching element 40*b*. The wire 73 is connected between the pad portion 1321 of the first source lead 1032 and the control source electrode 1413 of the first switching element 40*b*.

The wire 74 is connected between the pad portion 1341 of the second control lead 1034 and the second control electrode 1052 of the second switching element 50*a*. The wire 75 is connected between the pad portion 1341 of the second control lead 1034 and the second control electrode 1052 of the second switching element 50*b*. The wire 76 is connected between the pad portion 1331 of the second source lead 1033 and the control source electrode 512 of the second switching element 50*b*.

Operation

The operation of the semiconductor device A70 in accordance with the sixth embodiment will now be described.

The semiconductor device A70 in accordance with the present embodiment includes the first switching elements 40*a* and 40*b* and the second switching elements 50*a* and 50*b* in the same encapsulation resin 900. The first main surface electrodes 1041 (main source electrodes 1411) of the first switching elements 40*a* and 40*b* are connected by the first connecting members 1061 to the second die pad 12 on which the second switching elements 50*a* and 50*b* are mounted. Accordingly, the semiconductor device A70 in accordance with the present embodiment forms an inverter circuit in which the first switching elements 40*a* and 40*b* and the second switching elements 50*a* and 50*b* are connected in series.

An inverter circuit may be formed by connecting two semiconductor devices. In this case, the inverter circuit is formed by mounting the two semiconductor devices on a mounting substrate and connecting the leads (high potential source lead and low potential drain lead) with wires. In this case, the external wires will increase the inductance at the leads of the two semiconductor devices.

In contrast, the semiconductor device A70 in accordance with the present embodiment connects the first switching elements 40*a* and 40*b* and the second switching elements 50*a* and 50*b* that form an inverter circuit with the first connecting members 1061 in the encapsulation resin 900. Thus, in comparison with when using external wires for connection, the conductor distance is shortened between the first drive lead 1021, the output lead 1023, and the second drive lead 1022. Thus, the inductance of the semiconductor device A70 is reduced. In this manner, the semiconductor device A70 in accordance with the present embodiment reduces inductance.

In the semiconductor device A70 in accordance with the present embodiment, the first drive lead 1021, the second drive lead 1022, the output lead 1023 are arranged in order in widthwise direction X. That is, the first drive lead 1021 and the second drive lead 1022 are arranged next to each other. The first drive lead 1021 is supplied with high potential voltage, and the second drive lead 1022 is supplied with low potential voltage.

When the first switching elements 40*a* and 40*b* are on and the second switching elements 50*a* and 50*b* are off, the first current I1 flows from the first drive lead 1021 to the output lead 1023. In contrast, when the first switching elements 40*a* and 40*b* are off and the second switching elements 50*a* and 50*b* are on, the second current I2 flows from the output lead 1023 to the second drive lead 1022. When the semiconductor device A70 is operated by a high-speed signal (e.g., 1 MHz), in the first drive lead 1021 and the second drive lead 1022 that are adjacent to each other, the first current I1 and the second current I2 flow alternately in opposite directions through the semiconductor device A70. The magnetic flux generated by the first current I1 and the second current I2 reduces parasitic inductance in the semiconductor device A70.

Advantages

As described above, the present embodiment has the following advantages.

(1-1) The semiconductor device A70 includes the first switching elements 40*a* and 40*b* and the second switching elements 50*a* and 50*b* in the same encapsulation resin 900. The first main surface electrodes 1041 (main source electrodes 1411) of the first switching elements 40*a* and 40*b* are connected by the first connecting members 1061 to the second die pad 12 on which the second switching elements 50*a* and 50*b* are mounted. Accordingly, in the semiconductor device A70, the conductor distance is shortened between the first drive lead 1021, the output lead 1023, and the second drive lead 1022. This reduces the inductance.

(1-2) In the semiconductor device A70, the first drive lead 1021, the second drive lead 1022, the output lead 1023 are arranged in order in widthwise direction X. In accordance with the operational state, the first current I1 flows from the first drive lead 1021 to the output lead 1023, and the second current I2 flows from the output lead 1023 to the second drive lead 1022. This reduces inductance in the semiconductor device A70.

(1-3) The thickness of the first die pad 11 and the second die pad 12 is 1 mm or greater and 3 mm or less. It is preferable that the first die pad 11 and the second die pad 12 be thick. The heat generated when the first switching elements 40*a* and 40*b* function is transmitted from the first switching elements 40*a* and 40*b* to the first die pad 11. As the thickness of the first die pad 11 increases, heat is more easily transmitted from the first switching elements 40*a* and 40*b* to the first die pad 11. Thus, heat dissipation of the first switching elements 40*a* and 40*b* is improved, and thermal resistance in the first switching elements 40*a* and 40*b* is reduced. In the same manner, thermal resistance of the second switching elements 50*a* and 50*b* is reduced.

(1-4) The first connecting members 1061, which are formed by plate-like members, connect the first switching elements 40*a* and 40*b* and the second die pad 12. This configuration can be applied to large currents and is in contrast with a configuration that connects the first switching elements 40*a* and 40*b* and the second die pad 12. Further, this configuration decreases the number of members that are connected and reduces the number of manufacturing steps as compared with when using wires to connect the first switching elements 40*a* and 40*b* and the second die pad 12. Moreover, since the number of wires can be reduced in the semiconductor device A70, the occurrence of wire breakage or the like is limited.

(1-5) The second connecting member 1062, which is formed by a plate-like member, connects the second switching elements 50*a* and 50*b* and the second drive lead 1022. This configuration can be applied to large currents and is in contrast with a configuration that connects the second switching elements 50*a* and 50*b* and the second drive lead 1022. Further, this configuration decreases the number of members that are connected and reduces the number of manufacturing steps as compared with when using wires to connect the second switching elements 50*a* and 50*b* and the second drive lead 1022. Moreover, since the number of wires can be reduced in the semiconductor device A70, the occurrence of wire breakage or the like is limited.

(1-6) The semiconductor device A70 includes the leads 1021 to 1023 that project out of the first resin side surface 903 of the encapsulation resin 900 and the leads 1031 to 1034 that project out of the second resin side surface 904 of the encapsulation resin 900. This widens the space between the first drive lead 1021 and the second drive lead 1022 and the space between the second drive lead 1022 and the output lead 1023. Thus, insulation is readily obtained.

(1-7) The encapsulation resin 900 includes the recesses 907 that extend from the first resin side surface 903 in lengthwise direction Y between the first drive lead 1021 and the second drive lead 1022 and between the second drive lead 1022 and the output lead 1023. The recesses 907 lengthen the distance of the surface (surface distance) of the encapsulation resin 900 between the first drive lead 1021 and the second drive lead 1022 and between the second drive lead 1022 and the output lead 1023. This further ensures insulation.

Modified Examples of Sixth Embodiment

The sixth embodiment may be modified as described below. Wires are not shown in the drawings illustrating the modified examples.

Figure 32:
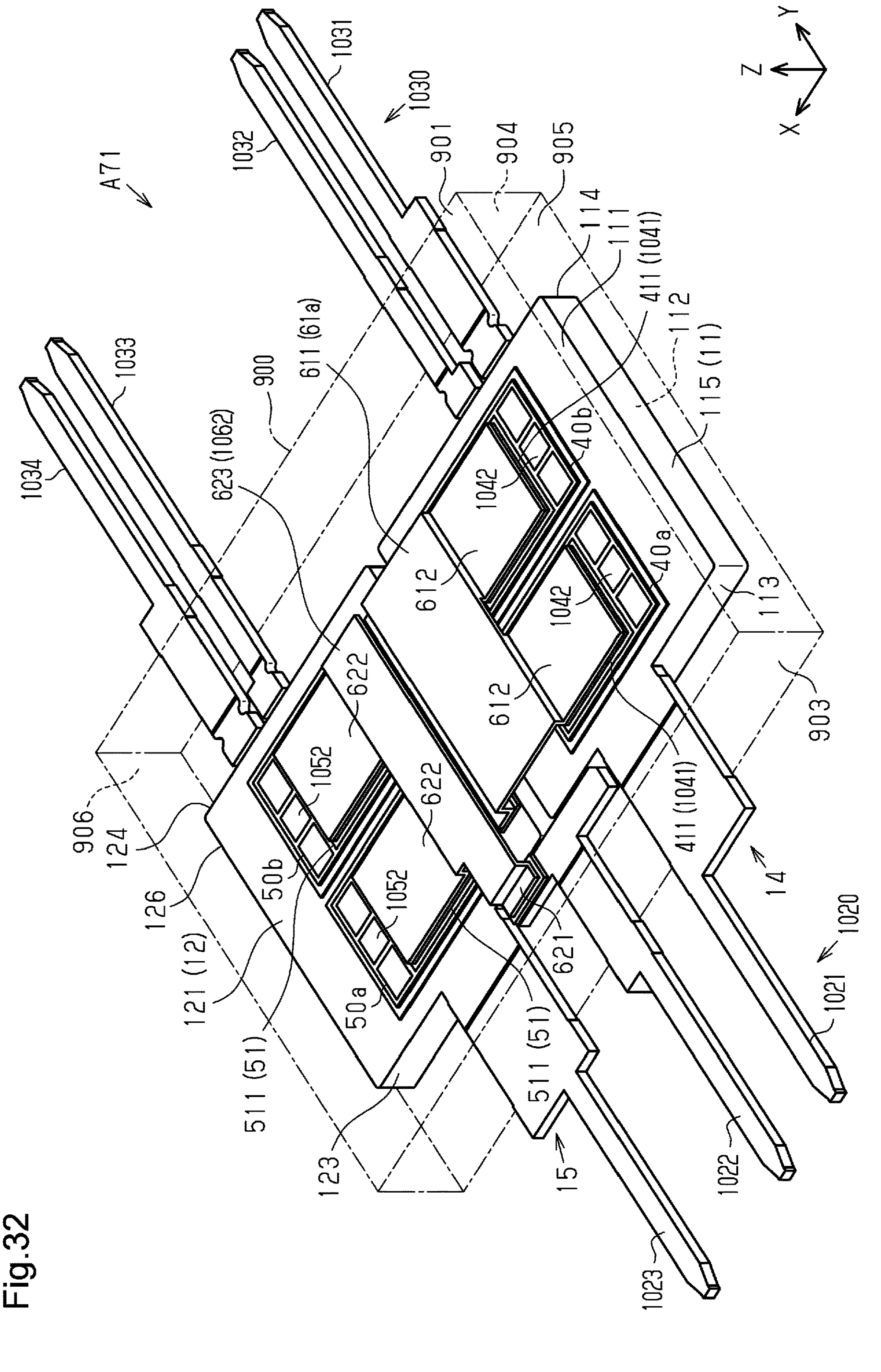
FIG. 32 is a perspective view of a semiconductor device in accordance with a modified example of the sixth embodiment.

In a semiconductor device A71 shown in FIG. 32, a first connecting member 61*a* that connects the first switching elements 40*a* and 40*b* and the second die pad 12 is a single plate-like member. The first connecting member 61*a* includes a die connection portion 611 that extends in lengthwise direction Y and two electrode connection portions 612 that extend from the die connection portion 611 in widthwise direction X. The die connection portion 611 is connected to the second die pad 12, and the electrode connection portions 612 are connected to the first main surface electrodes 1041 (main source electrodes 1411) of the first switching elements 40*a* and 40*b*. The use of the first connecting member 61*a* facilitates the manufacturing of the semiconductor device A71.

Figure 33:
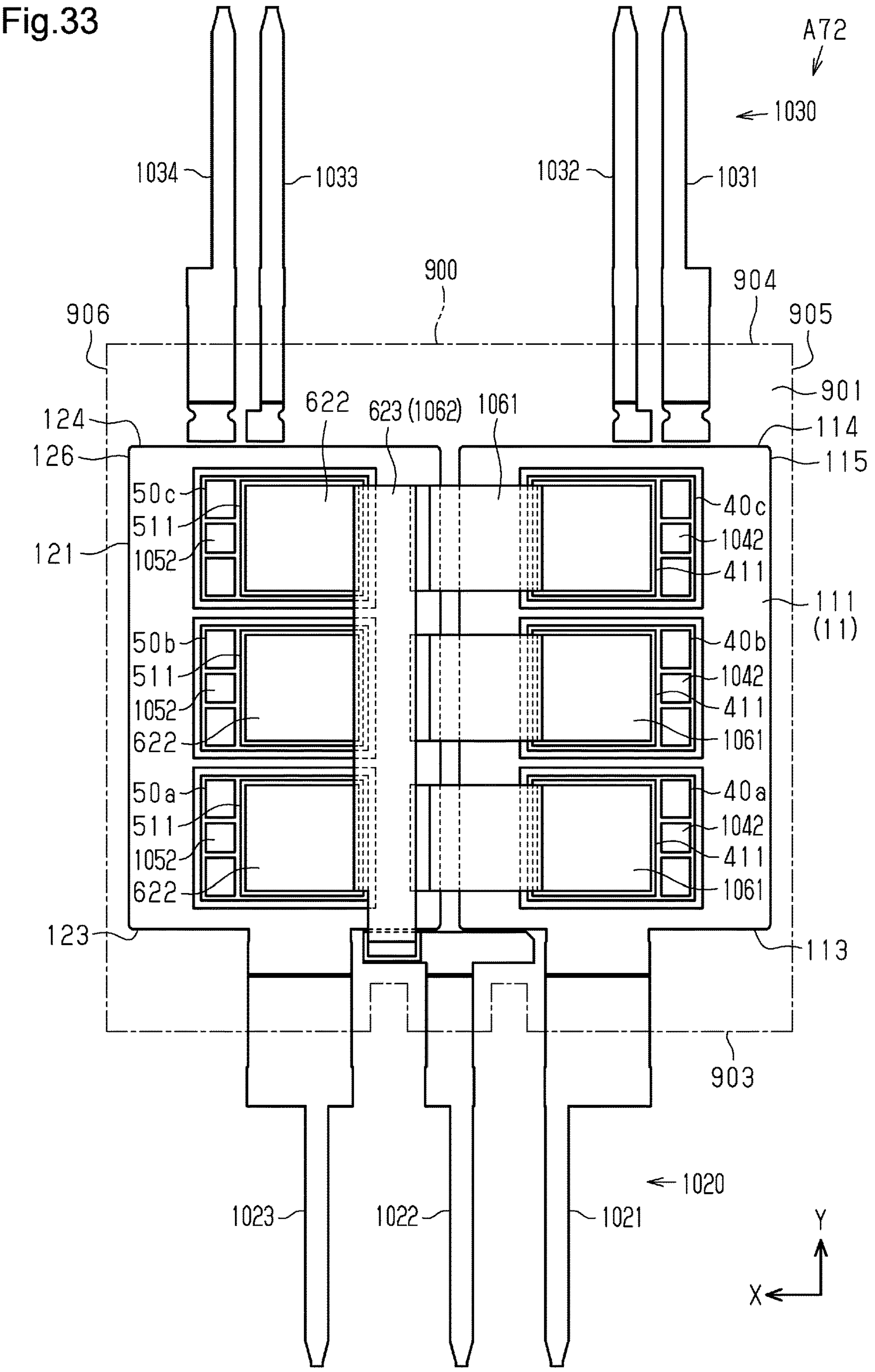
FIG. 33 is a plan view of a semiconductor device in accordance with a modified example of the sixth embodiment.
Figure 34:
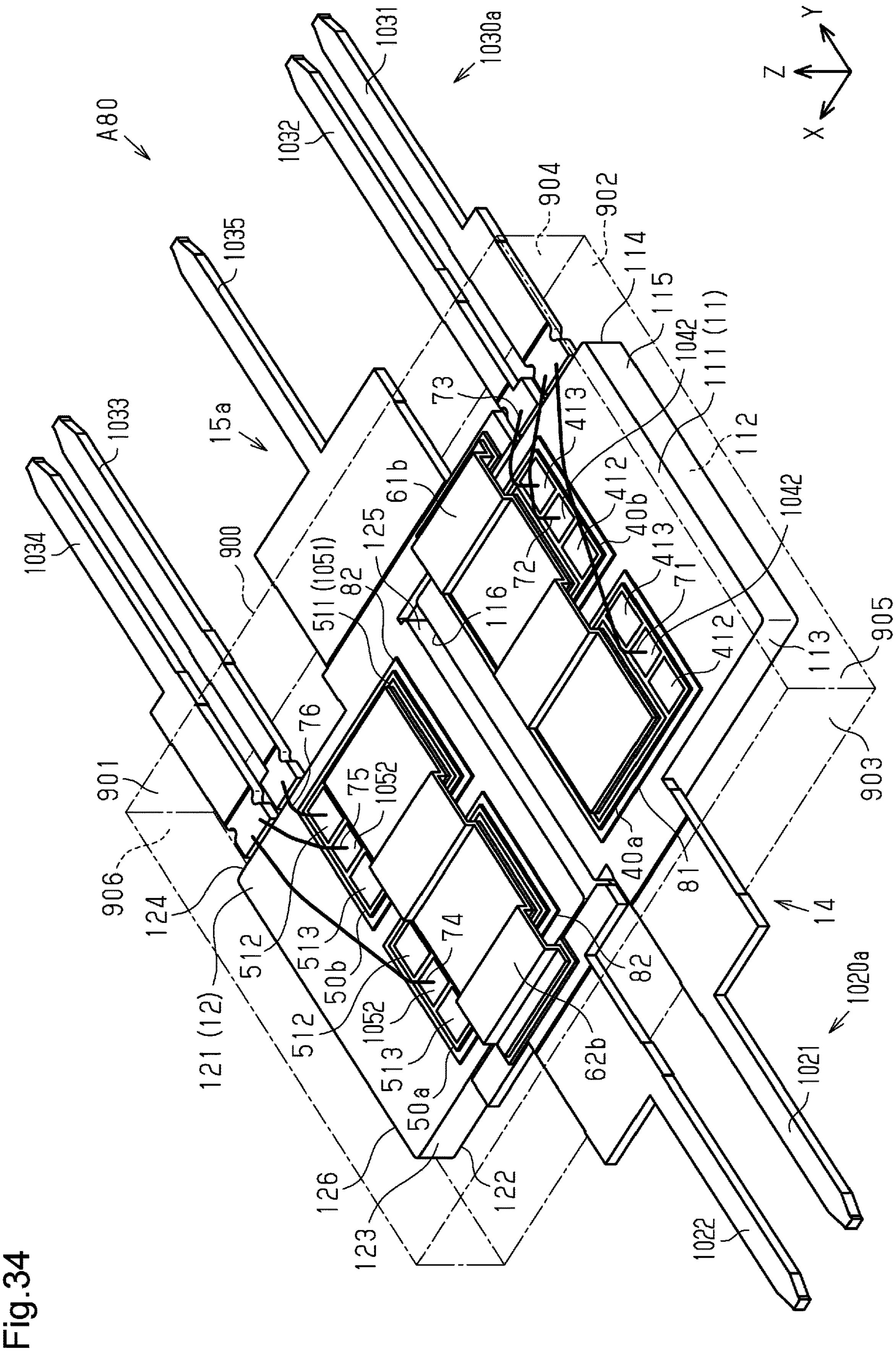
FIG. 34 is a perspective view of a semiconductor device in accordance with a seventh embodiment.

The number of semiconductor devices mounted on the first die pad 11 and the second die pad 12 can be changed. For example, FIG. 33 shows a semiconductor device A72 including three first switching elements 40*a*, 40*b*, and 40*c* mounted on the first die pad 11, and three second switching elements 50*a*, 50*b*, and 50*c* mounted on the second die pad 12. A semiconductor device may include a single first switching element mounted on the first die pad 11 and a single second switching element mounted on the second die pad 12.

The arrangement of the leads 1021 to 1023 in the first lead group 1020 may be changed. For example, the output lead 1023 may be arranged between the first drive lead 1021 and the second drive lead 1022.

Further, the arrangement of the leads 1031 to 1034 in the second lead group 1030 may be changed. For example, the first source lead 1032 may be arranged outward (at portion located toward third resin side surface 905 of the encapsulation resin 900) from the first control lead 1031. Further, the second source lead 1033 may be arranged outward (at portion located toward the fourth resin side surface 906 of the encapsulation resin 900) from the second control lead 1034.

Seventh Embodiment

With reference to FIGS. 34 to 37, a semiconductor device A80 in accordance with a seventh embodiment will now be described.

The semiconductor device A80 in accordance with the seventh embodiment differs from the semiconductor device A70 in accordance with the sixth embodiment in the locations of the first switching elements and the second switching elements.

As shown in FIGS. 34 to 37, the semiconductor device A80 includes a first lead group 1020*a* and a second lead group 1030*a*.

First Lead Group

Figure 35:
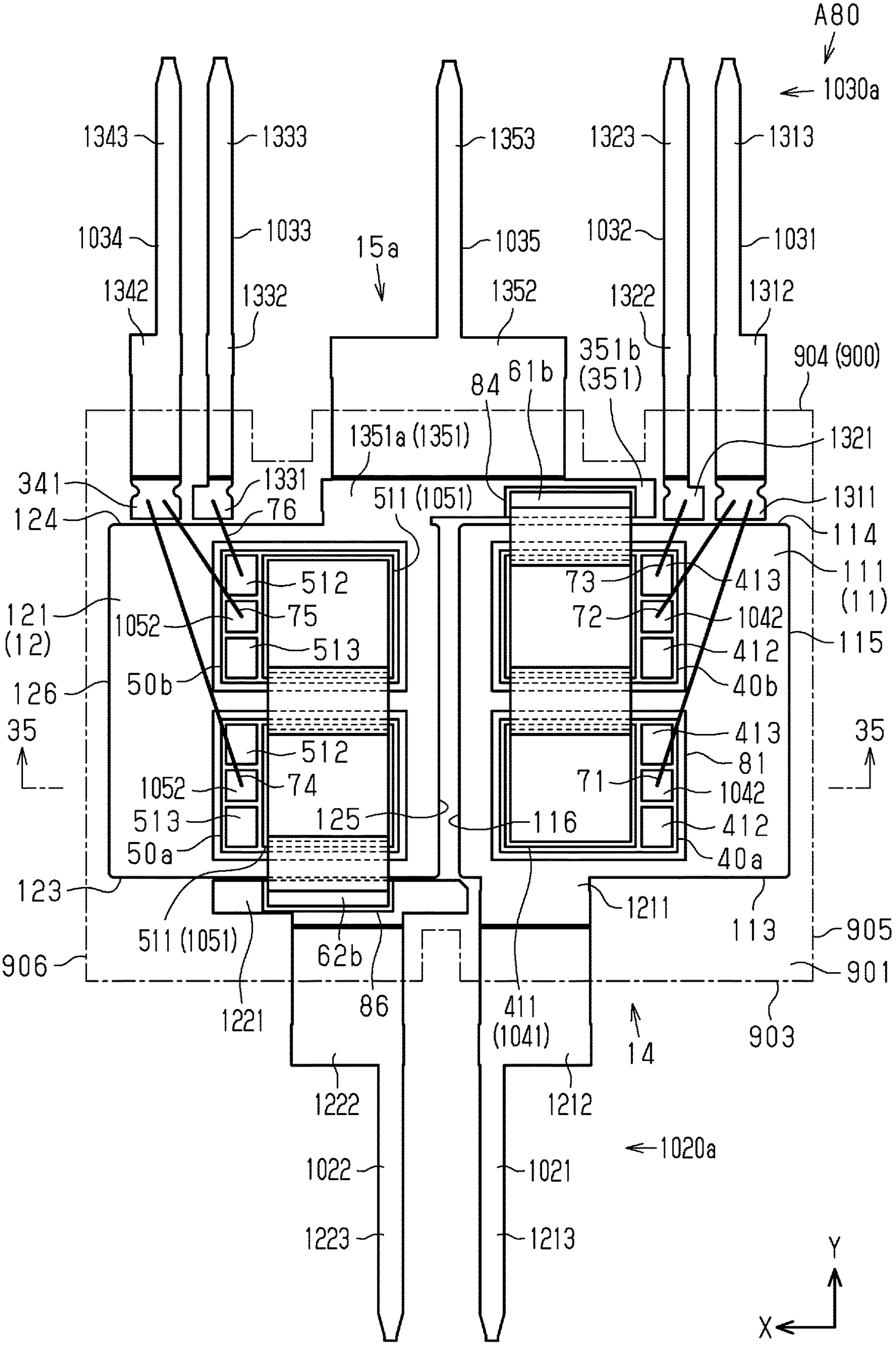
FIG. 35 is a plan view of the semiconductor device in accordance with the seventh embodiment.
Figure 36:
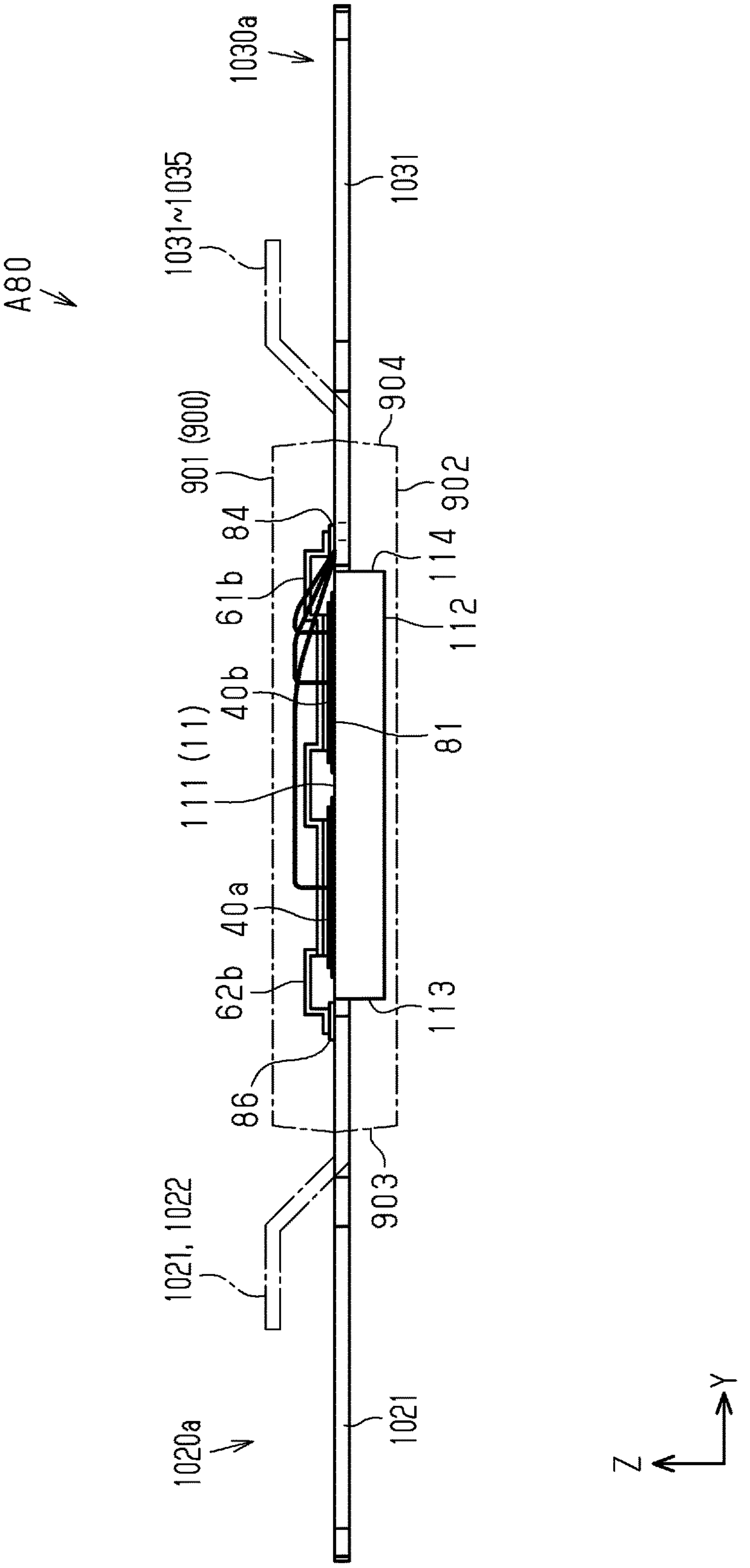
FIG. 36 is a side view of the semiconductor device in accordance with the seventh embodiment.

The first lead group 1020*a* includes the first drive lead 1021 and the second drive lead 1022. As shown in FIG. 35, the first drive lead 1021 is located toward the fourth side surface 116 of the first die pad 11 in widthwise direction X. The second drive lead 1022 is located toward the third side surface 125 of the second die pad 12 in widthwise direction X. In the present embodiment, the first drive lead 1021 and the second drive lead 1022 are arranged so that the median point therebetween corresponds to the central part of the encapsulation resin 900.

Second Lead Group

The second lead group 1030*a* includes the first control lead 1031, the first source lead 1032, the second source lead 1033, the second control lead 1034, and an output lead 1035. The output lead 1035 is located between the first source lead 1032 and the second source lead 1033.

As shown in FIG. 35, the output lead 1035 includes a connection portion 1351, a base portion 1352, and a substrate connection portion 1353. The connection portion 1351 is connected to the second side surface 124 of the second die pad 12. In the present embodiment, the output lead 1035 is integrated with the second die pad 12. The output lead 1035 and the second die pad 12 form an integrated second lead frame 15*a*.

The connection portion 1351 includes a die connection portion 1351*a* and a pad portion 1351*b*. The die connection portion 1351*a* is connected to a portion of the second side surface 124 of the second die pad 12 that is located toward the third side surface 125. The pad portion 1351*b* extends in widthwise direction X from the die connection portion 1351*a* toward the first source lead 1032. The pad portion 1351*b* is arranged at a position overlapping the first drive lead 1021 as viewed in lengthwise direction Y.

The base portion 1352 extends from the connection portion 1351 in lengthwise direction Y and projects out of the second resin side surface 904 of the encapsulation resin 900. The substrate connection portion 1353 extends from the distal end of the base portion 1352 in lengthwise direction Y As shown in FIG. 35, the base portion 1352 has a greater width than the substrate connection portion 1353 in widthwise direction X. The base portion 1352 is formed to be wide enough so that in lengthwise direction Y, part of the base portion 1352 overlaps the first drive lead 1021 and another part overlaps the second drive lead 1022. The substrate connection portion 1353 is located in the central part of the base portion 1352 in widthwise direction X. Further, the substrate connection portion 1353 is located in the central part of the encapsulation resin 900 in widthwise direction X.

First Switching Element, Second Switching Element

Figure 37:
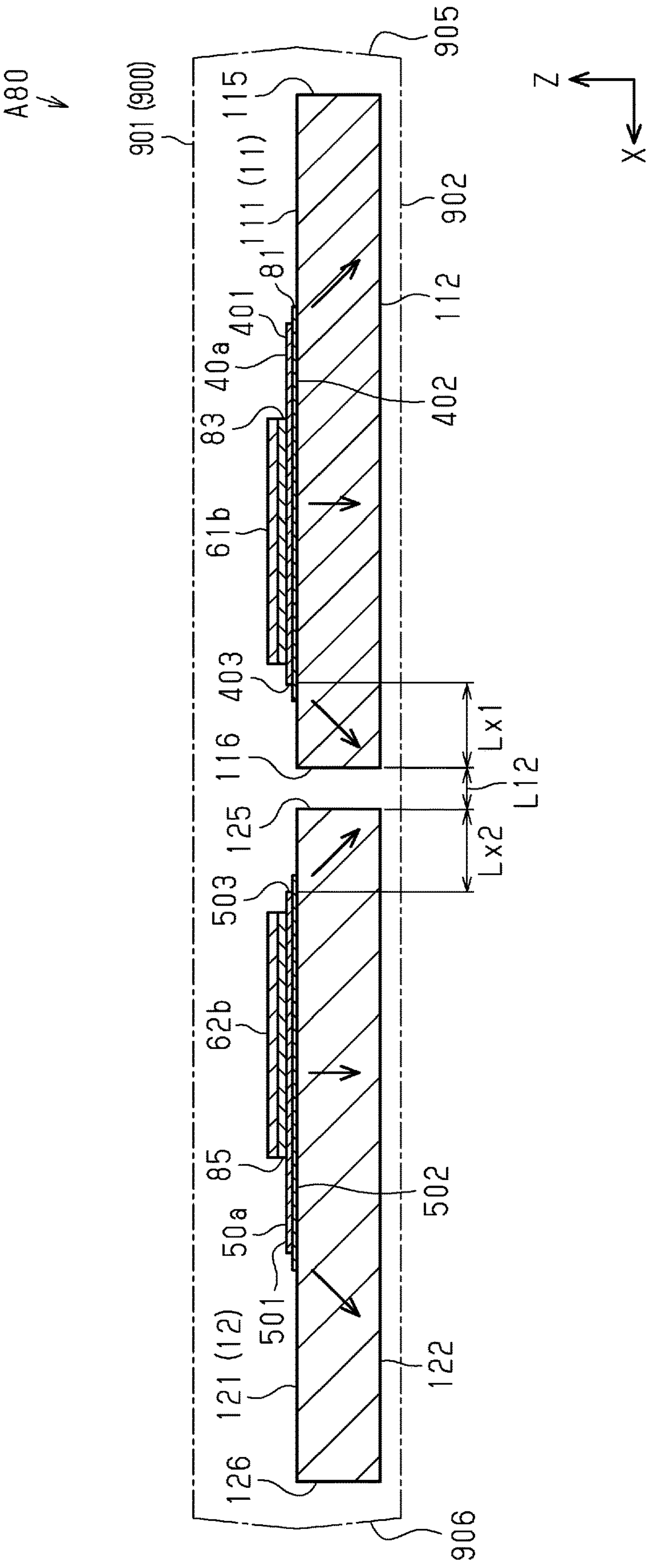
FIG. 37 is a cross-sectional view taken along line 35-35 in FIG. 35.

As shown in FIGS. 35 and 37, the first switching elements 40*a* and 40*b* and the second switching elements 50*a* and 50*b* are located toward the central part of the encapsulation resin 900 in widthwise direction X.

As shown in FIGS. 35 and 37, the first switching elements 40*a* and 40*b* are located toward the fourth side surface 116 in widthwise direction X on the first die pad 11. The fourth side surface 116 faces the third side surface 125 of the second die pad 12. Thus, the first switching elements 40*a* and 40*b* are located toward the second die pad 12 on the first die pad 11. The first switching elements 40*a* and 40*b* are arranged so that the main source electrode 1411 of the first main surface electrode 1041 overlap the pad portion 1351*b* of the output lead 1035 in lengthwise direction Y. In the present embodiment, the distance (first distance) Lx1 from the fourth side surface 116 of the first die pad 11 to the element side surfaces 403 of the first switching elements 40*a* and 40*b* as viewed in thickness direction Z is greater than or equal to the first die pad 11.

As shown in FIGS. 35 and 37, the second switching elements 50*a* and 50*b* are located toward the third side surface 125 in widthwise direction X on the second die pad 12. Thus, the second switching elements 50*a* and 50*b* are arranged on the second die pad 12 at a portion located toward the first die pad 11. The second switching elements 50*a* and 50*b* are arranged so that the main source electrodes 511 of the second main surface electrodes 1051 overlap the pad portion 1221 of the second drive lead 1022 in lengthwise direction Y. In the present embodiment, the distance (second distance) Lx2 from the third side surface 125 of the second die pad 12 to the element side surfaces 503 of the second switching elements 50*a* and 50*b* as viewed in thickness direction Z is greater than or equal to the thickness of the second die pad 12.

First Connecting Member, Second Connecting Member

In the present embodiment, a first connecting member 61*b*, which is belt-shaped and extends in lengthwise direction Y, connects the main source electrodes 1411 of the first switching elements 40*a* and 40*b* to the pad portion 1351*b* of the output lead 1035. The output lead 1035 is connected to the second die pad 12. Accordingly, the first main surface electrodes 1041 (main source electrodes 1411) of the first switching elements 40*a* and 40*b* are connected via the output lead 1035 to the second die pad 12. A second connecting member 62*b*, which is belt-shaped and extends in lengthwise direction Y, connects the main source electrodes 511 of the second switching elements 50*a* and 50*b* to the pad portion 1221 of the second drive lead 1022.

Operation

The operation of the semiconductor device A80 in accordance with the seventh embodiment will now be described.

The first switching elements 40*a* and 40*b* are located toward the fourth side surface 116 in widthwise direction X on the first die pad 11. The first switching elements 40*a* and 40*b* are arranged so that the main source electrodes 1411 overlap the pad portion 1351*b* of the output lead 1035 in lengthwise direction Y. The pad portion 1351*b* is arranged overlapping the first drive lead 1021 in lengthwise direction Y. Accordingly, the first drive lead 1021, the first switching elements 40*a* and 40*b*, and the pad portion 1351*b* of the output lead 1035 overlap one another in lengthwise direction Y. Thus, current flows linearly in the semiconductor device A80 between the first drive lead 1021 and the output lead 1035.

The second switching elements 50*a* and 50*b* are located toward the third side surface 125 in widthwise direction X on the second die pad 12. The second switching elements 50*a* and 50*b* are arranged to overlap the second drive lead 1022 in lengthwise direction Y. Part of the output lead 1035 overlaps the second drive lead 1022 in lengthwise direction Y. Thus, current flows linearly in the semiconductor device A80 between the second drive lead 1022 and the output lead 1035.

As shown in FIG. 35, the first drive lead 1021 and the second drive lead 1022 are arranged next to each other in widthwise direction X. When the semiconductor device A80 functions as an inverter, current directed from the first drive lead 1021 toward the output lead 1035 flows through the first drive lead 1021. Further, current directed from the output lead 1035 toward the second drive lead 1022 flows through the second drive lead 1022. Accordingly, the magnetic flux generated by current flowing in opposite directions through the first drive lead 1021 and the second drive lead 1022, which are adjacent to each other, reduces mutual inductance. This reduces parasitic inductance in the semiconductor device A80.

The heat generated when the first switching elements 40*a* and 40*b* function is transmitted from the first switching elements 40*a* and 40*b* to the first die pad 11. In the first die pad 11, as shown by the arrows in FIG. 37, heat spreads when transmitted from the main surface 111 of the first die pad 11 toward the back surface 112. The heat is then transmitted from each surface of the first die pad 11 to the encapsulation resin 900. In the same manner, the heat generated when the second switching elements 50*a* and 50*b* function is transmitted from the second switching elements 50*a* and 50*b* to the second die pad 12 and spread when transmitted from the main surface 121 of the second die pad 12 toward the back surface 122. The heat is then transmitted from each surface of the second die pad 12 to the encapsulation resin 900.

As the first switching elements 40*a* and 40*b* become closer to the fourth side surface 116 of the first die pad 11, more heat will be transmitted from the fourth side surface 116 to the encapsulation resin 900. In the same manner, as the second switching elements 50*a* and 50*b* become closer to the third side surface 125 of the second die pad 12, more heat will be transmitted from the third side surface 125 to the encapsulation resin 900. This will raise the temperature at a resin portion 900*a* of the encapsulation resin 900 between the fourth side surface 116 and the third side surface 125. Consequently, the efficiency for transmitting heat from the fourth side surface 116 to the resin portion 900*a* will decrease, and the efficiency for transmitting heat from the third side surface 125 to the resin portion 900*a* will decrease. Thus, the heat dissipation efficiency will decrease in the first switching elements 40*a* and 40*b* and the second switching elements 50*a* and 50*b*.

However, as described above, in the semiconductor device A80 in accordance with the present embodiment, the distance Lx1 from the fourth side surface 116 of the first die pad 11 to the element side surfaces 403 of the first switching elements 40*a* and 40*b* is greater than or equal to the thickness of the first die pad 11. Further, the distance Lx2 from the third side surface 125 of the second die pad 12 to the element side surfaces 503 of the second switching elements 50*a* and 50*b* is greater than or equal to the thickness of the second die pad 12. This limits decreases in the heat dissipation efficiency of the first switching elements 40*a* and 40*b* and the second switching elements 50*a* and 50*b*.

Decreases in the heat dissipation efficiency can also be limited by increasing the distance L12 between the first die pad 11 and the second die pad 12, that is, separating the first die pad 11 and the second die pad 12 from each other. However, separation of the first die pad 11 and the second die pad 12 will enlarge the encapsulation resin 900, that is, enlarge the outer dimensions of the semiconductor device. In contrast, when setting the positions of the first switching elements 40*a* and 40*b* and the second switching elements 50*a* and 50*b* as described above, decreases in the heat dissipation efficiency will be limited while avoiding enlargement of the semiconductor device A80.

Advantages

As described above, the present embodiment has the following advantages.

(2-1) The semiconductor device A80 includes the first drive lead 1021 and the second drive lead 1022 that project out of the first resin side surface 903 of the encapsulation resin 900 and the output lead 1035 that project out of the second resin side surface 904 of the encapsulation resin 900. This allows insulation to be readily obtained between the first drive lead 1021 and the output lead 1035 and between the second drive lead 1022 and the output lead 1035.

(2-2) In the semiconductor device A80, only the first drive lead 1021 and the second drive lead 1022 project out of the first resin side surface 903 of the encapsulation resin 900. This allows the interval between the first drive lead 1021 and the second drive lead 1022 to be widened easily. Thus, the surface distance between the first drive lead 1021 and the second drive lead 1022 can be obtained easily.

(2-3) The distance Lx1 from the fourth side surface 116 of the first die pad 11 to the element side surfaces 403 of the first switching elements 40*a* and 40*b* is greater than or equal to the thickness of the first die pad 11. This limits decreases in the heat dissipation of the first die pad 11 with respect to the first switching elements 40*a* and 40*b*.

(2-4) The distance Lx2 from the third side surface 125 of the second die pad 12 to the element side surfaces 503 of the second switching elements 50*a* and 50*b* is greater than or equal to the thickness of the second die pad 12. This limits decreases in the heat dissipation of the second die pad 12 with respect to the second switching elements 50*a* and 50*b*.

Modified Examples of Seventh Embodiment

The seventh embodiment may be modified as described below. Wires are not shown in the drawings illustrating the modified examples.

The shapes of the first connecting members 1061 and the second connecting member 1062 may be changed.

Figure 38:
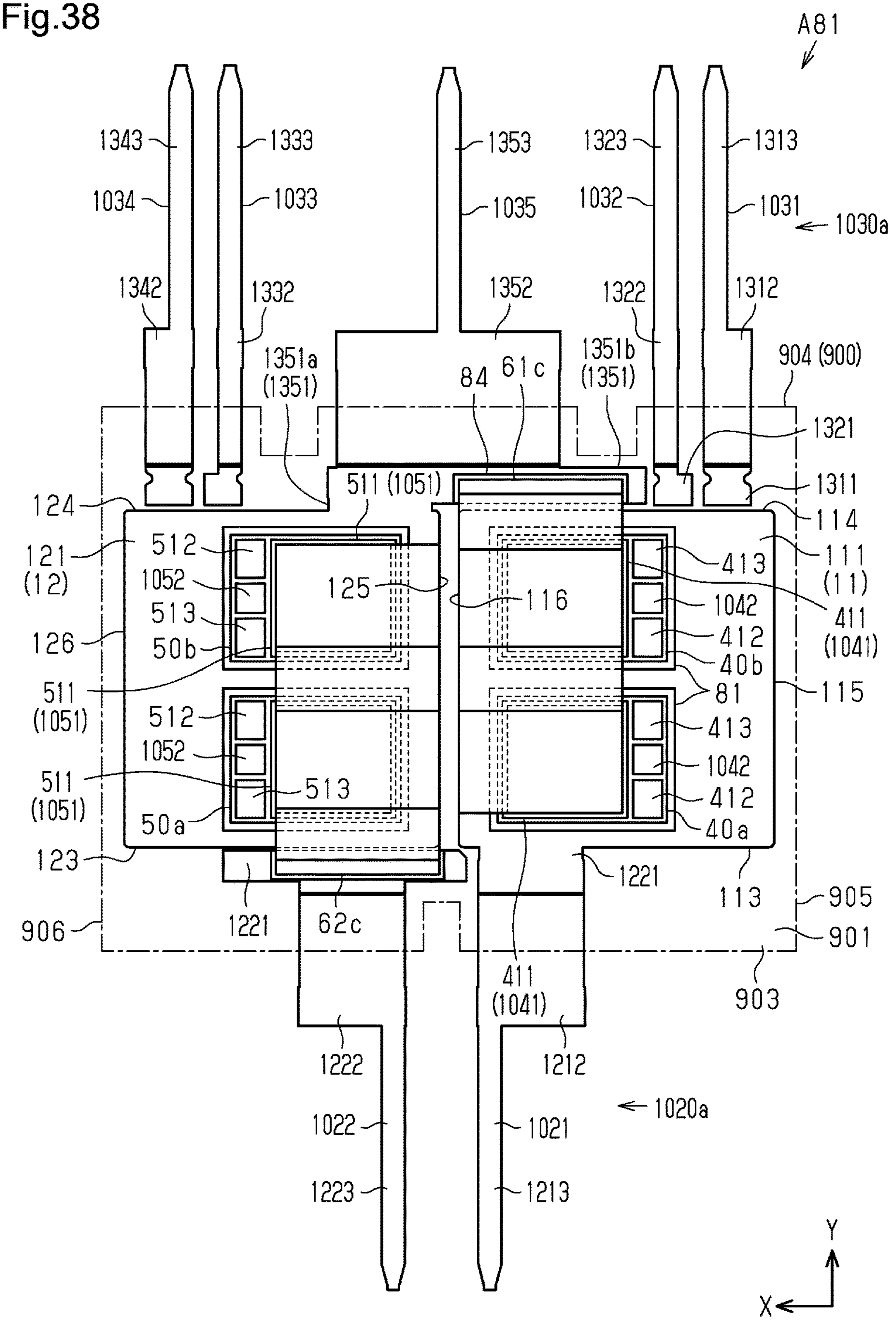
FIG. 38 is a plan view of a semiconductor device in accordance with a modified example of the seventh embodiment.

For example, as shown in FIG. 38, a semiconductor device A81 may include a first connecting member 61*c* that is widened. Further, a second connecting member 62*c* may be widened. The first connecting member 61*c* and the second connecting member 62*c* that are formed in such a manner shortens the path of the current flowing from the first drive lead 1021 to the output lead 1035 and the path of the current flowing from the output lead 1035 toward the second drive lead 1022. This reduces mutual inductance.

Figure 39:
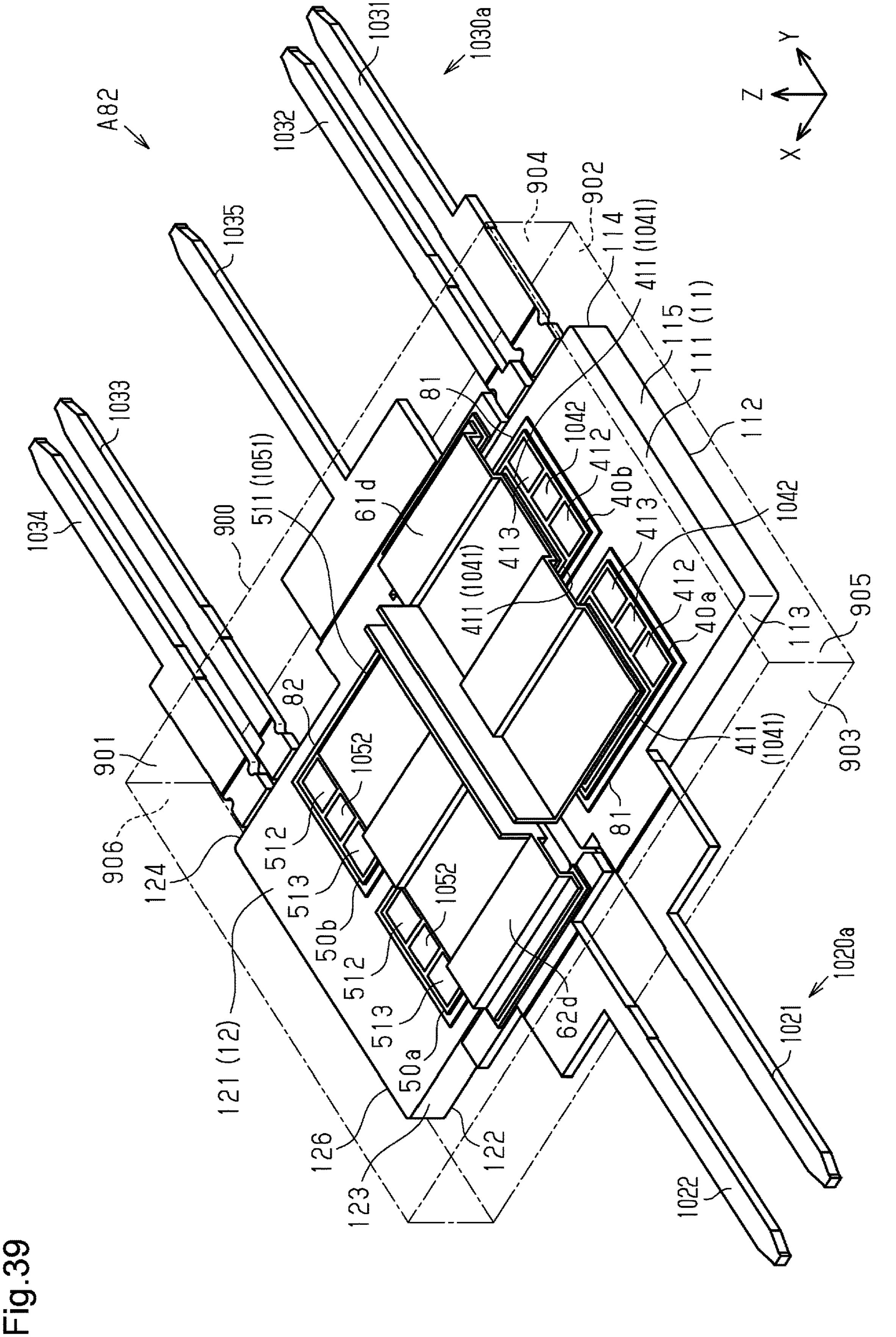
FIG. 39 is a plan view of a semiconductor device in accordance with a modified example of the seventh embodiment.

Further, as shown in FIG. 39, a semiconductor device A82 may include a first connecting member 61*d* and a second connecting member 62*d* that include a plate-like portion extending in thickness direction Z to reduce inductance.

The shapes of the first drive lead 1021, the second drive lead 1022, and the output lead 1035 may be changed.

Figure 40:
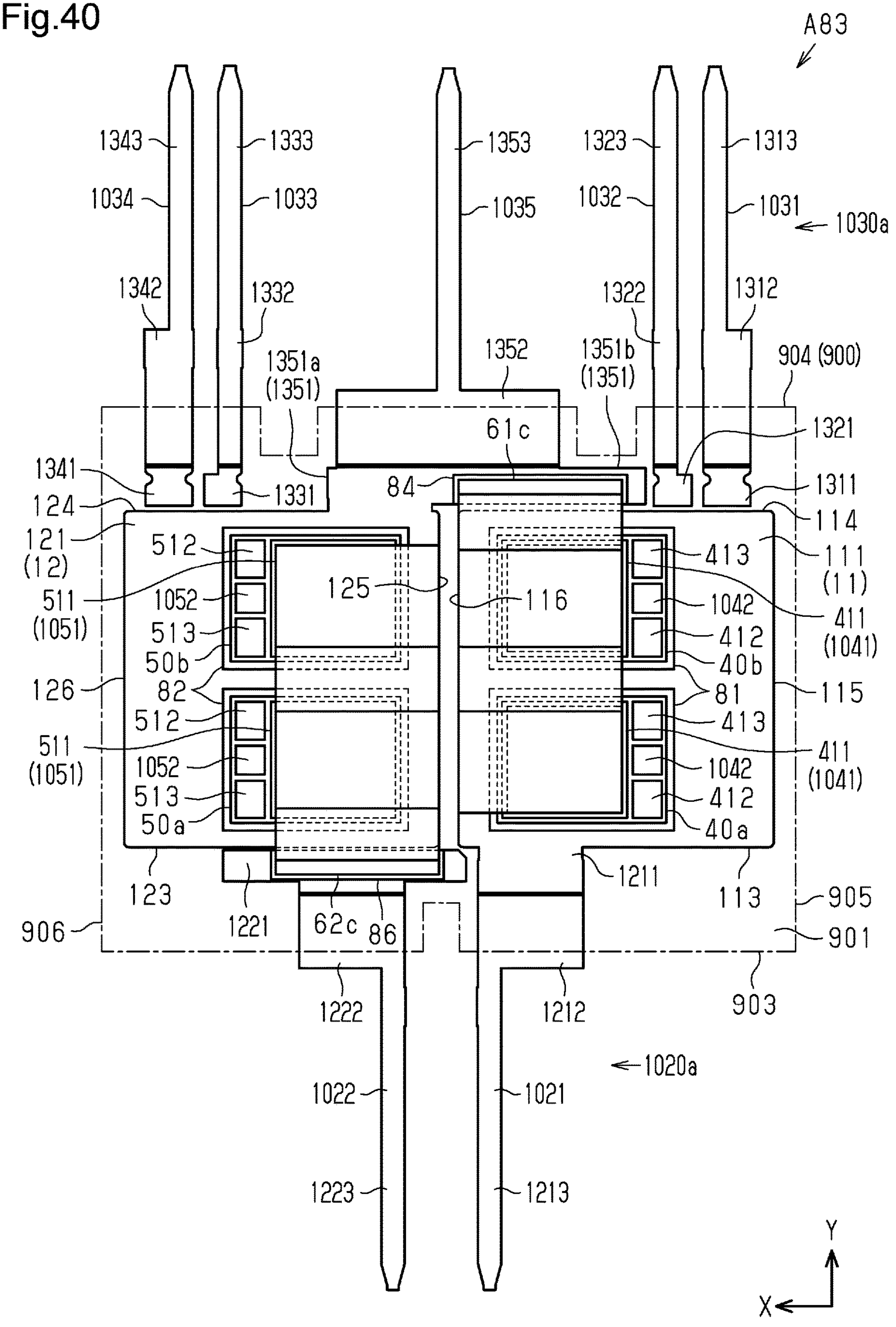
FIG. 40 is a plan view of a semiconductor device in accordance with a modified example of the seventh embodiment.

For example, as shown in FIG. 40, a semiconductor device A83 includes leads 1021, 1022, and 1035 respectively having base portions 1212, 1222, and 352 of which the lengths are shortened in lengthwise direction Y.

Figure 41:
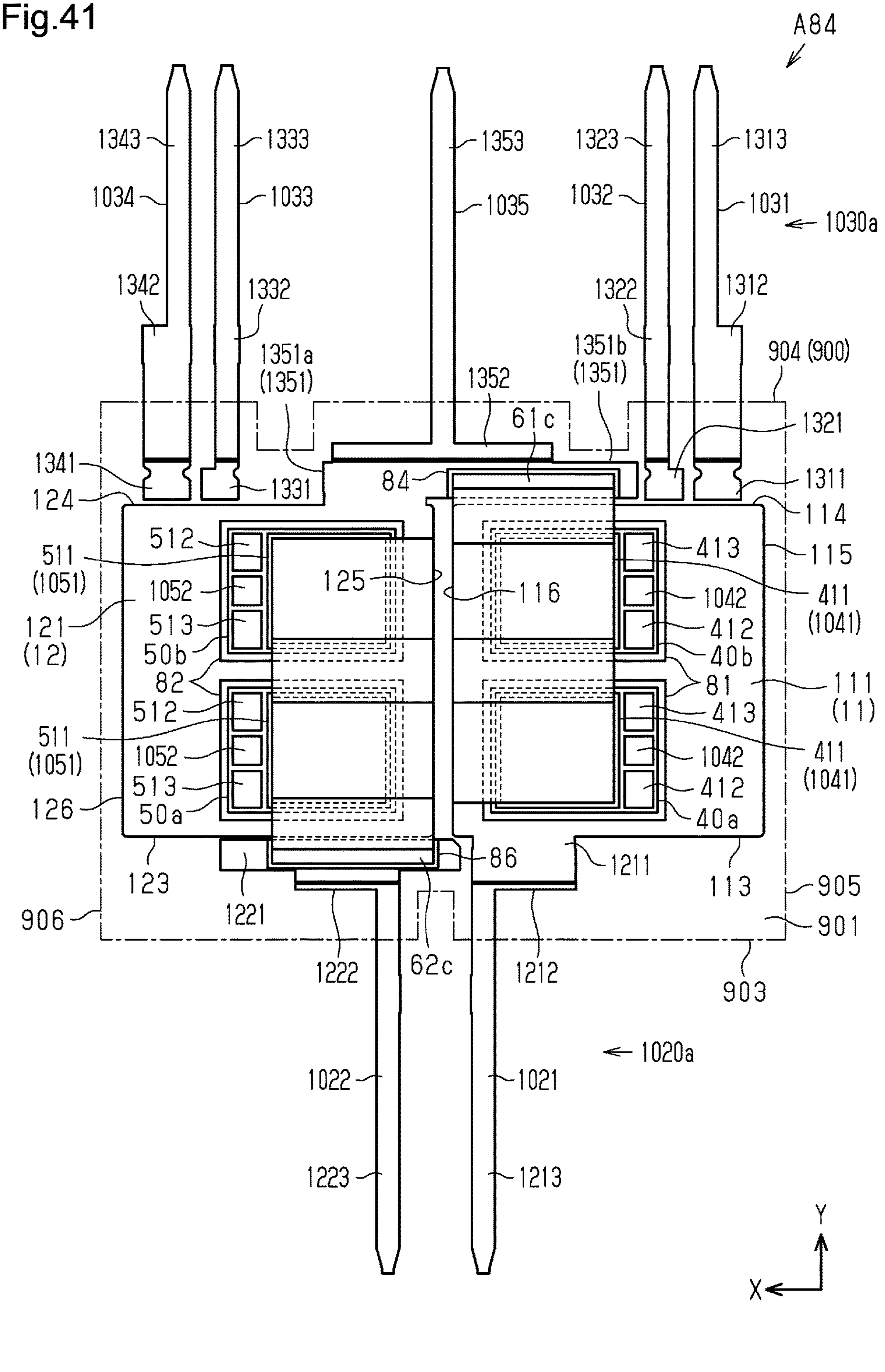
FIG. 41 is a perspective view of a semiconductor device in accordance with a modified example of the sixth embodiment.

Further, as shown in FIG. 41, a semiconductor device A84 may include base portions 1212, 1222, and 352 that do not project out of the encapsulation resin 900.

Figure 42:
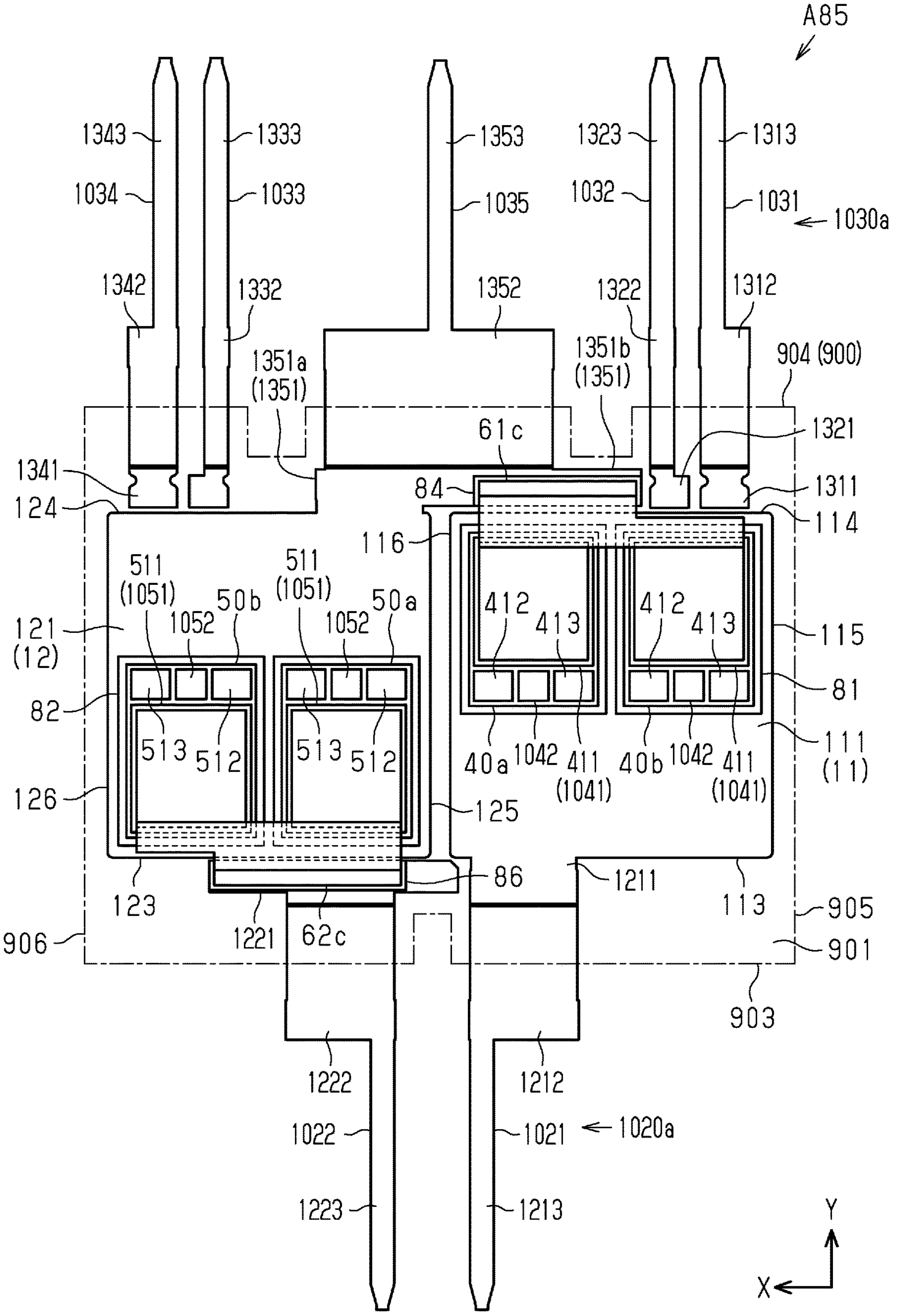
FIG. 42 is a plan view of a semiconductor device in accordance with a modified example of the seventh embodiment.

As shown in FIG. 42, in a semiconductor device A85, the first switching elements 40*a* and 40*b* and the second switching elements 50*a* and 50*b* may be arranged in widthwise direction X. In this case, the first switching elements 40*a* and 40*b* may be arranged at a portion located toward the second side surface 114 of the first die pad 11, and the second switching elements 50*a* and 50*b* may be arranged at a portion located toward the first side surface 123 of the second die pad 12. Consequently, even when shortening the distance between the first switching element 40*a* and the fourth side surface 116 of the first die pad 11 and the distance between the second switching element 50*a* and the third side surface 125 of the second die pad 12, heat can be dissipated from the fourth side surface 116 of the first die pad 11 and the third side surface 125 of the second die pad 12. Thus, decreases in the heat dissipation efficiency are limited.

The number of first switching elements mounted on the first die pad 11 may be one or three or more. The number of second switching element mounted on the second die pad 12 may be one or three or more.

Other Modified Examples

The above embodiments and modified examples may be modified as described below. The embodiments and modified examples described above may be combined with the modified examples described below as long as there is no technical contradiction.

Si elements or the like may be used as a first switching element and a second switching element.

The first switching element includes the main source electrode 1411 and the control source electrodes 1412 and 1413 as the first main surface electrode 1041. Instead, a switching element may include one, two, or four or more source electrodes. Further, the second switching element includes the main source electrode 511 and the control source electrodes 512 and 513 as the second main surface electrode 1051. Instead, a switching element may include one, two, or four or more source electrodes.

EMBODIMENTS

Technical concepts that can be understood from each of the above embodiments and modified examples will now be described.

Embodiment 1

A semiconductor device including:

a first die pad including a first main surface;

a second die pad spaced apart from the first die pad in a first direction that extends parallel to the first main surface, wherein the second die pad includes a second main surface facing the same direction as the first main surface;

a first switching element, mounted on the first main surface, and including a first element main surface facing the same direction as the first main surface, a first element back surface facing in the opposite direction of the first element main surface, a first main surface electrode and a first control electrode that are arranged on the first element main surface, and a first back surface electrode arranged on the first element back surface, where the first back surface electrode is connected to the first main surface;

a second switching element, mounted on the second main surface, and including a second element main surface facing the same direction as the second main surface, a second element back surface facing in the opposite direction of the second element main surface, a second main surface electrode and a second control electrode that are arranged on the second element main surface, and a second back surface electrode arranged on the second element back surface, where the second back surface electrode is connected to the second main surface;

a first connecting member connecting the first main surface electrode of the first switching element to the second die pad;

an encapsulation resin including resin side surfaces facing a direction extending parallel to the first main surface and the second main surface, wherein the encapsulation resin encapsulates the first switching element, the second switching element, the first die pad, the second die pad, and the first connecting member;

leads arranged in the first direction, wherein the leads project out of one of the resin side surfaces of the encapsulation resin in a second direction intersecting the first direction, and the leads include a first drive lead and a second drive lead extending in the second direction; and a second connecting member connecting the second main surface electrode of the second switching element to the second drive lead, where the second connecting member includes a lead connection portion connected to the second drive lead, an electrode connection portion connected to the second main surface electrode of the second switching element, and a coupling portion connecting the lead connection portion and the electrode connection portion.

Embodiment 2

The semiconductor device according to embodiment 1, where the coupling portion extends from the lead connection portion in the second direction.

Embodiment 3

The semiconductor device according to embodiment 2, where the electrode connection portion extends from the coupling portion in the first direction.

Embodiment 4

The semiconductor device according to any one of embodiments 1 to 3, where the second connecting member is formed so that the coupling portion is parallel to the second main surface of the second die pad.

Embodiment 5

The semiconductor device according to any one of embodiments 1 to 4, where the first switching element mounted on the first die pad is one of a plurality of first switching elements, and the second switching element mounted on the second die pad is one of a plurality of second switching elements.

Embodiment 6

The semiconductor device according to embodiment 5, where the first switching elements and the second switching elements are arranged in the second direction.

Embodiment 7

The semiconductor device according to embodiment 6, where the first connecting member extends in the first direction from the main surface electrode of each of the first switching elements and is connected to the second die pad.

Embodiment 8

The semiconductor device according to any one of embodiments 1 to 7, where the leads include a first control lead and a second control lead, the semiconductor device further including:

a first wire connecting the first control lead to the first control electrode, and a second wire connecting the second control lead to the second control electrode.

Embodiment 9

The semiconductor device according to any one of embodiments 1 to 8, where:

the leads include a first source lead and a second source lead; and the first source lead is connected to the first main surface electrode of one of the first switching elements mounted on the first die pad, and the second source lead is connected to the second main surface electrode of one of the second switching elements mounted on the second die pad.

Embodiment 10

The semiconductor device according to embodiment 9, including a third wire connecting the first source lead to the first main surface electrode, and a fourth wire connecting the second source lead to the second main surface electrode.

Embodiment 11

The semiconductor device according to any one of embodiments 1 to 10, where the first main surface electrode includes a main source electrode and a control source electrode, and the first connecting member connects the main source electrode of the first main surface electrode to the second die pad.

Embodiment 12

The semiconductor device according to any one of embodiments 1 to 11, where the second main surface electrode includes a main source electrode and a control source electrode, and the second connecting member connects the main source electrode of the second main surface electrode to the second drive lead.

Embodiment 13

A semiconductor device including:

a first die pad including a first main surface;

a second die pad spaced apart from the first die pad in a first direction that extends parallel to the first main surface, wherein the second die pad includes a second main surface facing the same direction as the first main surface;

a first switching element, mounted on the first main surface, and including a first element main surface facing the same direction as the first main surface, a first element back surface facing in the opposite direction of the first element main surface, a first main surface electrode and a first control electrode that are arranged on the first element main surface, and a first back surface electrode arranged on the first element back surface, where the first back surface electrode is connected to the first main surface;

a second switching element, mounted on the second main surface, and including a second element main surface facing the same direction as the second main surface, a second element back surface facing in the opposite direction of the second element main surface, a second main surface electrode and a second control electrode that are arranged on the second element main surface, and a second back surface electrode arranged on the second element back surface, where the second back surface electrode is connected to the second main surface;

a first connecting member connecting the first main surface electrode of the first switching element to the second main surface of the second die pad;

an encapsulation resin including resin side surfaces facing a direction extending parallel to the first main surface and the second main surface, wherein the encapsulation resin encapsulates the first switching element, the second switching element, the first die pad, the second die pad, and the first connecting member;

a first lead group including a first drive lead and a second drive lead projecting out of, among the resin side surfaces, a first resin side surface that faces a second direction intersecting the first direction;

a second lead group including a first control lead and a second control lead projecting out of a second resin side surface facing in the opposite direction of the first resin side surface; and a second connecting member connecting the second main surface electrode of the second switching element to the second drive lead, where the second connecting member includes a lead connection portion connected to the second drive lead, electrode connection portions connected to the second main surface electrodes of the second switching elements, and a coupling portion connecting the lead connection portion and the electrode connection portions.

Embodiment 14

The semiconductor device according to embodiment 13, where the coupling portion extends from the lead connection portion in the second direction.

Embodiment 15

The semiconductor device according to embodiment 14, where the electrode connection portions extend from the coupling portion in the first direction.

Embodiment 16

The semiconductor device according to any one of embodiments 13 to 15, where the second connecting member is formed so that the coupling portion is parallel to the second main surface of the second die pad.

Embodiment 17

The semiconductor device according to any one of embodiments 13 to 16, including:

the first lead group includes an output lead connected to the second die pad, where the output lead is located between the first drive lead and the second drive lead as viewed in the second direction.

Embodiment 18

The semiconductor device according to any one of embodiments 13 to 17, where the first main surface electrode includes a main source electrode and a control source electrode, and the first connecting member connects the main source electrode of the first main surface electrode to the second die pad.

Embodiment 19

The semiconductor device according to any one of embodiments 13 to 18, where the second main surface electrode includes a main source electrode and a control source electrode, and the second connecting member connects the main source electrode of the second main surface electrode to the second drive lead.

Embodiment 20

The semiconductor device according to any one of embodiments 13 to 19, including a first wire connecting the first control lead to the first control electrode, and a second wire connecting the second control lead to the second control electrode.

Embodiment 21

The semiconductor device according to any one of embodiments 13 to 20, where:

the second lead group includes a first source lead and a second source lead; and the first source lead is connected to the first main surface electrode of one of the first switching elements mounted on the first die pad, and the second source lead is connected to the second main surface electrode of one of the second switching elements mounted on the second die pad.

Embodiment 22

The semiconductor device according to embodiment 21, including a third wire connecting the first source lead to the first main surface electrode, and a fourth wire connecting the second source lead to the second main surface electrode.

REFERENCE SIGNS LIST

A10, A11, A20, A30, A40, A50, A61-A65, A70-A72, A80-A85 semiconductor device
11 first die pad
111 main surface (first main surface)
112 back surface (first back surface)
113-116 first side surface to fourth side surface
12 second die pad
121 main surface (second main surface)
122 back surface (second back surface)
123-126 first side surface to fourth side surface
14 first lead frame
15, 15*a* second lead frame
20 first switching element
201 element main surface (first element main surface)
202 element side surface (first element back surface)
203-206 first element side surface to fourth element side surface
21 first main surface electrode
211 main source electrode
212, 213 control source electrode
22 first control electrode
23 first back surface electrode
30 second switching element
301 element main surface (second element main surface)
302 element side surface (second element back surface)
303-306 first element side surface to fourth element side surface
31 second main surface electrode

311 main source electrode
312, 313 control source electrode
32 second control electrode
33 second back surface electrode
40*a*, 40*b*, 40*c* first switching element
401 element main surface
402 element back surface
403 element side surface
41 first lead (first control lead)
411 pad portion
412 base portion
413 substrate connection portion
42 second lead (first source lead)
421 pad portion
422 base portion
423 substrate connection portion
43 third lead (first drive lead)
431 connector
432 base portion
433 substrate connection portion
44 fourth lead (output lead)
441 connector
442 base portion
443 substrate connection portion
45 fifth lead (second drive lead)
451 pad portion
452 base portion
453 substrate connection portion
46 sixth lead (second source lead)
461 pad portion
462 base portion
463 substrate connection portion
47 seventh lead (second control lead)
471 pad portion
472 base portion
473 substrate connection portion
44*a* fourth lead (second drive lead)
444 pad portion
45*a* fifth lead (output lead)
454 connector
50*a*, 50*b*, 50*c* second switching element
51 wire (first connecting member)
52 wire (second connecting member)
53 first clip (first connecting member)
54, 54*a* second clip (second connecting member)
501 element main surface
502 element back surface
503 element side surface
51 second main surface electrode
511 main source electrode
512 control source electrode
513 control source electrode
541 lead connection portion
542 electrode connection portion
543 coupling portion
61 wire (first wire)
62 wire (third wire)
63 wire (second wire)
64 wire (fourth wire)
61*a*, 61*b*, 61*c*, 61*d* first connecting member
611 die connection portion
612 electrode connection portion
62*b*, 62*c*, 62*d* second connecting member
621 lead connection portion
622 electrode connection portion
623 coupling portion
70 encapsulation resin
70*a* resin portion
701 resin main surface
702 resin back surface
703 first resin side surface
704 second resin side surface
705 third resin side surface
706 fourth resin side surface
707 recess
71, 72 wire (first wire)
73 wire (third wire)
74, 75 wire (second wire)
76 wire (fourth wire)
81-86 solder
90*a*, 90*b* semiconductor device
900 encapsulation resin
900*a* resin portion
901 resin main surface
902 resin back surface
903-906 first resin side surface to fourth resin side surface
907 recess
91 switching element
911 gate electrode
912 control source electrode
913 main source electrode
914 back surface electrode (drain electrode)
921-924 lead
1020, 1020*a* first lead group
1021 first drive lead
1211 connector
1212 base portion
1213 substrate connection portion
1215 third side surface
1022 second drive lead
1221 pad portion
1222 base portion
1223 substrate connection portion
1023 output lead
1231 connector
1232 base portion
1233 substrate connection portion
1030, 1030*a* second lead group
1031 first control lead
1311 pad portion
1312 base portion
1313 substrate connection portion
1032 first source lead
1321 pad portion
1322 base portion
1323 substrate connection portion
1033 second source lead
1331 pad portion
1332 base portion
1333 substrate connection portion
1034 second control lead
1341 pad portion
1342 base portion
1343 substrate connection portion
1035 output lead
1351 connector
1351*a* die connection portion
1351*b* pad portion
1352 base portion
1353 substrate connection portion
1041 first main surface electrode
1042 first control electrode
1043 first back surface electrode
1411 main source electrode

1412 control source electrode
1413 control source electrode
1052 second control electrode
1053 second back surface electrode
1061 first connecting member
1062 second connecting member
OP external wiring
L12 distance
Lx1, Lx2 distance
X widthwise direction (first direction)
Y lengthwise direction (second direction)
Z thickness direction

The invention claimed is:

1. A semiconductor device comprising:

a first die pad including a first main surface;

a second die pad spaced apart from the first die pad in a first direction that extends parallel to the first main surface, wherein the second die pad includes a second main surface facing the same direction as the first main surface;

a first switching element, mounted on the first main surface, and including a first element main surface facing the same direction as the first main surface, a first element back surface facing in the opposite direction of the first element main surface, a first main surface electrode and a first control electrode that are arranged on the first element main surface, and a first back surface electrode arranged on the first element back surface, wherein the first back surface electrode is connected to the first main surface;

a second switching element, mounted on the second main surface, and including a second element main surface facing the same direction as the second main surface, a second element back surface facing in the opposite direction of the second element main surface, a second main surface electrode and a second control electrode that are arranged on the second element main surface, and a second back surface electrode arranged on the second element back surface, wherein the second back surface electrode is connected to the second main surface;

a first connecting member connecting the first main surface electrode of the first switching element to the second die pad;

an encapsulation resin including resin side surfaces facing a direction extending parallel to the first main surface and the second main surface, wherein the encapsulation resin encapsulates the first switching element, the second switching element, the first die pad, the second die pad, and the first connecting member; and leads arranged in the first direction, wherein the leads project out of one of the resin side surfaces of the encapsulation resin in a second direction intersecting the first direction, and the leads extend in the second direction.

2. The semiconductor device according to claim 1, wherein the first connection member comprises a conductive plate or conductive wires.

3. The semiconductor device according to claim 1, wherein the first switching element is located toward the second die pad from a central part of the first die pad as viewed in the second direction.

4. The semiconductor device according to claim 3, wherein a first distance from a side of the first die pad located toward the second die pad to a side of the first switching element located toward the second die pad as viewed in a direction orthogonal to the first main surface is greater than or equal to a thickness of the first die pad.

5. The semiconductor device according to claim 1, wherein the second switching element is located toward the first die pad from a central part of the second die pad as viewed in the second direction.

6. The semiconductor device according to claim 5, wherein a second distance from a side of the second die pad located toward the first die pad to a side of the second switching element located toward the first die pad as viewed in a direction orthogonal to the second main surface is greater than or equal to a thickness of the second die pad.

7. The semiconductor device according to claim 1, wherein:

the leads include a first control lead connected to the first control electrode of the first switching element and arranged at an end of the encapsulation resin at a side at which the first die pad is located, a second control lead connected to the second control electrode of the second switching element and arranged at an end of the encapsulation resin at a side at which the second die pad is located, a first drive lead connected to the first back surface electrode of the first switching element, a second drive lead connected to the second main surface electrode of the second switching element, and an output lead connected to the second die pad; and the first drive lead, the second drive lead, and the output lead are located between the first control lead and the second control lead.

8. The semiconductor device according to claim 7, wherein the output lead is located between the first drive lead and the second drive lead.

9. The semiconductor device according to claim 7, wherein the second drive lead is located between the first drive lead and the output lead.

10. The semiconductor device according to claim 7, wherein the leads include:

a first source lead connected to the first main surface electrode of the first switching element and located toward the second die pad from the first control lead; and a second source lead connected to the second main surface electrode of the second switching element and located toward the first die pad from the second control lead.

11. The semiconductor device according to claim 7, wherein the first drive lead, the second drive lead, and the output lead each have a thickness that is equal to that of the first die pad and the second die pad.

12. The semiconductor device according to claim 7, further comprising a second connecting member connecting the second main surface electrode of the second switching element to the second drive lead.

13. A semiconductor device comprising:

a first die pad including a first main surface;

a second die pad spaced apart from the first die pad in a first direction that extends parallel to the first main surface, wherein the second die pad includes a second main surface facing the same direction as the first main surface;

a first switching element, mounted on the first main surface, and including a first element main surface facing the same direction as the first main surface, a first element back surface facing in the opposite direction of the first element main surface, a first main surface electrode and a first control electrode that are arranged on the first element main surface, and a first back surface electrode arranged on the first element back surface, wherein the first back surface electrode is connected to the first main surface;

a second switching element, mounted on the second main surface, and including a second element main surface facing the same direction as the second main surface, a second element back surface facing in the opposite direction of the second element main surface, a second main surface electrode and a second control electrode that are arranged on the second element main surface, and a second back surface electrode arranged on the second element back surface, wherein the second back surface electrode is connected to the second main surface;

a first connecting member connected to the first main surface electrode of the first switching element;

an encapsulation resin including resin side surfaces facing a direction extending parallel to the first main surface and the second main surface, wherein the encapsulation resin encapsulates the first switching element, the second switching element, the first die pad, the second die pad, and the first connecting member;

a first lead group including leads projecting out of, among the resin side surfaces, a first resin side surface that faces a second direction intersecting the first direction; and a second lead group including leads projecting out of a second resin side surface facing in the opposite direction of the first resin side surface, wherein the first main surface electrode of the first switching element is electrically connected to the second die pad by the first connecting member.

14. The semiconductor device according to claim 13, wherein:

the leads of the first lead group include a first drive lead connected to the first back surface electrode of the first switching element, a second drive lead connected to the second main surface electrode of the second switching element, and an output lead connected to the second die pad; and the leads of the second lead group include a first control lead connected to the first control electrode of the first switching element, and a second control lead connected to the second control electrode of the second switching element.

15. The semiconductor device according to claim 13, wherein:

the leads of the first lead group include a first drive lead connected to the first back surface electrode of the first switching element, and a second drive lead connected to the second main surface electrode of the second switching element;

the leads of the second lead group include a first control lead connected to the first control electrode of the first switching element, a second control lead connected to the second control electrode of the second switching element, and an output lead connected to the second die pad; and the first main surface electrode of the first switching element is connected to the second die pad by the first connecting member and the output lead.

16. The semiconductor device according to claim 14 or 15, wherein the first drive lead and the second drive lead are adjacent to each other.

17. The semiconductor device according to claim 14, wherein the second lead group includes:

a first source lead connected to the first main surface electrode of the first switching element and located toward a central part of the encapsulation resin from the first control lead; and a second source lead connected to the second main surface electrode of the second switching element and located toward a central part of the encapsulation resin from the second control lead.

18. The semiconductor device according to claim 14, further comprising a second connecting member connecting the second main surface electrode of the second switching element to the second drive lead.

19. The semiconductor device according to claim 13, wherein:

the first switching element mounted on the first die pad is one of a plurality of first switching elements; and the second switching element mounted on the second die pad is one of a plurality of second switching elements.

20. The semiconductor device according to claim 19, wherein the first switching elements and the second switching elements are arranged in the second direction.

21. The semiconductor device according to claim 19, wherein the first main surface electrode of each of the first switching elements is connected to the second die pad by the first connecting member.

22. The semiconductor device according to claim 19, wherein:

the first switching elements are arranged in the first direction and located toward the second resin side surface; and the second switching elements are arranged in the first direction and located toward the first resin side surface.

23. The semiconductor device according to claim 13, wherein the first switching element is located toward the second die pad from a central part of the first die pad as viewed in the second direction.

24. The semiconductor device according to claim 23, wherein a first distance from a side of the first die pad located toward the second die pad to a side of the first switching element located toward the second die pad as viewed in a direction orthogonal to the first main surface is greater than or equal to a thickness of the first die pad.

25. The semiconductor device according to claim 13, wherein the second switching element is located toward the first die pad from a central part of the second die pad as viewed in the second direction.

26. The semiconductor device according to claim 25, wherein a second distance from a side of the second die pad located toward the first die pad to a side of the second switching element located toward the first die pad as viewed in a direction orthogonal to the second main surface is greater than or equal to a thickness of the second die pad.

* * * * *